(12) United States Patent
Wada et al.

(10) Patent No.: US 8,276,263 B2
(45) Date of Patent: Oct. 2, 2012

(54) SURFACE MOUNTING APPARATUS

(75) Inventors: Masashi Wada, Iwata (JP); Hirotoshi Yamagata, Hamamatsu (JP); Hiroyuki Takagi, Iwata (JP); Akira Kishida, Hamamatsu (JP); Hiroaki Fujita, Iwata (JP)

(73) Assignee: Yamaha Hatsudoki Kabushiki Kaisha (JP)

( * ) Notice: Subject to any disclaimer, the term of this patent is extended or adjusted under 35 U.S.C. 154(b) by 947 days.

(21) Appl. No.: 12/306,701

(22) PCT Filed: Jun. 29, 2007

(86) PCT No.: PCT/JP2007/063164
§ 371 (c)(1),
(2), (4) Date: Dec. 26, 2008

(87) PCT Pub. No.: WO2008/001910
PCT Pub. Date: Jan. 3, 2008

(65) Prior Publication Data
US 2009/0277002 A1    Nov. 12, 2009

(30) Foreign Application Priority Data

| Jun. 29, 2006 | (JP) | 2006-180210 |
| Jun. 29, 2006 | (JP) | 2006-180215 |
| Jun. 30, 2006 | (JP) | 2006-182407 |
| Jun. 30, 2006 | (JP) | 2006-182421 |
| Jun. 30, 2006 | (JP) | 2006-182426 |
| Jun. 30, 2006 | (JP) | 2006-182434 |

(51) Int. Cl.
*H05K 13/04* (2006.01)
(52) U.S. Cl. ................ 29/739; 414/751.1
(58) Field of Classification Search ........... 29/739–741, 29/743; 414/749.1, 751.1
See application file for complete search history.

(56) References Cited

U.S. PATENT DOCUMENTS

| 5,437,359 | A | * | 8/1995 | Maruyama et al. | 198/341.04 |
| 5,517,748 | A | * | 5/1996 | Park | 29/741 |
| 6,971,158 | B2 | * | 12/2005 | Terui | 29/740 |
| 6,983,532 | B2 | * | 1/2006 | White | 29/740 |

FOREIGN PATENT DOCUMENTS

| JP | 59194499 A | 11/1984 |
| JP | 2229499 A | 9/1990 |
| JP | 6291492 A | 10/1994 |

OTHER PUBLICATIONS

International Search Report for PCT/JP2007/063164 Dated: Oct. 3, 2007.

\* cited by examiner

*Primary Examiner* — Livius R Cazan
(74) *Attorney, Agent, or Firm* — Studebaker & Brackett PC; Donald R. Studebaker

(57) ABSTRACT

A surface mounting apparatus includes a conveyer supporting a printed wiring board being moved in a transportation direction, and a board transfer device that lowers a pair of tab members to positions spaced apart upstream and downstream of the printed wiring board and moves the tab members in the transportation direction. The board transfer device includes an interval changing device to change an interval between a pair of the tab members and a sensor to detect the position of the printed wiring board, an interference determination means to determine the absence or presence of the printed wiring board at the positions to which both the tab members are to be lowered according to the position of the printed wiring board detected by the sensor and interval setting means to move the tab members by driving the interval changing device according to a detection result of the interference determination means.

9 Claims, 37 Drawing Sheets

SURFACE MOUNTING APPARATUS

TECHNICAL FIELD

The present invention relates to a surface mounting apparatus equipped with a board transfer device that transports a printed wiring board by pushing the printed wiring board using abutting members.

BACKGROUND ART

A conventional surface mounting apparatus of this type is disclosed, for example, in Japanese Patent No. 3227881.

The surface mounting apparatus is equipped with a board transfer device that transports a printed wiring board by pushing the printed wiring board using tab members. The board transfer device transports a printed wiring board from a loading unit to a mounting unit. The board transfer device is provided with the tab members located at positions to pinch a printed wiring board from upstream and downstream in the transportation direction.

These tab members include a rear tab member located upstream of a printed wiring board in the transportation direction and a front tab member located downstream in the transportation direction, and both are attached to a single movable arm so as to hang down from above. The movable arm reciprocates both in the transportation direction of a printed wiring board and in the top-bottom direction at predetermined timings and moves in a movement path that draws a rectangular shape when viewed from the side.

While the movable arm moves as described above, the rear tab member and the front tab member descend to transportation positions at which the lower ends are located below a printed wiring board first, and thence move downstream in the transportation direction, after which they ascend to positions higher than the printed wiring board and moves further upstream in the transportation direction until they return to the initial positions.

The rear tab member is provided with a sensor to measure the length of a printed wiring board. The sensor passes above a printed wiring board placed on the loading unit when the tab members are returning to the initial positions after the printed wiring board is transported using the tab members. The printed wiring board on the loading unit is held at a predetermined position as the edge on the downstream side in the transportation direction abuts on a stopper provided to the loading unit.

The board transfer device adopts a configuration in which the length of a printed wiring board in the transportation direction is measured using the sensor that moves above the printed wiring board as described above and then the position of the edge of the printed wiring board on the upstream side in the transportation direction and a transportation stroke during transportation are found through computation.

In order to transport a printed wiring board using the board transfer device configured as above, the rear tab member and the front tab member located above the loading unit are lowered so that they are respectively located at transportation positions upstream and downstream of the printed wiring board in the transportation direction and the movable arm is moved in the transportation direction in this state. According to the board transfer device, a single printed wiring board is transported from the loading position to the mounting position.

Meanwhile, a conventional surface mounting apparatus as the one shown in Japanese Patent No. 3227881 above is used in some cases to mount remaining electronic components on a printed wiring board on which a part of the electronic components have been mounted by another surface mounting apparatus in a preceding process.

DISCLOSURE OF THE INVENTION

Problems that the Invention is to Solve

In the conventional surface mounting apparatus configured as above, in a case where a printed wiring board having a length in the transportation direction longer than an interval between the front tab member and the rear tab member is sent to the loading unit, there is a possibility that one or both of the front tab member and the rear tab member come into contact with the surface of the printed wiring board from above when these tab members are lowered to the transportation positions.

In a case where a part of electronic components have been mounted on the printed wiring board by another surface mounting apparatus that performs a preceding process, when the tab members come into contact with the printed wiring board as described above, the electronic components move from the predetermined mounting positions due to an impact caused by contact.

The invention has been devised to solve the problems discussed above and has an object to provide a surface mounting apparatus in which abutting members will not come into contact on a printed wiring board during the time when the abutting members are lowered.

Means which Solves the Problems

In order to achieve the above and other objects, according to the invention, a surface mounting apparatus includes a transportation path forming member that supports a printed wiring board movably in a transportation direction, and a board transfer device that lowers abutting members to positions spaced apart upstream and downstream of the printed wiring board placed on the transportation path forming member in the transportation direction and moves the abutting members in the transportation direction. The board transfer device includes: an interval changing device that changes an interval between a pair of the abutting members; a sensor that detects a position of the printed wiring board positioned on the transportation path forming member; interference determination means for determining absence or presence of the printed wiring board at the positions to which both the abutting members are to be lowered according to the position of the printed wiring board detected by the sensor; and interval setting means for moving the abutting members by driving the interval changing device according to a detection result of the interference determination means.

Effects of the Invention

According to the invention, in a case where a printed wiring board is present at the positions to which the front abutting member and the rear abutting member are to be lowered when they are moved to the transportation positions, it is possible to prevent these abutting members from coming into contact on the printed wiring board by moving these abutting members in a direction to be spaced apart from the printed wiring board. Hence, according to the invention, it is possible to prevent both the front abutting member and the rear abutting member from coming into contact on the printed wiring board when they are lowered to the transportation positions. Consequently, according to the surface mounting apparatus of the invention, not only is it possible to transport a printed wiring board on which electronic components have been already mounted while preventing the electronic components from moving on the printed wiring board, but it is also possible to mount a rest of the electronic components on this printed wiring board.

BEST MODE FOR CARRYING OUT THE INVENTION

First Embodiment

Hereinafter, a first embodiment of a surface mounting apparatus of the invention will be described in detail using FIG. 1 through FIG. 24.

Figure 1:
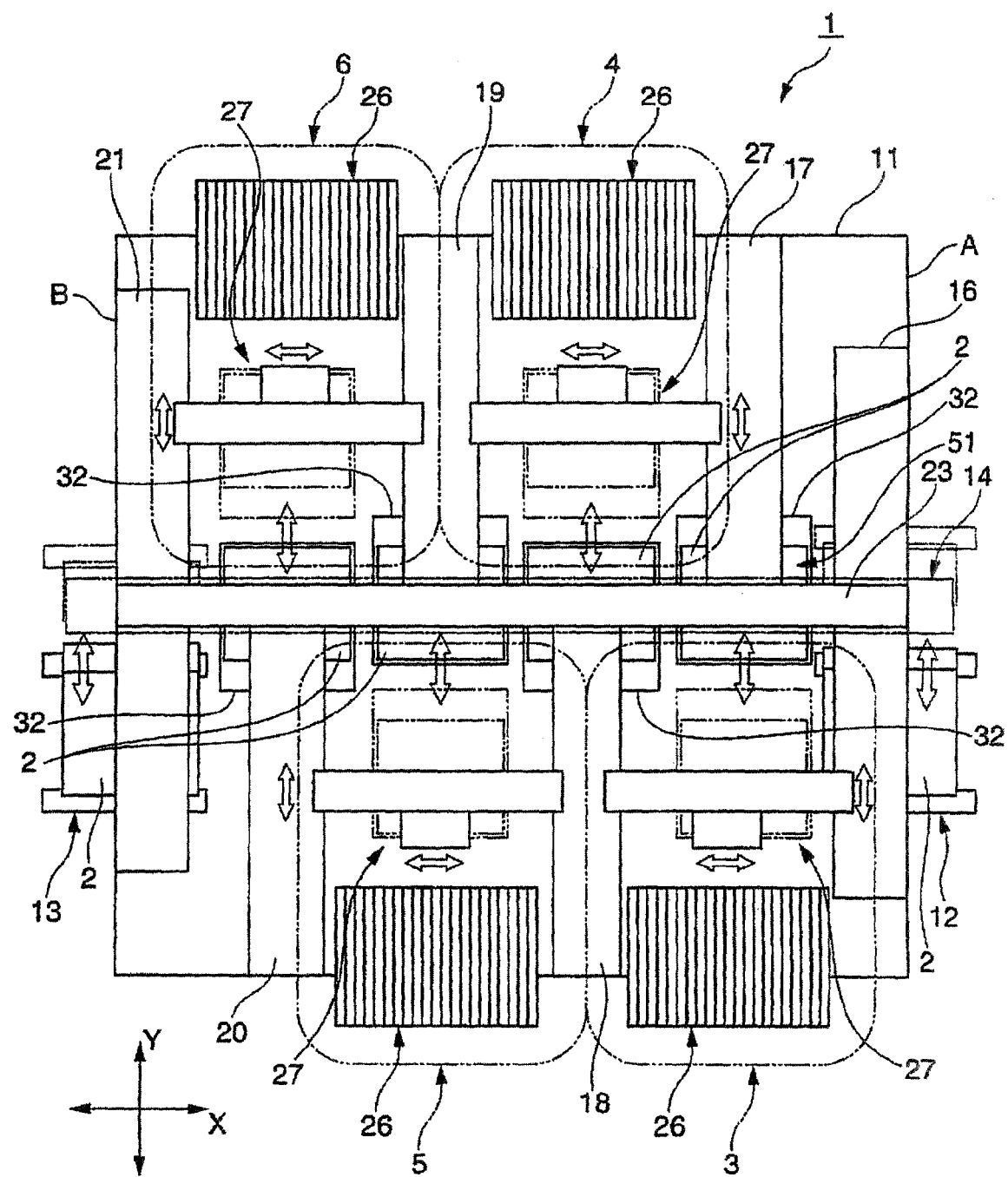
FIG. 1 is a plan view schematically showing a configuration of a surface mounting apparatus according to the invention.
Figure 2:
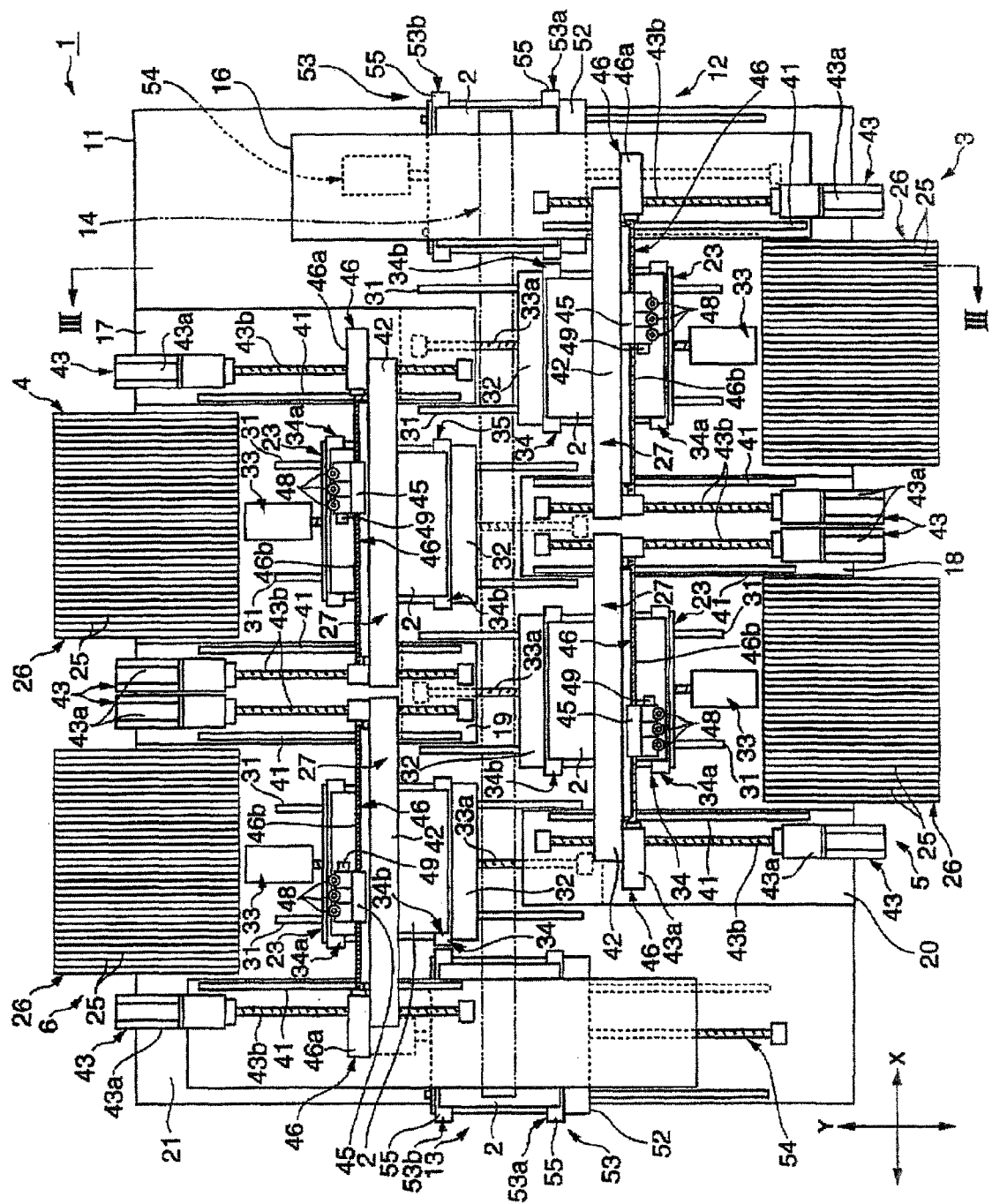
FIG. 2 is a plan view of the surface mounting apparatus.
Figure 3:
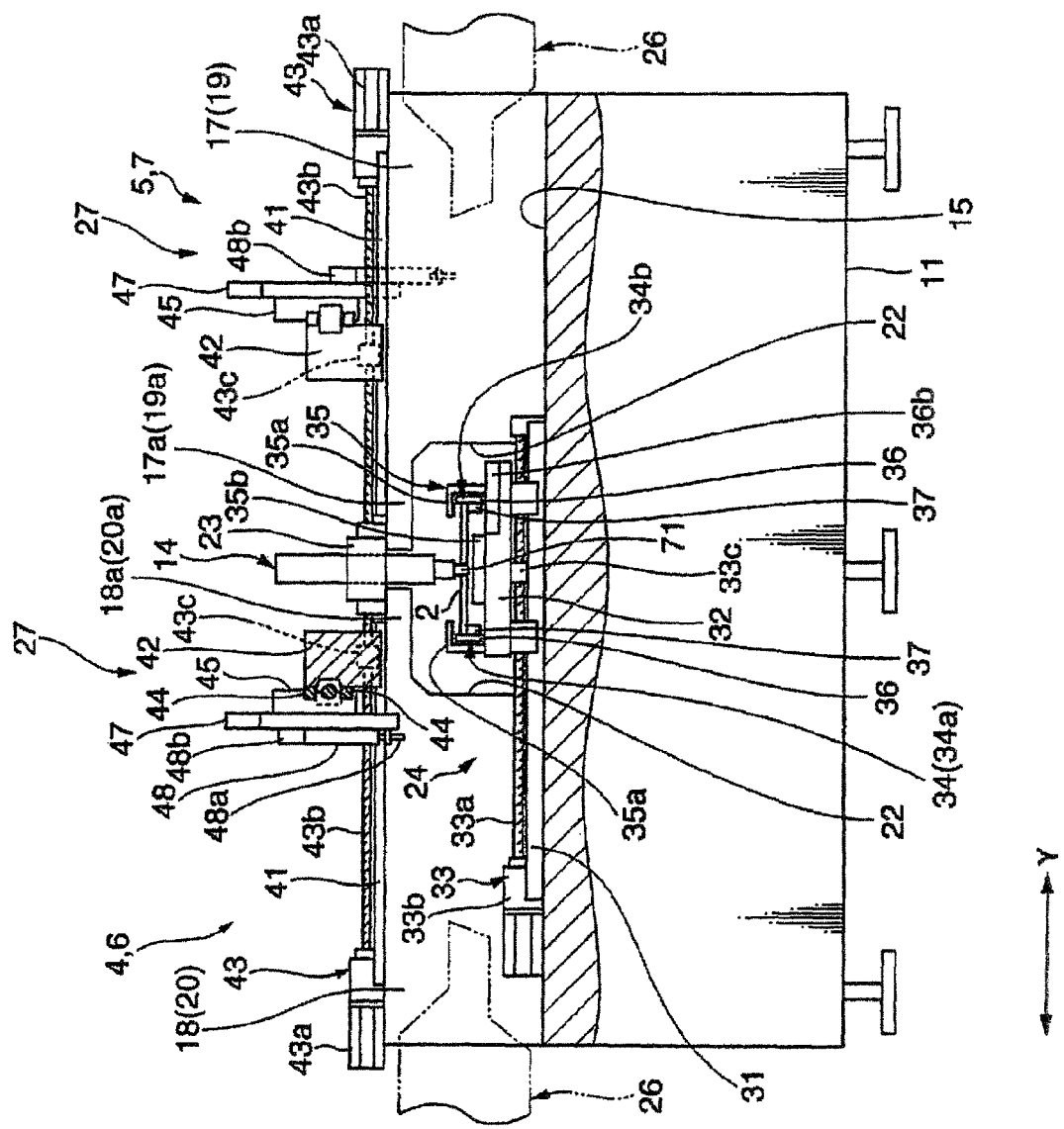
FIG. 3 is a cross sectional view taken along the line III-III in FIG. 2.
Figure 4:
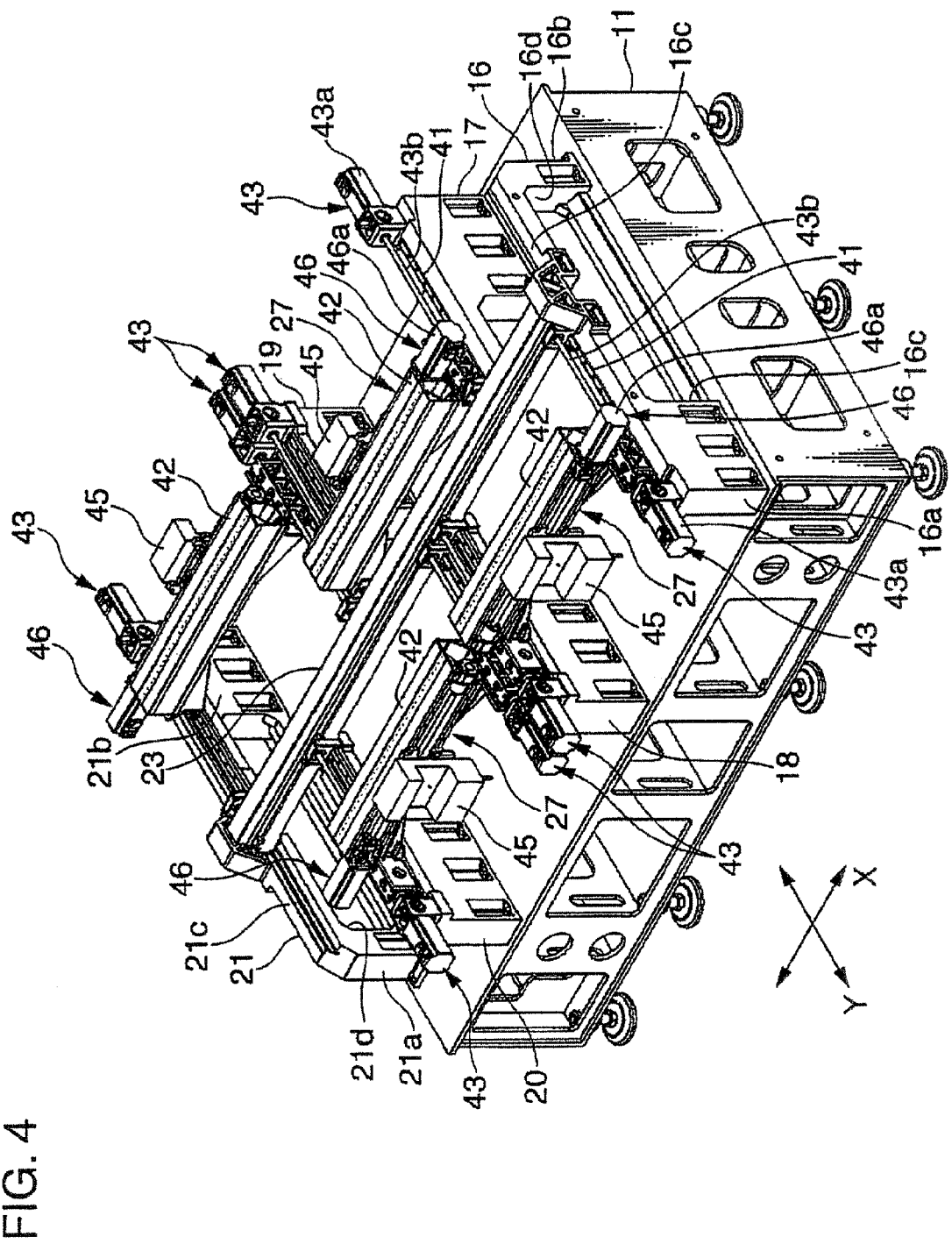
FIG. 4 is a perspective view showing a state where mounting units are equipped to a base stand.
Figure 5:
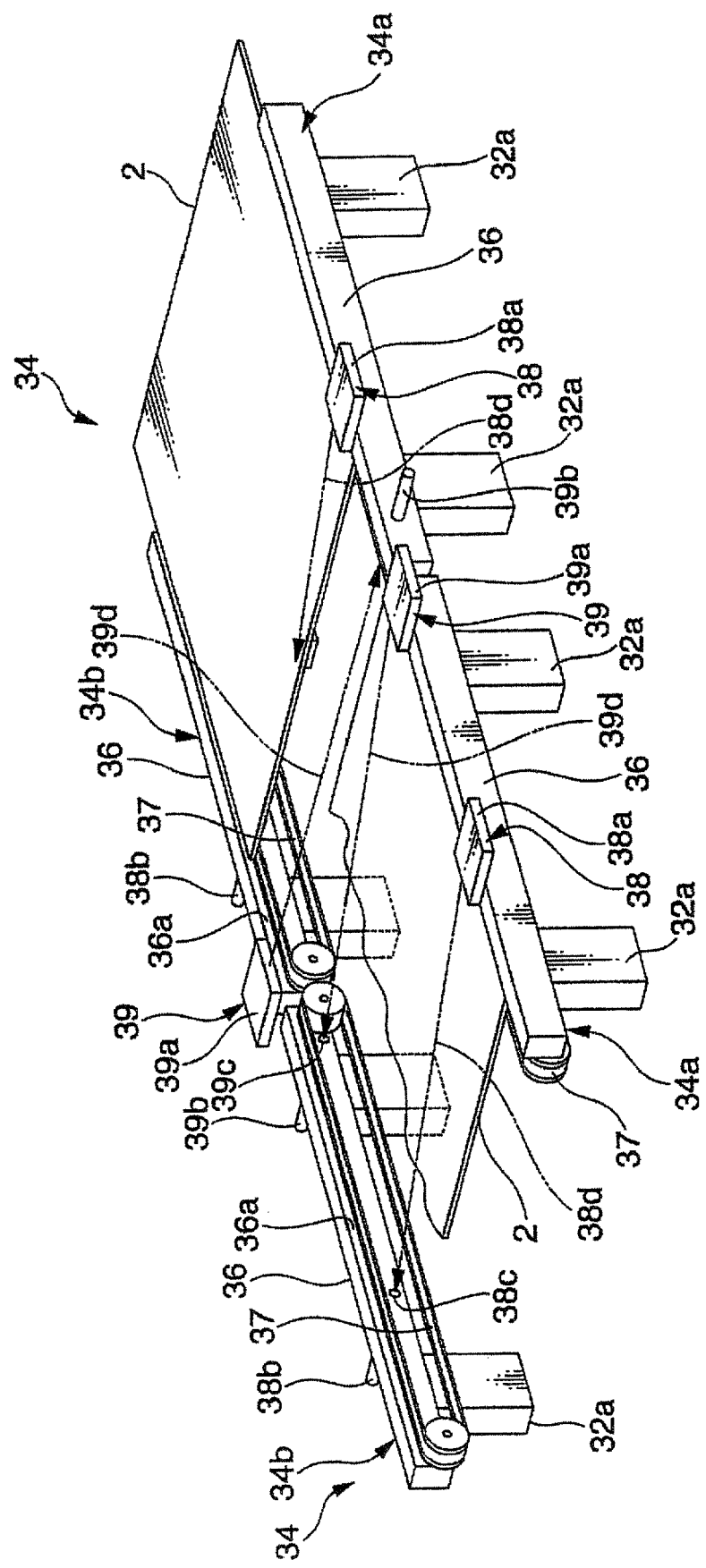
FIG. 5 is a perspective view showing transportation conveyers.
Figure 6:
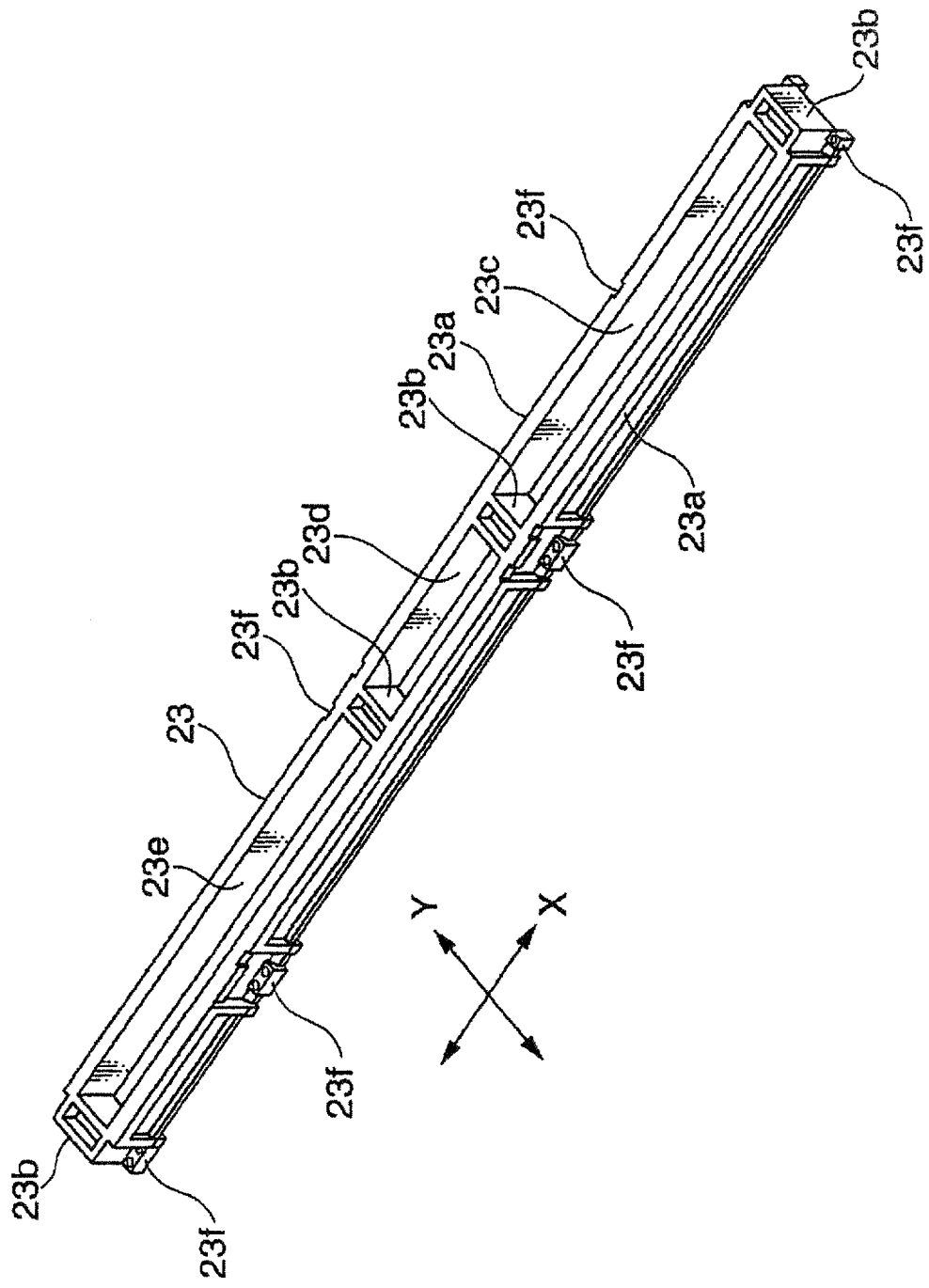
FIG. 6 is a perspective view showing a configuration of a center frame.

FIG. 1 is a plan view schematically showing the configuration of a surface mounting apparatus of the invention. FIG. 2 is a plan view of the surface mounting apparatus of the invention in a state where a center frame is omitted. FIG. 3 is a cross sectional view taken along the line III-III of FIG. 2. FIG. 4 is a perspective view showing a state where mounting units are equipped to a base stand. FIG. 5 is a perspective view showing transportation conveyers. FIG. 6 is a perspective view showing the configuration of the center frame.

Figure 7:
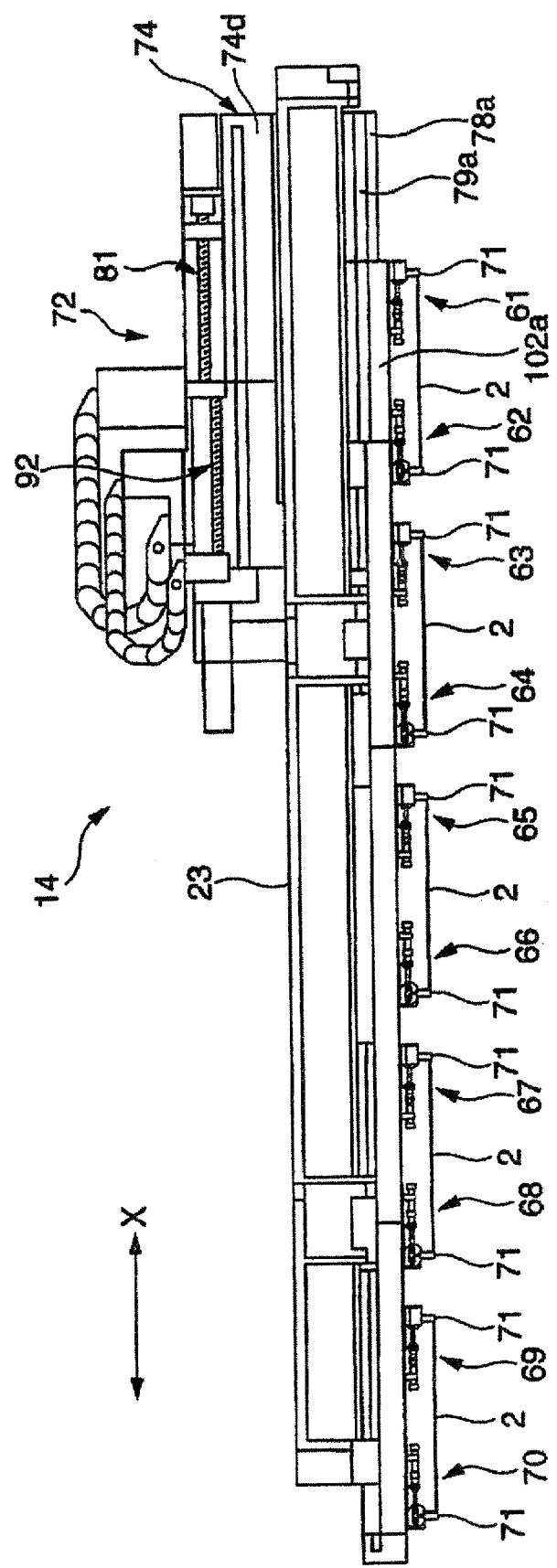
FIG. 7 is a side view of a board transfer device.
Figure 8:
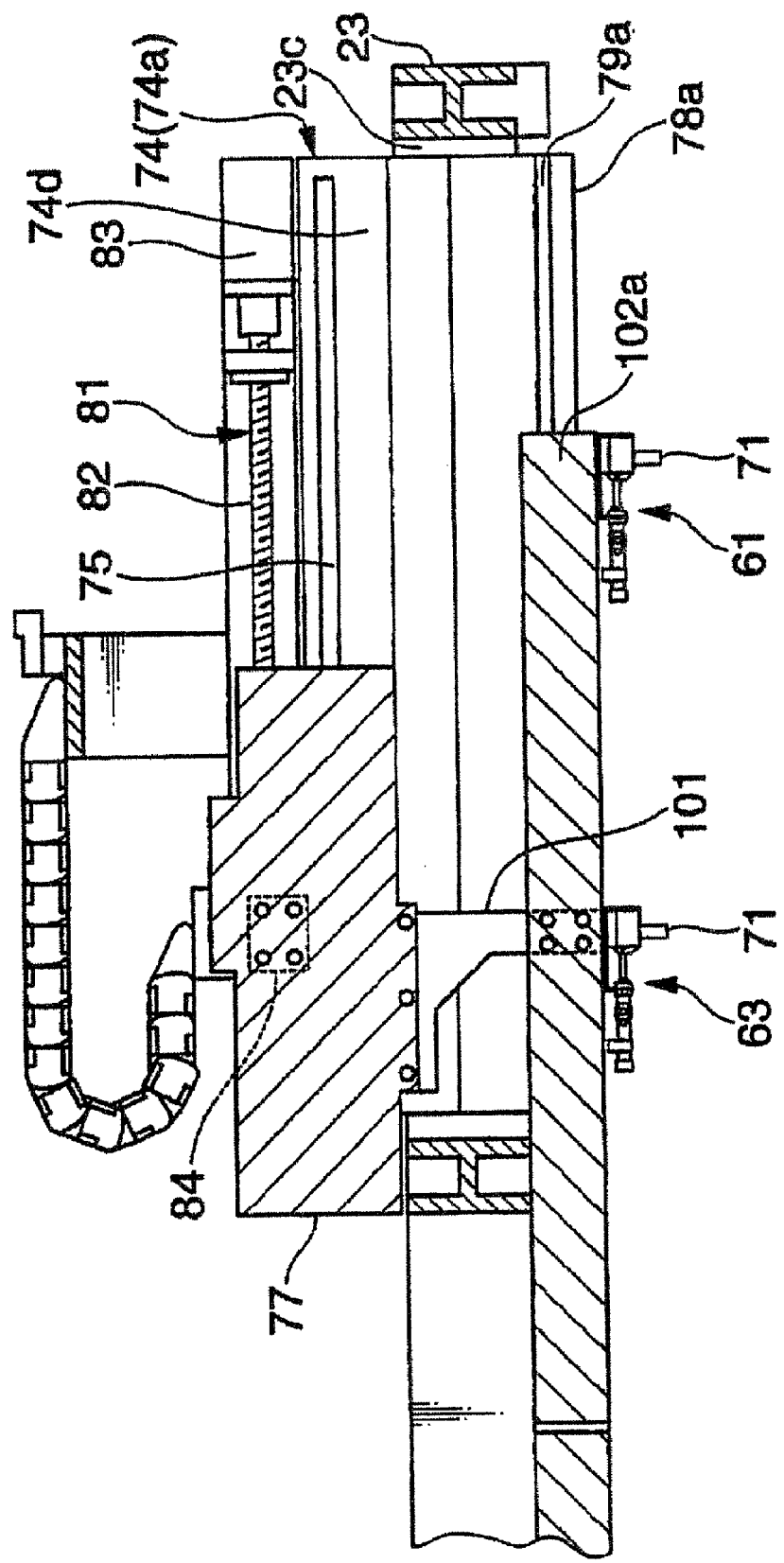
FIG. 8 is a cross sectional view showing a drive system during transportation.
Figure 9:
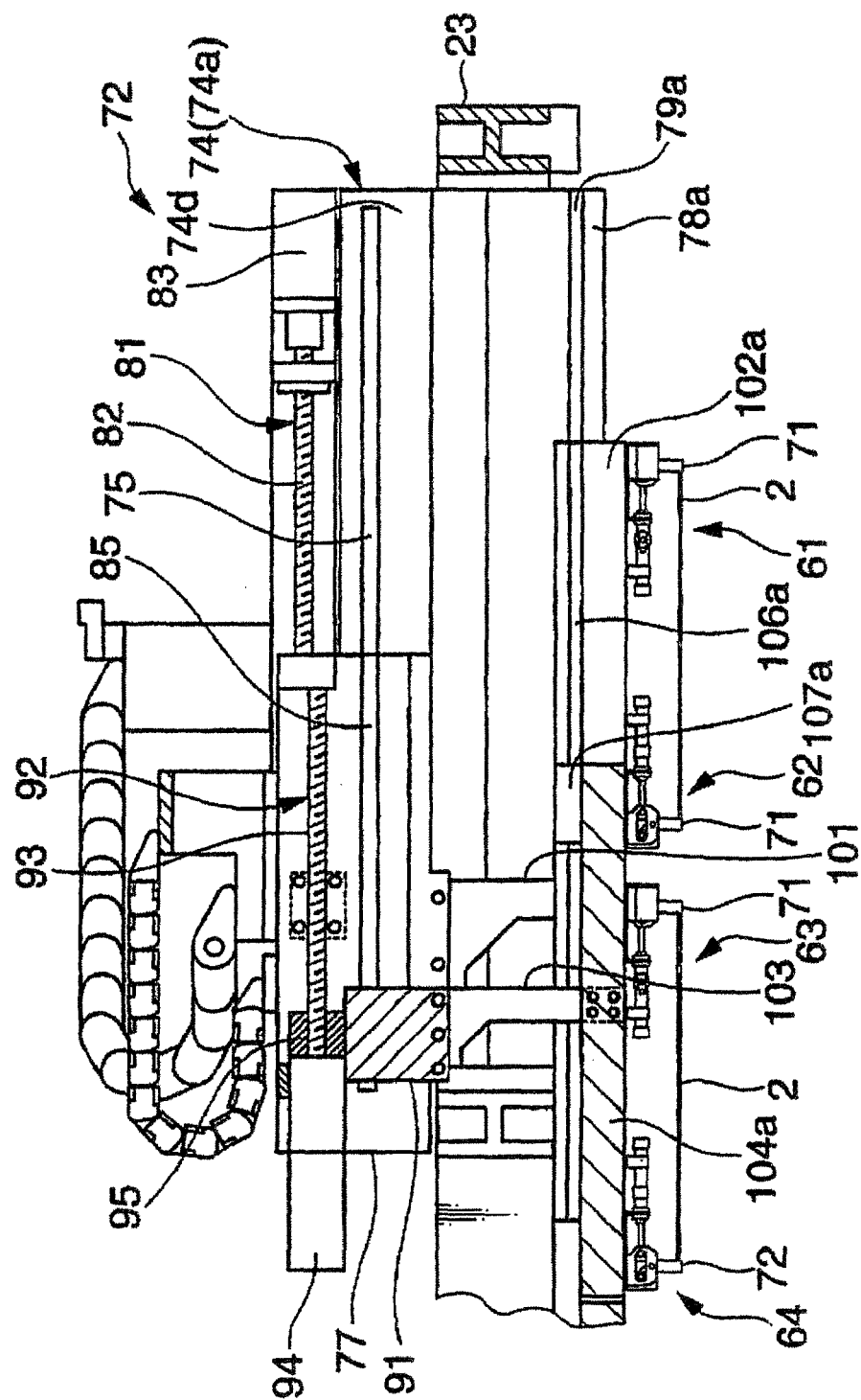
FIG. 9 is a cross sectional view showing a drive system when an interval between tab members is changed.
Figure 10:
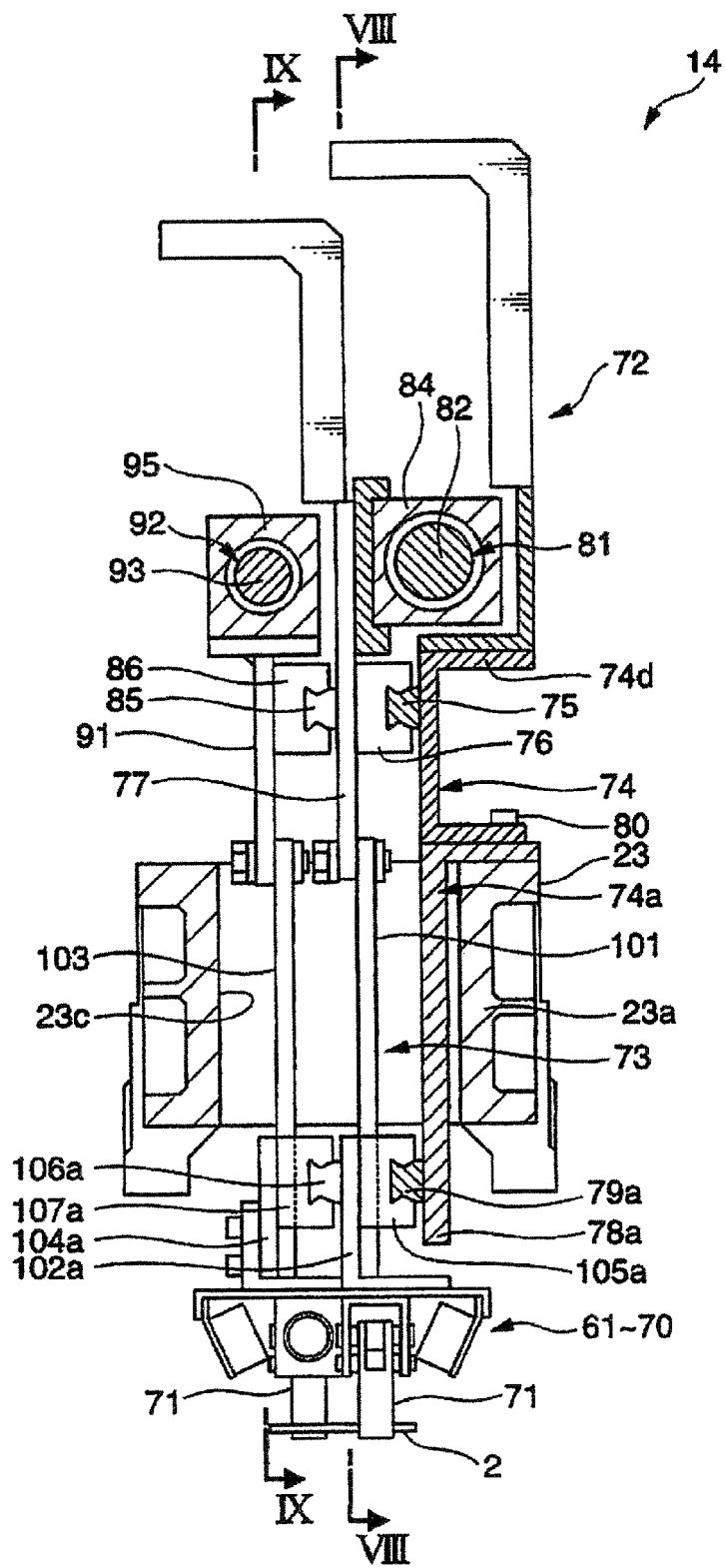
FIG. 10 is a longitudinal cross sectional view of a drive unit for the board transfer device.
Figure 11:
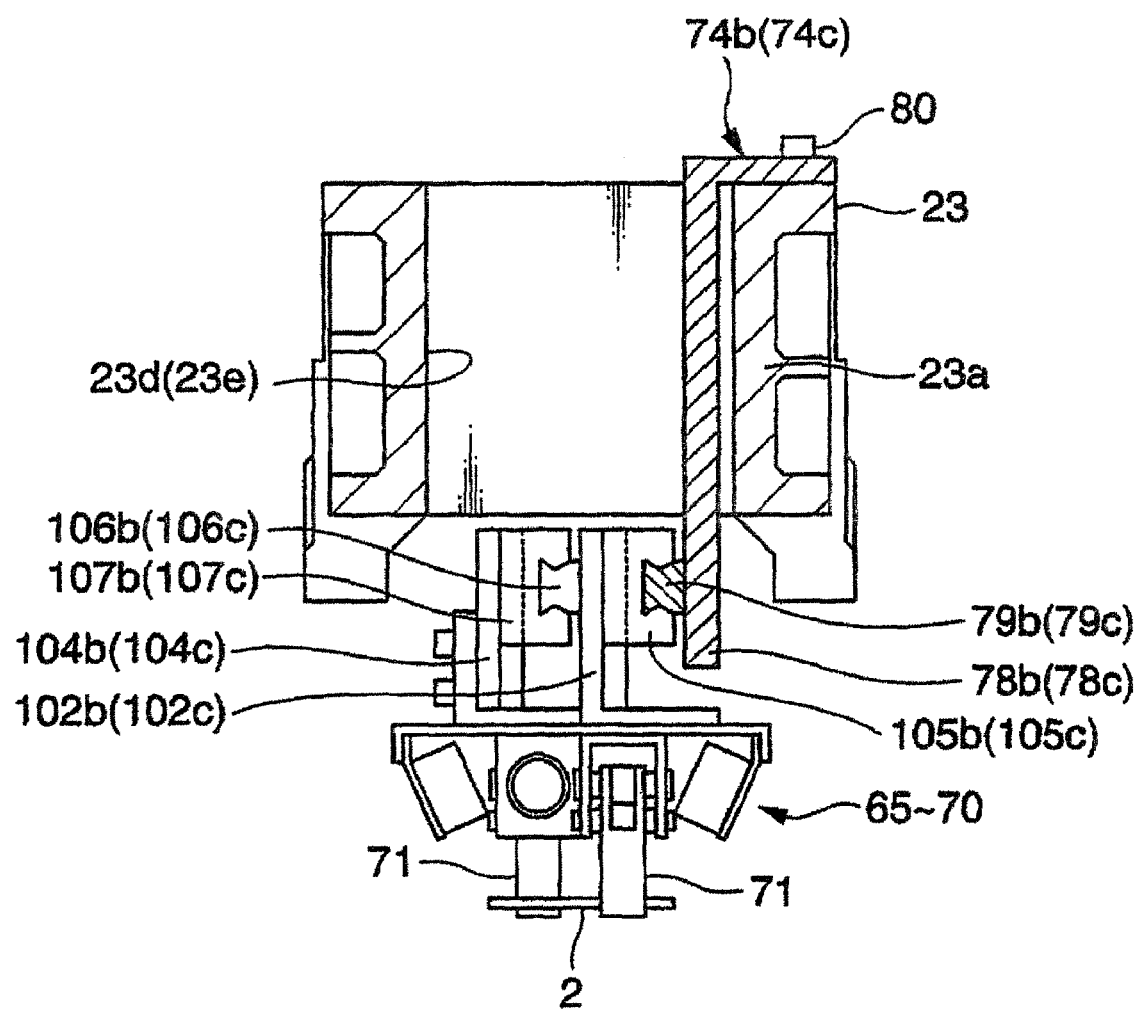
FIG. 11 is a longitudinal cross sectional view showing a part of the drive unit.

FIG. 7 is a side view of a board transfer device. FIG. 8 is a cross sectional view showing a drive system during transportation. FIG. 9 is a cross sectional view showing the drive system when an interval between tab members is changed. FIG. 10 is a longitudinal cross sectional view of a drive unit for the board transfer device. A cable holding member is omitted in FIG. 10. In FIG. 10, a position cut along for the view in FIG. 8 is indicated by line VIII-VIII and a position cut along for the view in FIG. 9 is indicated by line IX-IX. FIG. 11 is a longitudinal cross sectional view showing a part of the drive unit.

Figure 12:
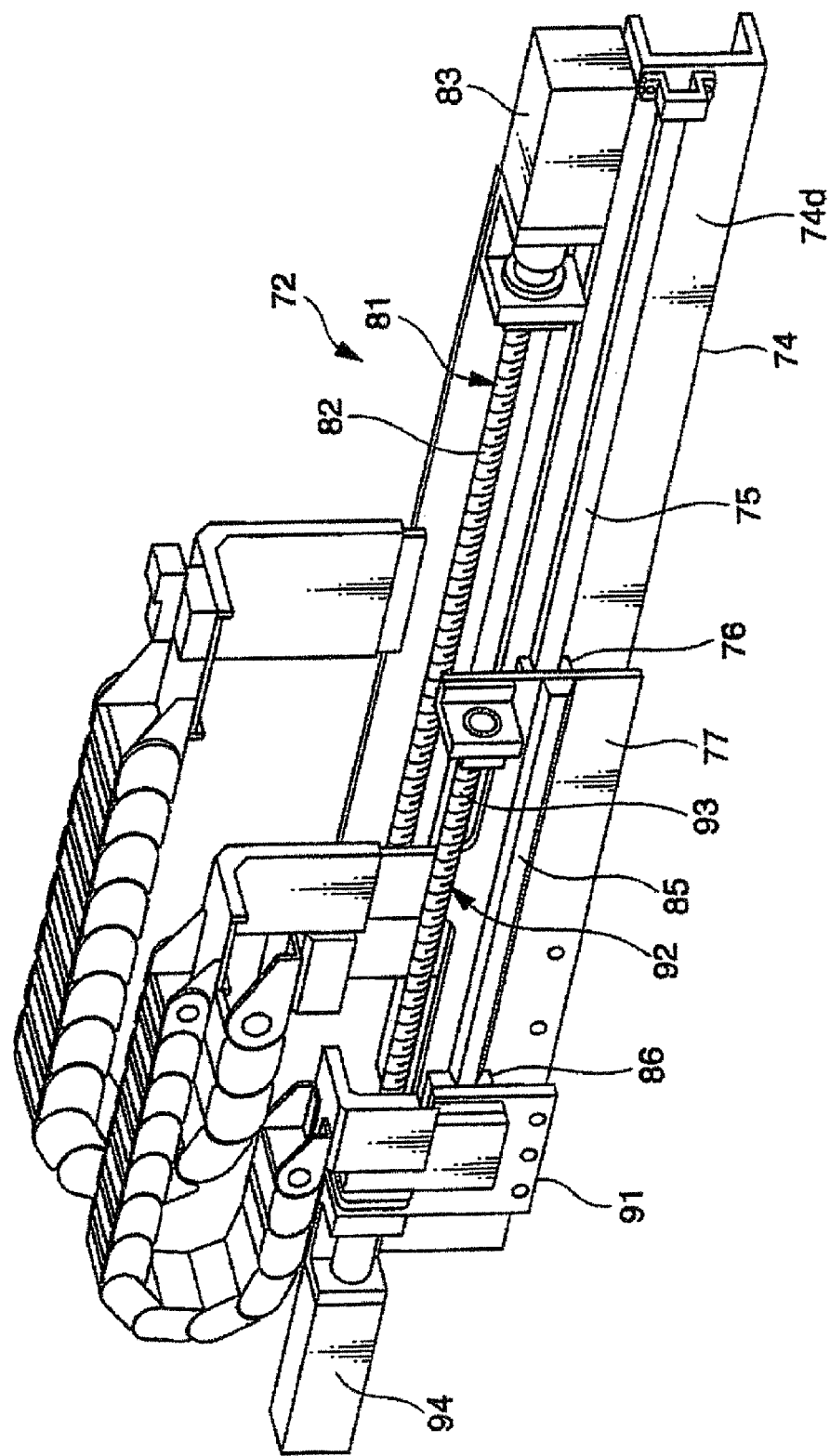
FIG. 12 is an enlarged perspective view showing the drive unit for the board transfer device.
Figure 13:
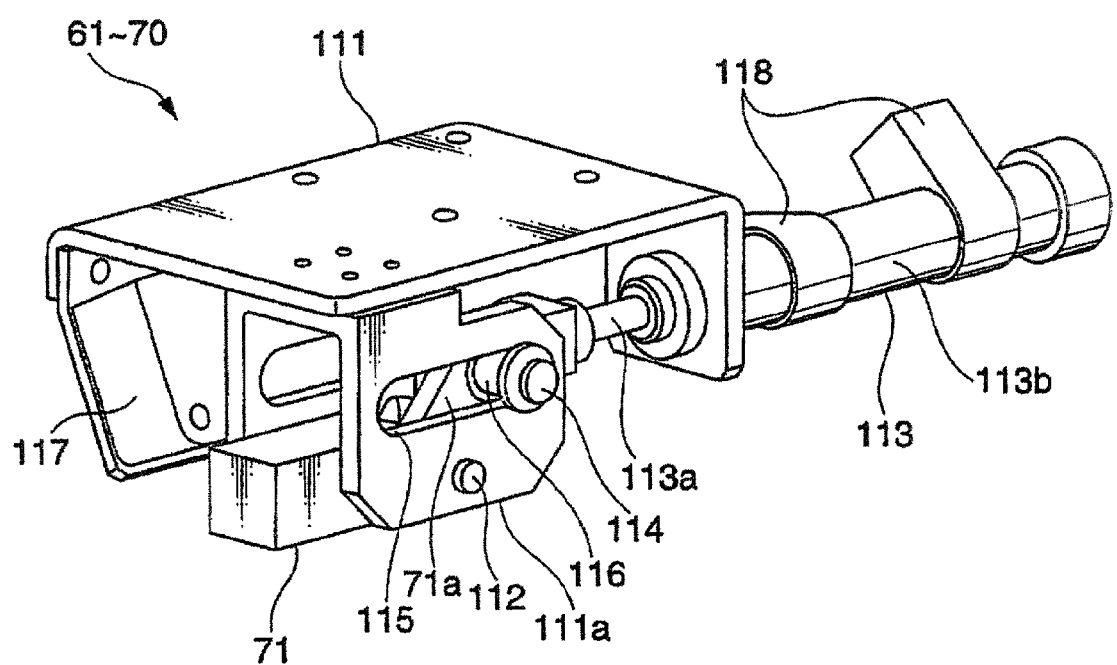
FIG. 13 is a perspective view showing a tab member located at an evacuation position and a cylinder.
Figure 14:
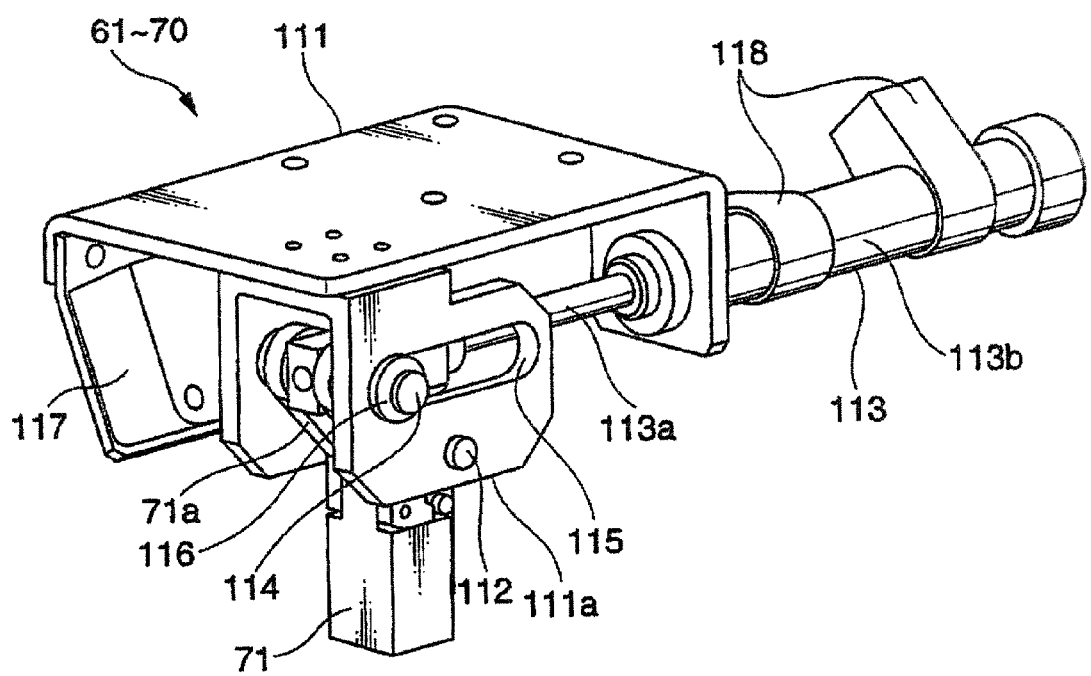
FIG. 14 is a perspective view showing the tab member located at a transportation position and the cylinder.

FIG. 12 is an enlarged perspective view showing the drive unit for the board transfer device. FIG. 13 is a perspective view showing a tab member located at an evacuation position and a cylinder. FIG. 14 is a perspective view showing the tab member located at a transportation position and the cylinder.

Figure 15:
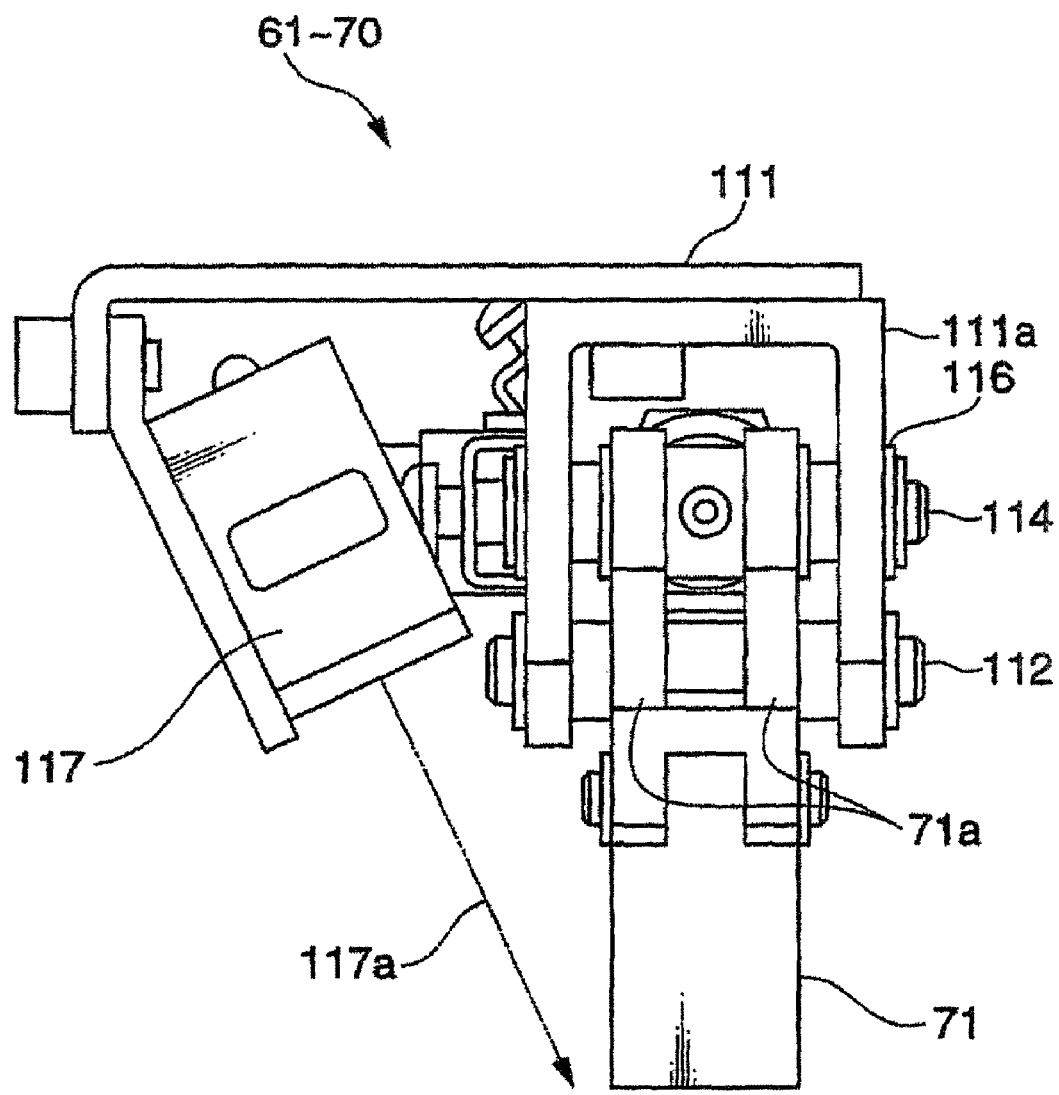
FIG. 15 is an enlarged front view showing a supporting portion of the tab member.
Figure 16:
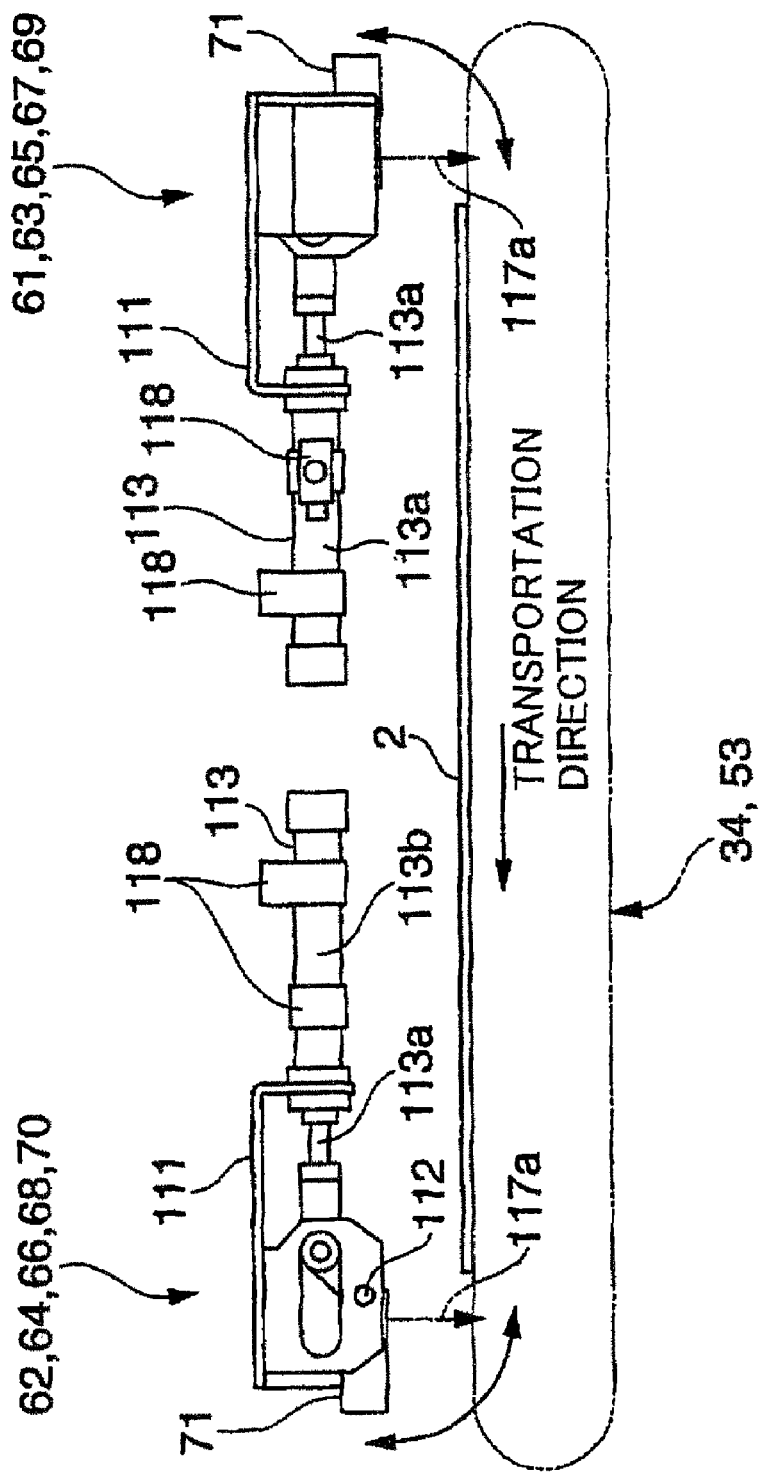
FIG. 16 is a side view showing a state where the tab members are moved to the evacuation positions.
Figure 17:
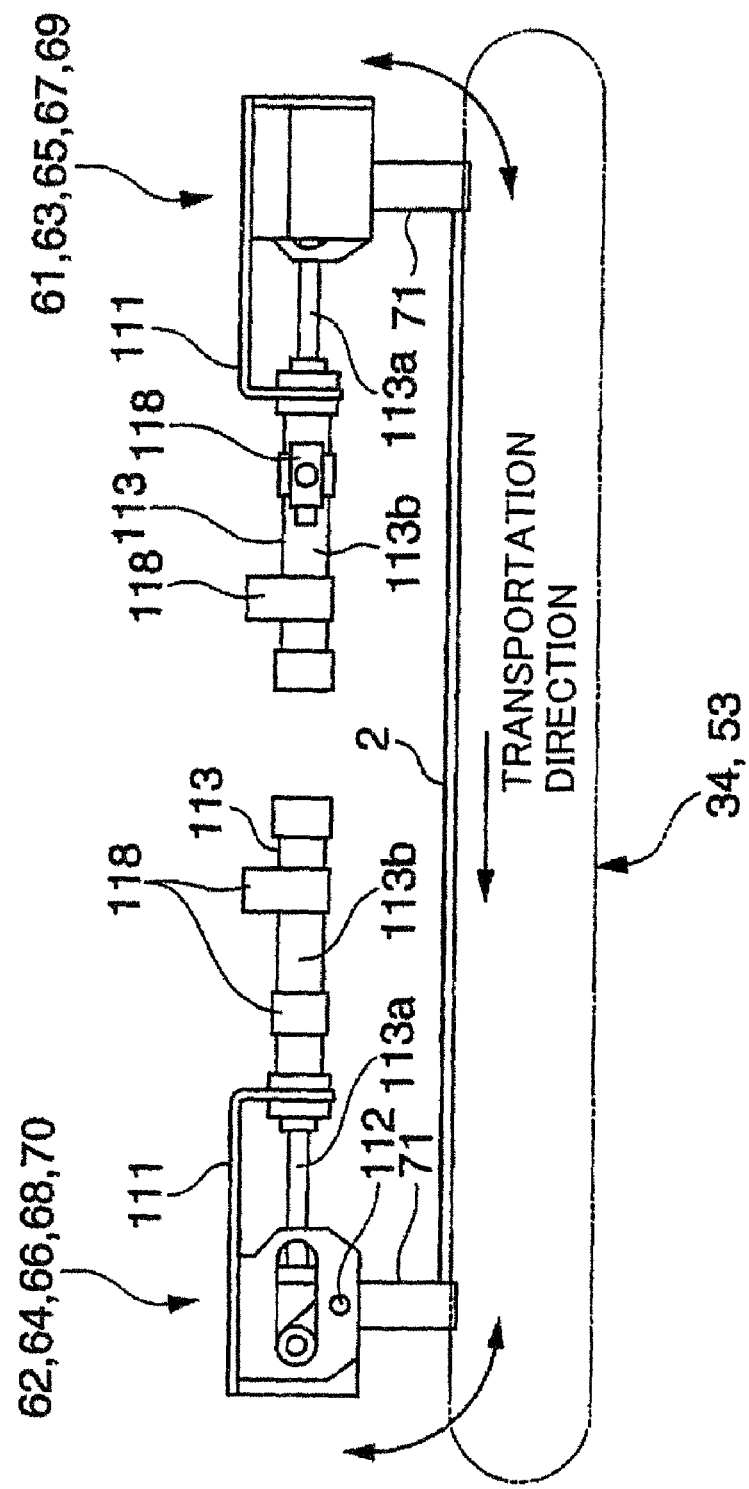
FIG. 17 is a side view showing a state where the tab members are located at the transportation positions.

FIG. 15 is an enlarged front view showing a supporting portion of the tab member. FIG. 16 is a side view showing a state where the tab members are moved to the evacuation positions. FIG. 17 is a side view showing a state where the tab members are located at the transportation positions.

Figure 18:
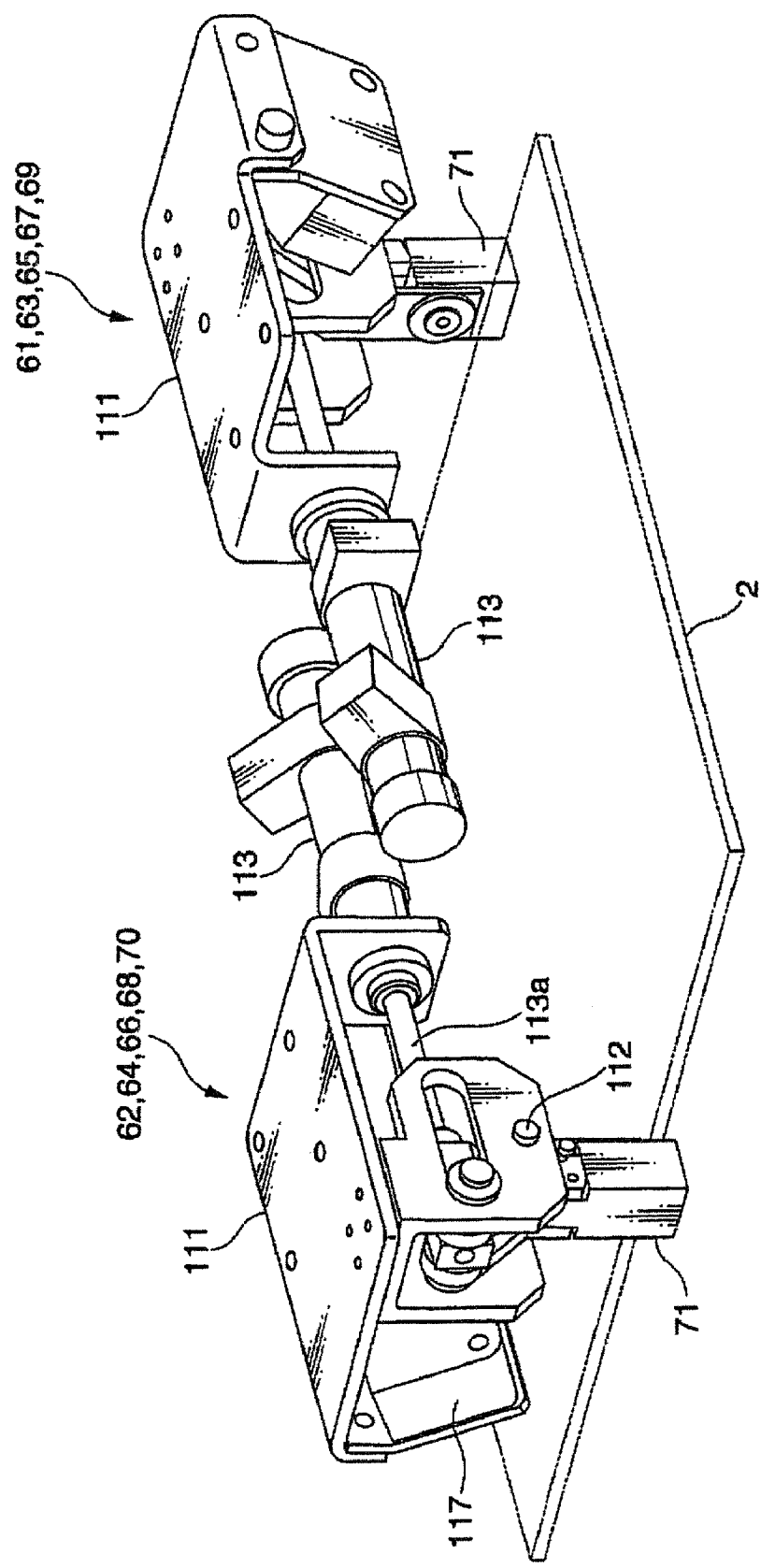
FIG. 18 is a perspective view showing a state where a printed wiring board is transported using a pair of tab members.
Figure 19:
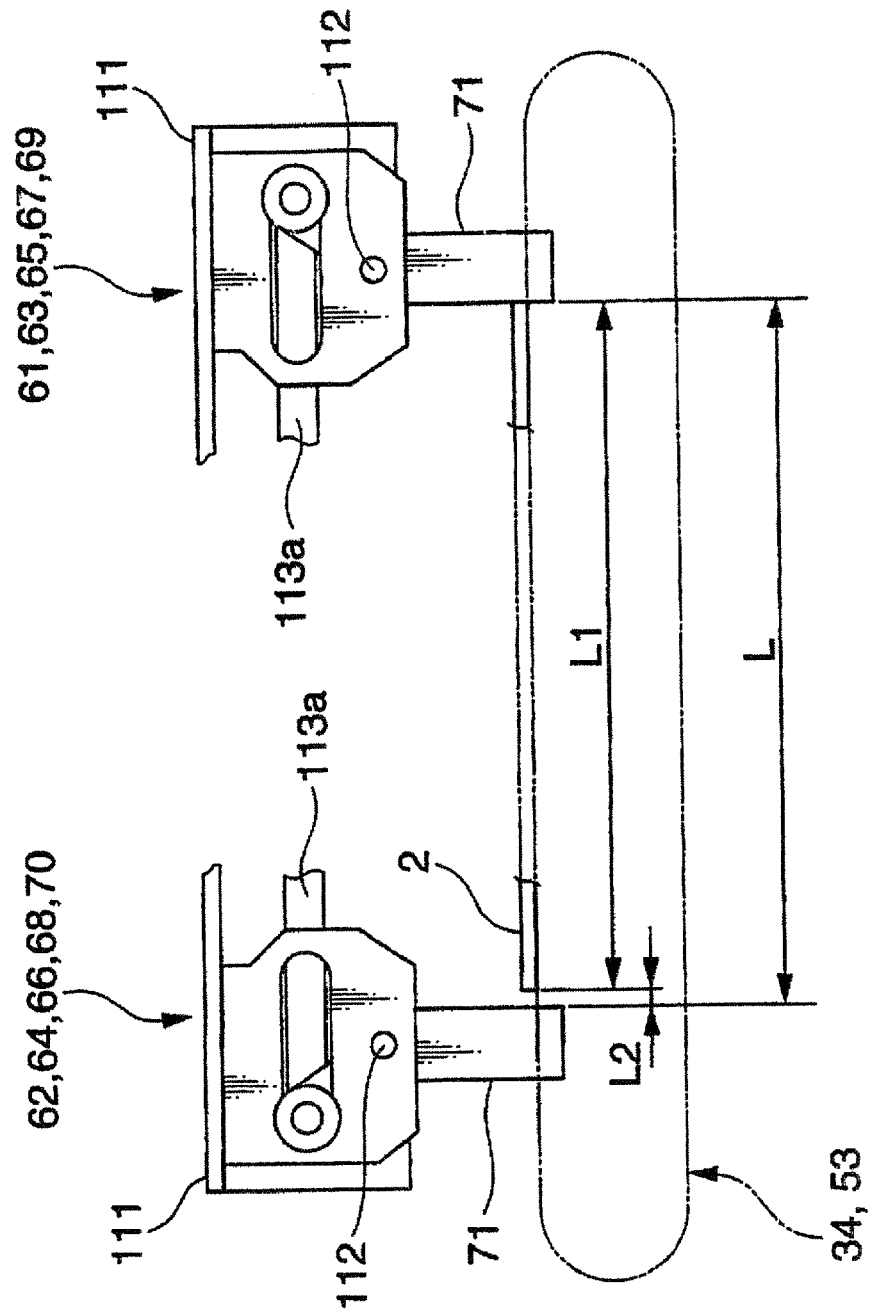
FIG. 19 is a side view used to describe an interval between the tab members.
Figure 20:
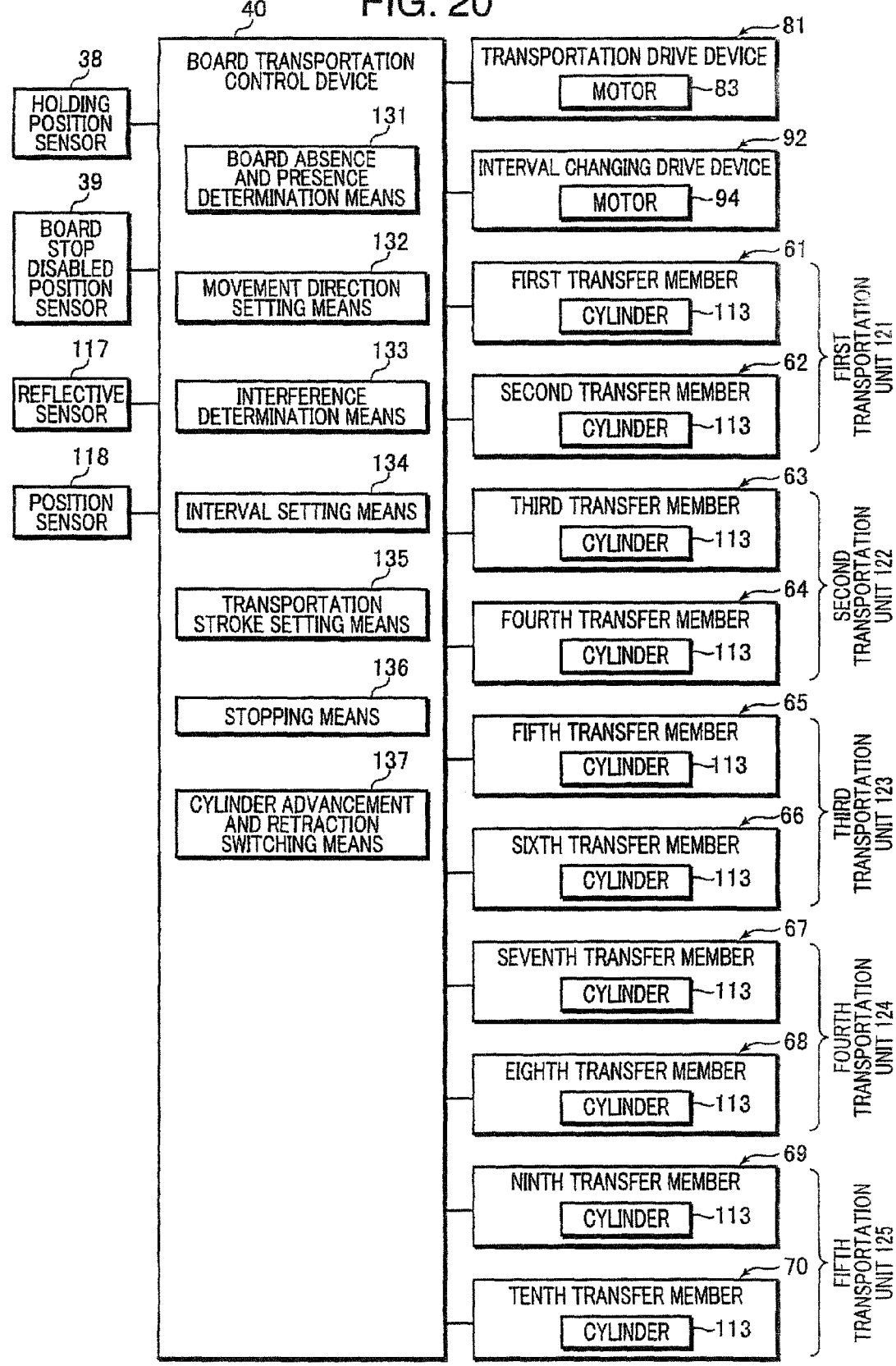
FIG. 20 is a block diagram showing the configuration of a control system of the board transfer device.
Figure 21:
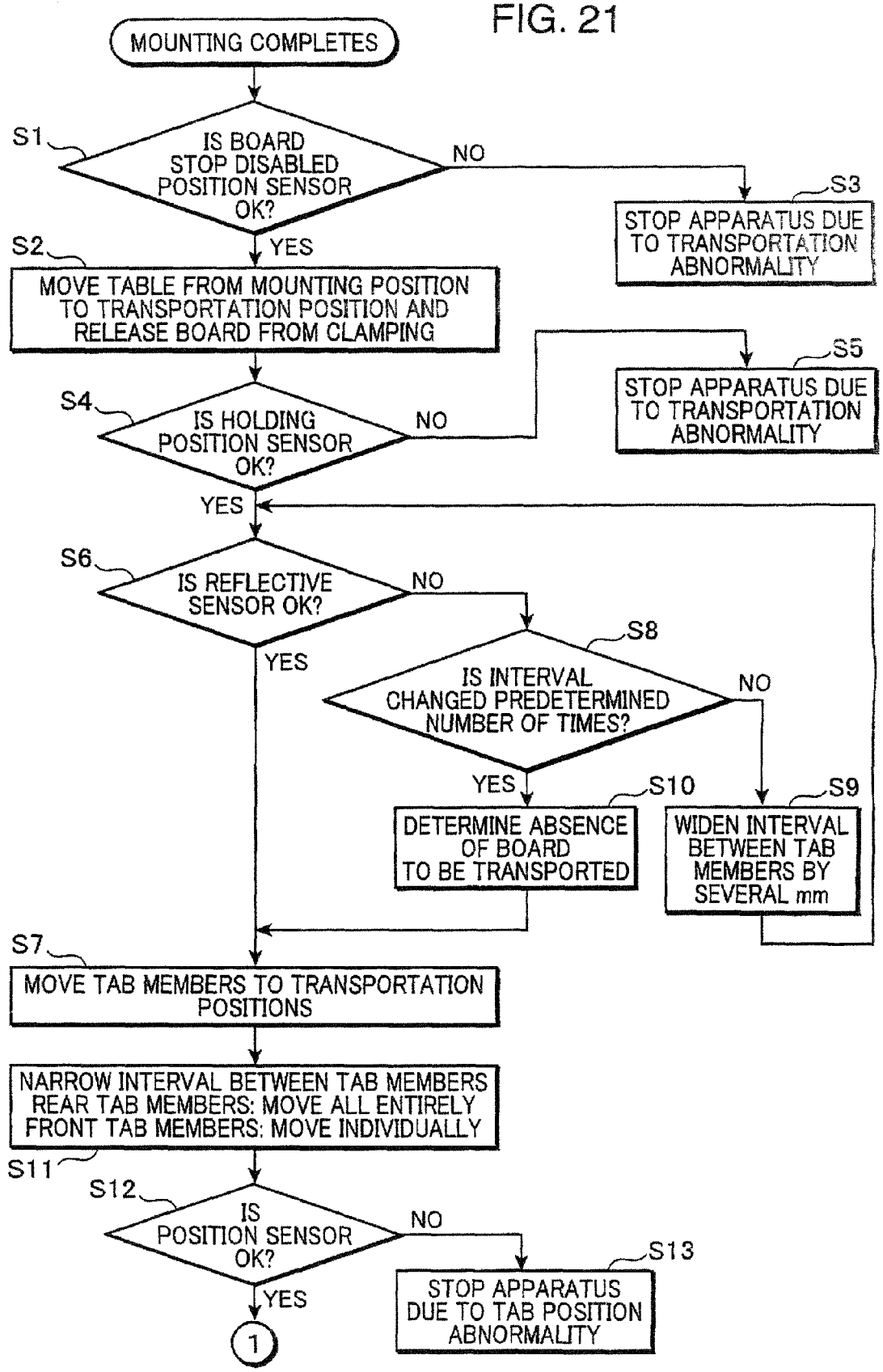
FIG. 21 is a flowchart used to describe operations of the board transfer device.
Figure 22:
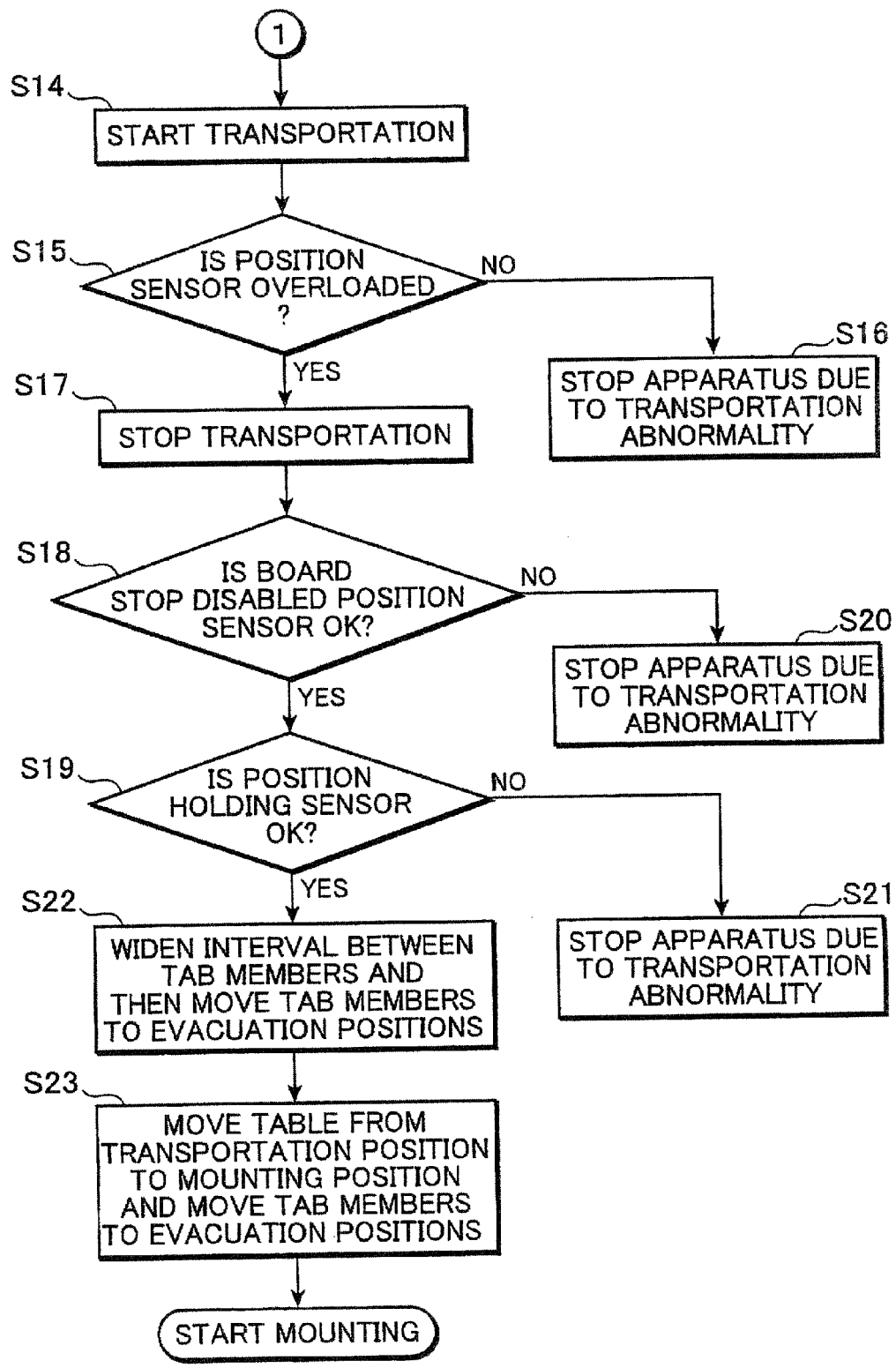
FIG. 22 is another flowchart used to describe operations of the board transfer device.

FIG. 18 is a perspective view showing a state where a printed wiring board is transported using a pair of tab members. In the drawing, the conveyers are omitted. FIG. 19 is a side view used to describe an interval between the tab members. FIG. 20 is a block diagram showing the configuration of a control system of the board transfer device. FIG. 21 and FIG. 22 are flowcharts used to describe operations of the board transfer device.

FIG. 23 is a diagram showing the configuration in an example of operations to transport four printed wiring boards at a time. FIG. 24 is a diagram showing the configuration in an example of operations to transport two printed wiring boards at a time.

In these drawings, reference numeral 1 denotes a surface mounting apparatus of this embodiment. The surface mounting apparatus 1 sends a printed wiring board 2 from an upstream end portion A adjacent to an apparatus (not shown) in a preceding process toward a downstream end portion B, and mounts respective electronic components (not shown) on the printed wiring board 2 using first through fourth mounting units 3 through 6 aligned in the transportation direction. Hereinafter, a direction (first direction) parallel to the transportation direction is referred to simply as the X direction and a direction (second direction) orthogonal to the transportation direction is referred to simply as the Y direction.

As is shown in FIG. 1, the surface mounting apparatus 1 of this embodiment includes a base stand 11 to support respective devices described below, the four mounting units 3 through 6 described above, a carry-in device 12 to receive a printed wiring board 2 from another apparatus adjacent to the upstream end portion A and to send the printed wiring board 2 to the first mounting unit 3 located at the most upstream end, a carry-out device 13 to receive the printed wiring board 2 from the fourth mounting unit 6 located at the most downstream end and to carry out the printed wiring board 2 to another unillustrated device, and a board transfer device 14 to transfer the printed wiring board 2 from one device to another in the X direction. Although it will be described in detail below, as are shown in FIG. 1 and FIG. 3, the board transfer device 14 is formed to extend in the Y direction and provided above the base stand 11 at the center portion in the Y direction.

As are shown in FIG. 3 and FIG. 4, the base stand 11 is provided with first through sixth Y frames 16 through 21 (see FIG. 1) that protrude upward from the base stand top surface 15. As are shown in FIG. 1 and FIG. 2, these first through sixth Y frames 16 through 21 are provided to the base stand 11 at six points in the X direction for each to extend in the Y direction. These Y frames 16 through 21 form members referred to as supporting stands in the invention.

Of these Y frames 16 through 21, as is shown in FIG. 4, the first Y frame 16 located at the most upstream end in the transportation direction is formed in the shape of a gate that bridges across the center portion of the base stand top surface 15 in the Y direction when viewed from upstream in the transportation direction of a printed wiring board 2. To be more specific, the first Y frame 16 includes top-bottom direction extending portions 16a and 16b extending in the top-bottom direction at the both end portions in the Y direction and a Y direction extending portion 16c extending in the Y direction so as to connect the upper ends of the top-bottom extending portions 16a and 16b. An opening 16d is formed in the center portion in the Y direction for allowing a printed wiring board 2 to pass through. One end portion of a center frame 23 described below is attached to the Y direction extending portion 16c.

Of the first through sixth Y frames 16 through 21, as is shown in FIG. 3, the second and fourth Y frames 17 and 19 located at the second and fourth positions from upstream in the transportation direction are provided to the base stand 11 in one side portion in the Y direction and the third and fifth Y frames 18 and 20 located at the third and fifth positions from upstream in the transportation direction are located on the side opposite to the second and fourth Y frames 17 and 19. As is shown in FIG. 3, concave portions 22 for allowing a printed wiring board 2 to pass through are provided in one end portions of these second through fifth Y frames 17 through 20 (one end portions located above the center portion of the base stand top surface 15 in the Y direction). The concave portions 22 are of a shape in which the bottom portions of the second through fifth Y frames 17 through 20 are notched while leaving the top portions. Top portions 17a through 20a of these Y frames 17 through 20 are shaped like cantilever beams by forming the concave portions 22 therein, and they are connected to the center frame 23 described below.

Of the first through sixth Y frames 16 through 21, as is shown in FIG. 4, the sixth Y frame 21 located at the most downstream end in the transportation direction is formed in the shape of a gate that bridges across the center portion of the base stand top surface 15 in the Y direction when viewed from upstream in the transportation direction of a printed wiring board 2. To be more specific, the sixth Y frame 21 includes top-bottom direction extending portions 21a and 21b extending in the top-bottom direction at the both end portions in the Y direction and a Y direction extending portion 21c extending in the Y direction so as to connect the upper ends of the top-bottom extending portions 21a and 21b. An opening 21d is formed in the center portion in the Y direction for allowing a printed wiring board 2 to pass through. The other end portion of the center frame 23 described below is attached to the Y direction extending portion 21c.

As is shown in FIG. 6, the center frame 23 is formed by means of casting in a frame shape that is long in the X direction. The center frame 23 of this embodiment includes a pair of longitudinal walls 23a and 23a extending in the X direction and connecting members 23b that connect these longitudinal walls 23a at the both end portions and intermediate portions in a total of four points. By adopting this configuration, the center frame 23 is provided with openings 23c, 23d, and 23e at three points each opening in both the top surface and the undersurface. Also, the longitudinal walls 23a and 23a are provided with attachment seats 23f for attachment to the first through sixth Y frames 16 through 21.

The center frame 23 is fixed to the first through sixth Y frames 16 through 21 with fixing bolts (not show) while placed on these Y frames. By attaching the center frame 23 to the first through sixth Y frames 16 through 21 in this manner, all the Y frames 16 through 21 are interconnected via the center frame 23.

As is shown in FIG. 3, the board transfer device 14 described below is attached to the center frame 23.

The four mounting units 3 through 6 has the same structure except for the mount positions on the base stand 11 and layout directions of the members. Accordingly, the first mounting unit 3 located at the most upstream end will be described herein and detailed descriptions of the other mounting units 4 through 6 are omitted by labeling like reference numerals to like members.

As are shown in FIG. 2 and FIG. 3, the first mounting unit 3 includes a supporting device 24 to support a printed wiring board 2, an electronic component supply device 26 having a large number of tape feeders 25, 25, and so on and located to be adjacent to the supporting device 24 on one side (the left side in FIG. 3 in the first mounting unit 3), and a electronic component transfer device 27 to transfer electronic components from the tape feeders 25 onto a printed wiring board 2 on the supporting device 24. The electronic component supply device 26 is provided on the base stand 11 or a carriage (not shown) connected to the base stand 11 in re-connectable manner.

As is shown in FIG. 3, the supporting device 24 includes a pair of guide rails 31 and 31 provided on the base stand top surface 15 to extend in the Y direction, a table 32 supported on these guide rails 31 in a movable manner, a Y direction drive device 33 to move the table 32 in the Y direction, a conveyer 34 provided on the table 32, and a clamp mechanism 35 to hold a position of a printed wiring board 2 with respect to the table 32 while electronic components are mounted on the printed wiring board 2.

As are shown in FIG. 2 and FIG. 3, the Y direction drive device 33 includes a ball screw shaft 33a supported on the base stand top surface 15 in a rotatable manner in a state extending in the Y direction, a motor 33b to rotate the ball screw shaft 33a, and a ball nut 33c threaded with the ball screw shaft 33a and fixed to the table 32.

As is shown in FIG. 3, when driven by the Y direction drive device 33, the table 32 reciprocates between a transportation position located directly below the board transfer device 14 described below and a mounting position spaced apart from the transportation position toward the electronic component supply device 26. In the surface mounting apparatus 1 of this embodiment, when the tables 32 in the respective mounting units 3 through 6 move to the transportation positions as are indicated by solid lines in FIG. 1, the conveyers 34 for the respective tables 32 are set in a single line in the X direction. A transportation path 51 (see FIG. 1) made up of these conveyers 34 is thus formed.

Also, when the table 32 has moved to the mounting position, the table 32 is located at a position in close proximity to the tape feeders 25.

As are shown in FIG. 3 and FIG. 5, the conveyer 34 includes a pair of longitudinal members 36 and 36 supported on corresponding supporting columns 32a of the table 32 and a pair of endless belts 37 and 37 provided to the corresponding longitudinal members 36 and 36 in a rotatable manner about the mutually opposing side portions. The conveyer 34 forms a member referred to as a transportation path forming member in the invention.

The endless belts 37 support the both end portions of a printed wiring board 2 in the Y direction and are forced to rotate when the board transfer device 14 described below is driven so as to press the printed wiring board 2 in the X direction (transportation direction). The printed wiring board 2 is consequently transported in the X direction. In order to restrict movements of the printed wiring board 2 in the Y direction when it is transported on the endless belts 37 and 37, as is shown in FIG. 5, guide faces 36a and 36a are formed on the mutually opposing inner surfaces of a pair of the longitudinal members 36 and 36.

Of a pair of the longitudinal members 36 and 36, the longitudinal member 36 positioned on the left side in FIG. 3, that is, one side on the electronic component supply device 26 side, is fixed to the table 32 so as not to move. In other words, one longitudinal member 36 and the endless belt 37 provided to this longitudinal member 36 together form an immovable side conveyer 34a, which is a part of the conveyer 34. Of the electronic component supply devices 26 shown on the both sides of the base stand 11 in the Y direction in FIG. 3, the electronic component supply device 26 in the first mounting unit 3 having the table 32 and the conveyer 34 and described with reference to FIG. 3 is the one positioned on the left side of FIG. 3.

Of a pair of the longitudinal members 36 and 36, as is shown in FIG. 3, the other longitudinal member 36, that is, the longitudinal member 36 located on the side opposite to the electronic component supply device 26, is attached to the table 32 via a width adjusting mechanism 36b. The width adjusting mechanism 36b adjusts the position in the Y direction of the endless belt 37 provided to the other longitudinal member 36 in response to a width dimension of a printed wiring board 2 in the Y direction, and moves the other longitudinal member 36 in the Y direction with respect to the table 32. In other words, the other longitudinal member 36 and the endless belt 37 provided to this longitudinal member 36 together form a movable side conveyer 34b that forms the conveyer 34 in cooperation with the immovable side conveyer 34a.

As is shown in FIG. 5, a pair of the longitudinal members 36 and 36 is provided with a holding position sensor 38 and a board stop disabled position sensor 39.

The holding position 38 includes a light emitting element 38a provided on the upper end portion of the longitudinal member 36 of the immovable side conveyer 34a and a light receiving element 38b provided at an intermediate portion in the top-bottom direction of the longitudinal member 36 of the movable side conveyer 34b. It is configured to detect a printed wiring board 2 when a detection laser beam 38d coming incident on a light receiving portion 38c in the light receiving element 38b from the light emitting element 38a is shielded by the printed wiring board 2. The holding position sensor 38 detects the position of the tip end of a printed wiring board 2 being transported on the conveyer 34. The light emitting element 38a and the light receiving element 38b are located at the same position in the transportation direction of the printed wiring board 2 and at different height positions so that the laser beam 38d diagonally crosses the transportation path of the printed wiring board 2. The term, "diagonally", referred to herein means a direction extending in the Y direction from the light emitting element 38a and inclining to point downward.

The position at which to attach the holding position sensor 38 is set to a position at which the edge of a printed wiring board 2 on the downstream side in the transportation direction shields the laser beam 38a while the printed wiring board 2 is placed on the conveyer 34 at the predetermined holding position. The detection result of the holding position sensor 38 is sent to a board transportation control device 40 described below as detection data. The board transportation control device 40 stops a transportation operation by the board transfer device 14 when the detection data is sent from the holding position sensor 38.

The board stop disabled position sensor 39 detects whether a printed wiring board 2 is present between the mounting units, between the carry-in device 12 and the first mounting unit 3, or between the fourth mounting unit 4 and the carry-out device 13. The board stop disabled position sensor 39 employs the same configuration as the holding position sensor 38. More specifically, the board stop disabled position sensor 39 includes a light emitting element 39a provided on the upper end portion of one longitudinal member 36 and a light receiving element 39b provided at an intermediate portion in the top-bottom direction of the other longitudinal member 36. It detects a printed wiring board 2 when a detection laser beam 39d coming incident on a light receiving portion 39c in the light receiving element 3bb from the light emitting element 39a is shielded by the printed wiring board 2.

In order to clarify the purpose to use the board stop disabled position sensor 39, FIG. 5 shows a state where the board stop disabled position sensors 39 are provided only to the downstream end portion of one conveyer 34 located upstream in the transportation direction and to the upstream end portion of another conveyer 34 located downstream in the transportation direction. It should be appreciated, however, that the board stop disabled position sensors 39 are actually provided to each conveyer 34 on the both end portions in the transportation direction.

The detection result of the board stop disabled position sensor 39 is sent to the board transportation control device 40 described below as detection data. The board transportation control device 40 maintains the Y direction drive device 33 and a Y direction drive device 54 described below in a deactivated state while the board stop disabled position sensor 39 is detecting a printed wiring board 2.

A printed wiring board 2 is transported using the conveyers 34 described above in a state where the tables 32 in the adjacent mounting units have been moved to the transportation positions. While the two tables 32 are located at the transportation positions in this manner, as is shown in FIG. 5, two conveyers 34 and 34 are set in a single line. The tables 32 are moved to the transportation positions in such a manner that the center of the printed wiring board 2 supported on the conveyer 34 in the Y direction comes directly below the center of the board transfer device 14 in the Y direction in the closest proximity. In other words, in the surface mounting apparatus 1 of this embodiment, even when a printed wiring board 2 having a different size in the Y direction is used, the center of the printed wiring board 2 in the Y direction comes directly below the center of the board transfer device 14 in the closest proximity.

When electronic components are mounted on a printed wiring board 2 supported on the conveyer 34, the table 32 is moved in the Y direction so that the immovable conveyer 34a comes in close proximity to the tape feeders 25, and the electronic components are mounted while the table 32 is located at the mounting position. By moving the table 32 in this manner, even when a printed wiring board 2 having a different size in the Y direction is used, it is always possible to locate the printed wiring board 2 at the position at which it comes in close proximity to the tape feeders 25.

As is shown in FIG. 3, the clamp mechanism 35 includes a pair of pressure receiving members 35a and 35a located above the both end portions of a printed wiring board 2 in the Y direction and unillustrated push up devices to push up the printed wiring board 2 together with the endless belts 37 from below so as to be pressed against the pressure receiving members 35a and 35a. Referring to FIG. 3, reference numeral 35b denotes a device that ascends and supports the rear surface of the printed wiring board 2. Of a pair of the pressure receiving members 35a and 35a, the pressure receiving member 35a located on the side opposite to the tape feeders 25 is supported on the main table 32 via the width adjusting mechanism 36b described above and moves in the Y direction together with the longitudinal member 36 of the movable side conveyer 34b in response to the size of a printed wiring board 2.

As are shown in FIG. 2 through FIG. 4, the electronic component transfer device 27 in the first mounting unit 3 includes a pair of first guide rails 41 and 41 provided, respectively, on the upper end portions of the first and third Y frames 16 and 18 to extend in the Y direction, a supporting member 42 extending in the X direction so as to bridge between these first guide rails 41 and 41 and supported on the first guide rails 41 in a movable manner, a pair of Y direction drive devices 43 and 43 to drive the supporting member 42, a second guide rail 44 provided to the supporting member 42 and extending in the X direction, a head unit 45 supported on the second guide rail 44 in a movable manner, an X direction drive device 46 to drive the head unit 45, and a plurality of attracting heads 48 supported on the head unit 45 via an elevating device 47 (see FIG. 3) to be independently ascendible and descendible. As is shown in FIG. 3, each attracting head 48 includes an attracting nozzle 48a to attract electronic components and a rotation drive device 48b that rotates the attracting nozzle 48a about the axial line in the top-bottom direction.

As are shown in FIG. 2 and FIG. 4, the Y direction drive device 43 to drive the supporting member 42 includes motors 43a fixed to one end portions of the first and third Y frames 16 and 18, ball screw shafts 43b connected to the motors 43a at one ends while extending in the Y direction and supported on the Y frames 16 and 18 in a rotatable manner, and ball nuts 43c (see FIG. 3) threaded with the ball screw shafts 43b and fixed to the supporting member 42.

The head unit 45 is provided with a board identification camera 49 (see FIG. 2) to detect the position of a printed wiring board 2 by imaging fiducial marks (not shown) on the printed wiring board 2 from above.

As are shown in FIG. 2 and FIG. 4, the X direction drive device 46 includes a motor 46a fixed to one end portion of the supporting member 42 in the X direction, a ball screw shaft 46b connected to the motor 46a at one end portion while extending in the X direction and supported on the supporting member 42 in a rotatable manner, and a ball nut (not shown) threaded with the ball screw shaft 46b and fixed to the head unit 45.

The electronic component transfer device 27 having these Y direction drive device 43 and X direction drive device 46 transfers electronic components from the tap feeders 25 onto a printed wiring board 2 located at the mounting position by moving the attracting heads 48 in the X direction and in the Y direction.

Although it is not shown in the drawings, the head unit 45 in the electronic component transfer device 27 is provided with a board imaging device to detect the position of a printed wiring board 2 located at the mounting position with respect to the base stand 11 and a component imaging device to detect the positions of electronic components attracted by the attracting nozzles 48a with respect to the attracting nozzles 48a. The component imaging device may be provided to the base stand 11.

As are shown in FIG. 1 and FIG. 2, the four mounting units 3 through 6 configured as described above are mounted on the base stand 11 in a state where they are aligned in a staggered fashion from upstream to downstream in the transportation direction when viewed in a plane. To be more specific, as are indicated by solid lines in FIG. 1, these four mounting units are provided on the base stand 11 in such a manner that the respective conveyers 34 are located at the same position in the Y direction (set in a single line in the X direction) while the conveyers 34 (printed wiring boards 2) in the respective supporting devices 24 have been moved to the transportation positions.

The conveyers 34 in the respective mounting units 3 through 6 are provided at positions at which they come in close proximity to each other in the X direction while being located at the transportation positions. In other words, printed wiring boards 2 placed on these conveyers 34 transfer directly from one conveyer 34 on the upstream side to another conveyer 34 on the downstream side as they are pushed from upstream in the transportation direction. The printed wiring boards 2 are transferred by the board transfer device 14 described below.

In the surface mounting apparatus 1 of this embodiment, as has been described, the conveyers 34 in the respective mounting units 3 through 6 having moved to the transportation positions together form the transportation path 51 extending in the X direction above the base stand 11 at the center portion in the Y direction as is shown in FIG. 1.

Further, a part of the other mounting units (the Y frames 17 through 20 and the Y direction drive device 43 in the electronic component transfer device 27) are located in spaces defined in the respective mounting units 3 through 6 on the sides opposite to the tape feeders 25 with the transportation path 51 in between.

In addition, the Y direction drive devices 43 and 43 provided adjacently to each other in the first mounting unit 3 and the third mounting unit 5 are mounted on the third Y frame 18. Likewise, the Y direction drive devices 48 provided adjacently to each other in the second mounting unit 4 and the fourth mounting unit 6 are mounted on the fourth Y frame 19.

As is shown in FIG. 2, each of the carry-in device 12 and the carry-out device 13 includes a table 52 provided on the base stand top surface 15 of the base stand 11 movably in the Y direction by the same supporting structure as the tables 32 in the respective mounting units 3 through 6 described above, a conveyer 53 mounted on the table 52, and a Y direction drive device 54 to move the table 52 in the Y direction. The Y direction drive devices 54 in the carry-in and carry-out devices 12 and 13 adopt a configuration by which the tables 52 are moved between a transportation position (positions of the tables 52 shown in FIG. 2) located on the transportation path 51 and a carry-in or carry-out position spaced apart from the transportation path 51 to the lower side in FIG. 2.

As is shown in FIG. 2, the conveyers 53 of the carry-in and carry-out devices 12 and 13 include endless belts 55 and 55 to support the both end portions of a printed wiring board 2 in the Y direction and a drive device (not shown) to rotate these endless belts 55 and 55. Each of the conveyers 53 also includes an immovable side conveyer 53a and a movable side conveyer 53b as with the conveyers 34 in the respective mounting units 3 through 6. The movable side conveyer 53b is attached to the table 52 via a width adjusting mechanism (not shown) to make the position in the Y direction adjustable in response to the width of a printed wiring board 2. Although it is not shown in the drawing, as with the conveyers 34 in the respective first through fourth mounting units 3 through 6, the conveyers 53 in the carry-in and carry-out devices 12 and 13 are provided with the holding position sensor 38 and the board stop disabled position sensor 39.

Although it is not shown in the drawing, an engagement/disengagement clutch is interposed to a motive power transmission system between the endless belts 55 and 55 and the drive device. To be more specific, in a case where printed wiring boards 2 have been sent to each of the carry-in device 12 and the first through fourth mounting units 3 through 6 and these five printed wiring boards 2 are to be sent by the board transfer device 14 by one pitch (the interval between the mounting units), the engagement/disengagement clutch is set in a disengaged state where no motive power is transmitted, so that the conveyers 53 in the carry-in and carry-out devices 12 and 13 are freely rotatable. Meanwhile, when the carry-in device 12 is to receive a printed wiring board 2 from an apparatus that performs a preceding process and the carry-out device 13 is to carry out a printed wiring board 2 to an apparatus that performs a post-process, the engagement/disengagement clutch is set to an engaged state, so that the conveyer 53 in the carry-out device 12 and the conveyer 53 in the carry-out device 13 are driven to rotate by the drive device.

The conveyer 53 in the carry-in device 12 while being located at the transportation position is provided at a position at which it comes in close proximity to the conveyer 34 located at the transportation position in the X direction, so that the printed wiring board 2 is allowed to transfer directly onto the conveyer 34 in the first mounting unit 3.

The conveyer 53 in the carry-out device 13 while being located at the transportation position is provided at a position at which it comes in close proximity to the conveyer 34 located at the transportation position in the X direction, so that a printed wiring board 2 is allowed to transfer directly from the conveyer 34 in the fourth mounting unit 6.

As is shown in FIG. 1, the carry-in device 12 is configured in such a manner that it is connected to an apparatus, such as a printing machine, that performs a preceding process while the conveyer 53 has moved to the carry-in position. The carry-out device 13 is configured in such a manner that it is connected to an apparatus that performs a post-process while the conveyer 53 has moved to the carry-out position.

As are shown in FIG. 7 and FIG. 10, the board transfer device 14 includes first through tenth transfer members 61 through 70 located below the center frame 23. A printed wiring board 2 is transported in the X direction using tab members 71 provided to these transfer members 61 through 70. In this embodiment, the tab members 71 form members referred to as abutting members in the invention.

To be more specific, as is shown in FIG. 10, the board transfer device 14 includes a drive unit 72 fixed to the center frame 23 while it is placed on the center frame 23, a transmission mechanism 73 extending downward from the drive unit 72 through the opening 23c in the center frame 23, the first, third, fifth, seventh, and ninth transfer members 61, 63, 65, 67, and 69 attached to the lower end portion of the transmission mechanism 73 and allowed to move integrally, the second, fourth, sixth, eighth, and tenth transfer members 62, 64, 66, 68, and 70 provided movably with respect to the first transfer member 61 and allowed to move integrally, and the board transportation control device 40 (see FIG. 20) to control operations of these transfer members 61 through 70. The board transfer device 14 of this embodiment transports five printed wiring boards 2 at a time using the first through tenth transfer members 61 through 70 described above.

As are shown in FIG. 10 and FIG. 12, the drive unit 72 includes a supporting body 74 fixed to the longitudinal wall 23a positioned in one side portion (the right side in FIG. 10) of the center frame 23 in the Y direction and having a portion protruding above the center frame 23 in a length in the X direction almost equal to the length of the opening 23c in the X direction, a guide rail 75 provided on one side surface of the supporting body 74 to extend in the X direction, and a first drive member 77 shaped like a plate and supported on the guide rail 75 via a slider 76 in a movable manner. The slider 76 is fixed to the first drive member 77. The length of the guide rail 75 in the X direction is almost equal to the length of the supporting body 74. The length of the first drive member 77 in the X direction is about ½ of the length of the portion of the supporting body 74 protruding above the center frame 23.

The supporting body 74 includes a first supporting body 74a having a supporting plate 78a that extends to penetrate through the opening 23c in the center frame 23 in the top-bottom direction, a second supporting body 74b having a supporting plate 78b (see FIG. 11) extending to penetrate through the opening 23d in the center frame 23 in the top-bottom direction, a third supporting body 74c having a supporting plate 78c (see FIG. 11) extending to penetrate through the opening 23e in the center frame 23 in the top-bottom direction, and a base portion 74d (see FIG. 10) protruding above the center frame 23. The length of the first supporting body 74a in the X direction is set to be almost equal to the length of the opening 23c in the X direction. The length of the second supporting body 74b in the X direction is set to be almost equal to the length of the opening 23d in the X direction. The length of the third supporting body 74c in the X direction is set to be almost equal to the length of the opening 23e in the X direction.

The first supporting body 74a (the supporting plate 78a) is screwed together with the base portion 74d of the supporting body 74 to the top surface of the longitudinal wall 23a using a bolt 80 and fixed thereon. The lower end portion is formed long in the X direction to extend from one end portion to the other end portion of the center frame 23 and protrudes below the center frame 23. A guide rail 79a extending in the X direction is provided to a side surface of a portion of the supporting plate 78a protruding below the center frame 23.

As is shown in FIG. 12, the first drive member 77 is connected to a transportation drive device 81 of a ball screw type provided to the supporting body 74, and moves in the X direction with respect to the supporting body 74 when driven by the transportation drive device 81.

The transportation drive device 81 includes a ball screw shaft 82 supported on the supporting body 74 in a rotatable manner, a motor 83 connected to one end portion of the ball screw shaft 82, a ball nut 84 (see FIG. 8) threaded with the ball screw shaft 82 and immovably supported on the top portion of the first drive member 77, and so forth.

As are shown in FIG. 9 through FIG. 12, a guide rail 85 extending in the X direction to have a length of about ½ of the length of the first supporting body 74a in the X direction is provided to one side surface of the first drive member 77. The first drive member 77 supports a second drive member 91 movably in the X direction via the guide rail 85 and a slider 86 supported on the guide rail 85 in a movable manner. The slider 86 is fixed to the second drive member 91. The second drive member 91 is connected to an interval changing drive device 92 of a ball screw type provided to the first drive member 77, and moves in the X direction with respect to the first drive member 77 when driven by the interval changing drive device 92.

The interval changing drive device 92 includes a ball screw shaft 93 supported on the first drive member 77 in a rotatable manner, a motor 94 connected to one end portion of the ball screw shaft 93, and a ball nut 95 (see FIG. 9) threaded with the ball screw shaft 93 and immovably supported on the top portion of the second drive member 91.

The first drive member 77 and the second drive member 91 move integrally in the X direction with respect to the supporting body 74 when driven by the transportation drive device 81. Also, the second drive member 91 moves in the X direction with respect to the first drive member 77 when driven by the interval changing drive device 92.

As are shown in FIG. 8 through FIG. 10, the transfer mechanism 73 includes a first arm 101 extending downward from the lower end portion of the first drive member 77 through the opening 23c in the center frame 23, a first driven member 102a connected to the lower end portion of the first arm 101 and extending in the X direction, a second arm 103 (see FIG. 9) extending downward from the lower end portion of the second drive member 91 through the opening 23c in the center frame 23, and a second driven member 104a connected to the lower end portion of the second arm 103 and extending in the X direction.

As is shown in FIG. 10, the first driven member 102a is supported on the guide rail 79a of the supporting plate 78a via a slider 105a in a movable manner. A guide rail 106a is provided in one side portion (the lower side in FIG. 1 and the left side in FIG. 10) of the first driven member 102a.

The second driven member 104a is supported on the guide rail 106a via a slider 107a in a movable manner.

The first transfer member 61 and the third transfer member 63 spaced apart in the X direction are fixed to the lower end of the first driven member 102a.

The second transfer member 62 and the fourth transfer member 64 spaced apart in the X direction are fixed to the lower end of the second driven member 104a.

As is shown in FIG. 11, the other transfer members 65 through 70 are supported on the second supporting body 74b and the third supporting body 74c. In other words, as is shown in FIG. 11, the second supporting body 74b includes a supporting plate 78b extending to penetrate through the opening 23d in the center frame 23 in the top-bottom direction.

The length of the supporting plate 78b in the X direction is set to be almost equal to the length of the opening 23d in the X direction. The supporting plate 78b is fixed to the top surface of the longitudinal wall 23a by a bolt 80 and the lower end portion protrudes below the center frame 23.

A guide rail 79b extending in the X direction is provided to the side surface of the supporting plate 78b in the portion protruding below the center frame 23. A first driven member 102b is supported on the guide rail 79b via a slider 105b in a movable manner. The first driven member 102b is coupled to the first driven member 102a using an unillustrated detachable joint.

A guide rail 106b is provided in one side portion of the first driven member 102b (the lower side in FIG. 1 and the left side in FIG. 11). A second driven member 104b is supported on the guide rail 106b via a slider 107b in a movable manner. The second driven member 104b is coupled to the second driven member 104a using an unillustrated detachable joint.

The fifth transfer member 65 is fixed to the lower end of the first driven member 102b and the sixth transfer member 66 is fixed to the lower end of the second driven member 104b.

Also, as is shown in FIG. 11, the third supporting body 74c includes a supporting plate 78c extending to penetrate through the opening 23e in the center frame 23 in the top-bottom direction.

The length of the supporting plate 78c in the X direction is set to be almost equal to the length of the opening 23e in the X direction. The supporting plate 78c is fixed to the top surface of the longitudinal wall 23a using a bolt 80 and the lower end portion protrudes below the center frame 23.

A guide rail 79c extending in the X direction is provided to the side surface of the supporting plate 78c in the portion protruding below the center frame 23. A first driven member 102c is supported on the guide rail 79c via a slider 105c in a movable manner. The first driven member 102c is coupled to the first driven member 102b using an unillustrated detachable joint.

A guide rail 106c is provided in one side portion of the first driven member 102c (the lower side in FIG. 1 and the left side in FIG. 11). A second driven member 104c is supported on the guide rail 106c via a slider 107c in a movable manner. The second driven member 104c is coupled to the second driven member 104b using an unillustrated detachable joint.

The seventh transfer member 67 and the ninth transfer member 69 spaced apart in the X direction are fixed to the lower end of the first driven member 102c. The eighth transfer member 68 and the tenth transfer member 70 spaced apart in the X direction are fixed to the lower end of the second driven member 104c.

In this embodiment, the transportation drive device 81, the interval changing drive device 92, the guide rail 85, the slider 86, the second drive member 91, the second arm 103, the second driven members 104a through 104c, the guide rails 106a through 106c, and the sliders 107a through 107c together form a device referred to as an interval changing device.

As are shown in FIG. 13 through FIG. 15, each of the first through tenth transfer members 61 through 70 includes a supporting bracket 111 attached to the lower end portion of corresponding one of the first driven members 102a through 102c or the second driven member 104a through 104c, a supporting member 111a provided to the supporting bracket 111 so as to protrude downward, the tab member 71 supported on the supporting member 111a by the supporting shaft 112 to be able to oscillate, and the cylinder 113 to oscillate the tab member 71. In this embodiment, the cylinder 113 forms a device referred to as an abutting member drive device in the invention.

As is shown in FIG. 15, the tab member 71 is attached to the tip end portions of levers 71a as a tab member main body. An assembly having the tab member 71 and the levers 71a is shaped like a rod and supported on the supporting bracket 111 by the supporting shaft 112 penetrating through the center portion in the longitudinal direction to be able to oscillate. In this embodiment, the supporting shaft 112 penetrates through the levers 71a in a rotatable manner. In other words, the tab member 71a oscillates about the supporting shaft 112 when the levers 71a rotate (oscillate) with respect to the supporting shaft 112.

The supporting shaft 112 is attached so that the axial direction points to the Y direction. More specifically, the tab member 71 is able to oscillate between a position at which one end portion points downward as are shown in FIG. 14 and FIG. 17 and a position at which one end portion points in the horizontal direction as are shown in FIG. 13 and FIG. 16. The cylinder 113 described below is coupled to the other end portion of the tab member 71. The tab member 71 oscillates as has been described above through the driving operation of the cylinder 113.

Hereinafter, a position of the tab member 71 when the tab member 71 has oscillated to a point at which one end portion of the tab member 71 points downward is referred to simply as the transportation position, and a position of the tab member 71 when the tab member 71 has oscillated to a point at which the one end portion points in the horizontal direction is referred to simply as the evacuation position. As is shown in FIG. 17, the length of the tab member 71 is set in such a manner that the tip end of the tab member 71 is positioned below a printed wiring board 2 on the conveyer 34 or 53 while the tab member 71 is located at the transportation position.

The cylinder 113 includes an air cylinder, and as are shown in FIG. 16 and FIG. 17, it is provided at a position at which it is adjacent to the tab member 71 while the axial direction points in the X direction. The tip end portion of the piston rod 113a of the cylinder 113 is coupled, in a rotatable manner, to one ends of the levers 71a on the opposite side to the ends coupled to the tab member 71.

The coupling portion of the piston rod 113a and the levers 71a adopts a structure in which a slider shaft 114 parallel to the supporting shaft 112 is allowed to penetrate through the levers 71a and the tip end portion of the piston rod 113a is fit in the slider shaft 114 in a rotatable manner. The both end portions of the slider shaft 114 protrude to the outside of the supporting member 111a by passing through long holes 115 formed in the supporting member 111a that supports the supporting shaft 112. The long holes 115 are formed to extend in parallel with a direction along which the piston rod 113a moves.

Sliders 116 fit in the long holes 115 in a slidable manner are attached to the both end portions of the slider shaft 114. Also, the levers 71a each are formed with a long hole at a coupling portion with the slider shaft 114. The slider shaft 114 is inserted into the long holes extending along a radial direction of the supporting shaft 112. It is configured in such a manner that the levers 71a and the tab member 71 are allowed to oscillate about the supporting shaft 112 when the slider shaft 114 together with the piston rod 113a move in parallel along the long holes 115.

As the piston rod 113a coupled to the tab member 71 is inserted (retreated) inside the cylinder main body 113b, the tab member 71 oscillates to the evacuation position as are shown in FIG. 13 and FIG. 16. Also, as the piston rod 113a protrudes (advances) from the cylinder main body 113b from this state, the tab member 71 oscillates to the transportation position at which the tab member 71 points downward as is shown in FIG. 14 and FIG. 17.

As are shown in FIG. 13 through FIG. 15, an optical sensor 117 is provided to the supporting bracket 111 in a region adjacent to the tab member 71. Although it is not shown in the drawings, the sensor 117 is of a reflective type having an LED and an imaging element and detects whether a printed wiring board 2 is positioned in a region where the tip end portion of the tab member 71 is supposed to come finally when the tab member 71 has oscillated from the evaluation position to the transportation position. To be more specific, as is shown in FIGS. 15 and 16, the LED irradiates illumination light 117a diagonally below. The illumination light 117a is irradiated to a region where the tip end portion of the tab member 71 is supposed to be positioned when the tab member 71 has oscillated to the transportation position. In a case where a printed wiring board 2 stops at a position ahead or behind the predetermined stop position for some reason and shields the illumination light 117a, the imaging element receives the reflected light.

The detection result of the reflective sensor 117 having the imaging device is sent to the board transportation control device 40 as detection data.

Positions sensors 118 to detect the position of a piston (not shown) are provided to the both end portions of the cylinder 113. Although it is not shown in the drawings, the position sensors 118 adopt a configuration to detect a change in a magnetic field that occurs when the magnet embedded in the piston of the cylinder 113 moves together with the piston. The detection results of the position sensors 118 are sent to the board transportation control device 40 as detection data. The cylinder 113 is switched to advance and retreat by opening and closing an electromagnetic valve provided to a pneumatic circuit (not shown) of the cylinder 113 by the board transportation control device 40.

Of the ten transfer members 61 through 70, in the odd-numbered transfer devices from upstream, that is, the first, third, fifth, seventh, and ninth transfer members 61, 63, 65, 67, and 69, the tab member 71 and the cylinder 113 are attached to corresponding one of the first driven members 102a, 102b, and 102c so that the cylinder 113 is located downstream of the tab member 71 in the transportation direction. The tab members 71 in these transfer members come in close proximity to printed wiring boards 2 from behind (upstream) in the transportation direction by oscillating from the evacuation positions to the transportation positions.

Also, of the ten transfer members 61 through 70, in the even-numbered transfer devices from upstream, that is, the second, fourth, sixth, eighth, and tenth transfer members 62, 64, 66, 68, and 70, the tab member 71 and the cylinder 113 are attached to corresponding one of the second driven members 104a, 104b, and 104c so that the cylinder 113 is located upstream of the tab member 71 in the transportation direction. The tab members 71 in these transfer members come in close proximity to printed wiring boards 2 from the front (downstream) by oscillating from the evacuation positions to the transportation positions.

Of the first through tenth transfer members 61 through 70, the first transfer member 61 and the second transfer member 62 operate in cooperation with each other and form a first transportation unit 121 (see FIG. 20) that transports a printed wiring board 2 from the carry-in device 12 to the first mounting unit 3.

Also, the third transfer member 63 and the fourth transfer member 64 operate in cooperation with each other and form a second transportation unit 122 that transports a printed wiring board 2 from the first mounting unit 3 to the second mounting unit 4. Likewise, the fifth transfer member 65 and the sixth transfer member 66 operate in cooperation with each other and form a third transportation unit 123 that transports a printed wiring board 2 from the second mounting unit 4 to the third mounting unit 5.

The seventh transfer member 67 and the eighth transfer member 68 operate in cooperation with each other and form a fourth transportation unit 124 that transports a printed wiring board 2 from the third mounting unit 5 to the fourth mounting unit 6. The ninth transfer member 69 and the tenth transfer member 70 operate in cooperation with each other and form a fifth transportation unit 125 that transports a printed wiring board 2 from the fourth mounting unit 6 to the carry-out device 13. As are shown in FIG. 16 and FIG. 17, a pair of the tab members 71 and 71 provided to each of the first through fifth transportation units 121 through 125 moves to positions at which the tab members 71 pinch a printed wiring board 2 from the both sides in the transportation direction by oscillating from the evacuation positions to the transportation positions.

The tab members 71 provided to the first, third, fifth, seventh, and ninth transfer members 61, 63, 65, 67, and 69 in the first through fifth transportation units 121 through 125 form members referred to as rear abutting members in the invention. The tab members 71 provided to the second, fourth, sixth, eighth, and tenth transfer members 62, 64, 66, 68, and 70 form members referred to as front abutting members in the invention.

As is shown in FIG. 19, an interval between a pair of the transfer members forming each transportation unit (an interval between the front abutting member and the rear abutting member) is set correspondingly to the length of a printed wiring board 2. More specifically, the interval (indicated by a letter L in the drawing) is set to a length, which is a sum of a length L1 of a printed wiring board 2 in the transportation direction and a predetermined interval L2. The interval L2 is set to about 1 mm in this embodiment.

The interval L is adjusted in response to the length of a printed wiring board 2 to be transported in the transportation direction by moving the transfer members 62, 64, 66, 68, and 70 on the rear side in the transportation direction in the transportation direction (X direction) with respect to the other transfer members 61, 63, 65, 67, and 69 by driving the interval changing drive device 92. When printed wiring boards 2 are transported by the respective transportation units 121 through 125 described above, all the transfer members are moved in the transportation direction by the driving operation of the transportation drive device 81.

As is shown in FIG. 20, the board transportation control device 40 includes board absence and presence determination means 131, movement direction setting means 132, interference determination means 133, interval setting means 134, transportation stroke setting means 135, stopping means 136, and cylinder advancement and retraction switching means 137.

The board absence and presence determination means 131 determines whether printed wiring boards 2 are properly placed on the respective conveyers 34 and 53 provided in the surface mounting apparatus 1. This determination is made on the basis of the detection results from the holding position sensors 38 and the board stop disabled position sensors 39 provided to the respective conveyers 34 and 53. For example, in a case where a printed wiring board 2 is not positioned where it is supposed to be, the board absence and presence determination means 131 determines an abnormality and stops the surface mounting apparatus 1.

The movement direction setting means 132 sets a direction in which to rotate the motor 83 for the transportation drive device. When printed wiring boards 2 are to be transported by the first through tenth transfer members 61 through 70, it rotates the motor 83 forward. Also, when the first through tenth transfer members 61 through 70 are to be returned to the initial positions after printed wiring boards 2 are transported, the movement direction setting means 132 rotates the motor 83 in a direction opposite to the direction during the transportation after all the tab members 71 in the first through tenth transportation members 61 through 70 are oscillated to the evacuation positions by the cylinder advancement and retraction switching means 137 described below.

The interference determination means 133 determines whether a printed wiring board 2 is present at the positions to which a pair of the tab members 71 and 71 is to be lowered according to the detection result from the reflective sensors 117 provided in close proximity to the tab members 71. In a case where a printed wiring board 2 is present at the positions to which the tab members 71 and 71 are to be lowered, the interference determination means 133 sends a control signal corresponding to the determination result to the interval setting means 134 described below.

The interval setting means 134 sets the interval between a pair of the tab members 71 and 71 in each of the first through fifth transportation units 121 through 125 in response to the length L1 of a printed wiring board 2 to be transported in the transportation direction. The interval is set by rotating the motor 94 in the interval changing drive device 92. Also, in a case where the control signal indicating the presence of a printed wiring board 2 at the positions to which the tab members 71 and 71 are to be lowered is sent from the interference determination means 133, the interval setting means 134 rotates the motor 83 in the transportation drive device 81 or the motor 94 in the interval changing drive device 92 for the tab members 71 to move away from the printed wiring board 2 when viewed in a plane so as to avoid interference between the tab members 71 and the printed wiring board 2.

After the positions of the tab members 71 are changed by the interval setting means 134, the interference determination means 133 determines the absence or presence of a printed wiring board 2 again. Further, the interval setting means 134 adopts a circuit that stores the number of times the interval between the tab members 71 and 71 is widened. In a case where an operation to widen the interval is performed a predetermined number of times or more, the interval setting means 134 determines that there is no printed wiring board 2 to be transported and ends the control to move the tab members 71.

The interval setting means 134 of this embodiment moves a pair of the tab members 71 and 71 to the side of a printed wiring board 2 so that the interval between the tab members 71 becomes shorter by a predetermined length after the tab members 71 have been moved to the transportation positions under the control of the cylinder advancement and retraction switching means 137 described below. More specifically, the interval setting means 134 changes the interval between the tab members 71 and 71 in a divided manner with a first change quantity to set the interval correspondingly to the length of a printed wiring board and a second change quantity to bring the tab members 71 closer to the side of a printed wiring board 2 by a predetermined dimension after the tab members 71 have been moved to the transportation positions.

Accordingly, when the tab members 71 move to the transportation positions, the tab members 71 can be spaced apart from a printed wiring board 2 by the second change quantity. It thus becomes possible to prevent the tab members 71 from coming into contact on the printed wiring board 2 in a reliable manner.

The transportation stroke setting means 135 sets a transportation stroke (a transfer distance) during transportation by the respective transfer members in response to the intervals among the first through fourth mounting units 3 through 6.

The stopping means 136 stops the motor 83 in the transportation drive device 81 that rotates during transportation of a printed wiring board 2, and it is configured in such a manner so as to gradually decrease a rotational speed of the motor 83 when the motor 83 is stopped. When the motor 83 is stopped as descried above, the stopping means 136 of this embodiment stops the motor 83 so that negative acceleration generated when decreasing the rotational speed of the motor 83 reaches predetermined magnitude. The predetermined negative acceleration is set to the maximum magnitude at which electronic components that have been already mounted on a printed wiring board 2 will not move by inertia. By setting the negative acceleration in this manner, it becomes possible to stop the printed wiring board 2 as soon as possible while preventing the electronic components from moving by inertia.

The cylinder advancement and retraction switching means 137 causes all the tab members 71 to oscillate to the transportation positions by operating the respective cylinders 113 in the first through tenth transfer members 61 through 70 by means of an unillustrated pneumatic valve control device before the motor 83 rotates forward. Also, the cylinder advancement and retraction switching means 137 causes all the tab members 71 to oscillate to the evacuation positions by operating the respective cylinders 113 in the first through tenth transfer members 61 through 70 by means of the unillustrated pneumatic valve control device before the motor 83 rotates backward.

In the surface mounting apparatus 1 configured as above, a printed wiring board 2 sent from an apparatus in a preceding process is transported to the transportation position on the transportation path 51 from the carry-in position by the movement of the table 52 in the carry-in device 12. In other words, the table 52 is moved so that the conveyer 53 provided to the table 52 in the carry-in device 12 is lined up with the conveyer 34 in the first mounting unit 3 located at the transportation position. In this instance, the first through fifth transportation units 121 through 125 of the board transfer device 14 have been moved to the initial positions in the transportation direction after the respective tab members 71 had oscillated to the evacuation positions. Also, in this instance, the conveyer 34 in the first mounting unit 3 is positioned in the Y direction by the Y direction drive device 33 so that the width is pre-adjusted in response to the size of the printed wiring board 2 in the Y direction for the center in the width direction (Y direction) to coincide with the center of the conveyer 53 in the carry-in device 12 in the width direction.

Operations of the board transfer device 14 and the board transportation control device 40 when transporting a printed wiring board 2 using the tab members 71 will now be described in detail with the flowcharts shown in FIG. 21 and FIG. 22. The flowcharts shown in FIG. 21 and FIG. 22 detail an example of operations of the board transfer device 14 and the table 23 when a printed wiring board, on which electronic components have been already mounted, is transported to an adjacent mounting unit to mount electronic components further thereon. It should be appreciated, however, that when a printed wiring board 2 is transported from the carry-in device 12 to the first mounting unit 3, the board transfer device 14 operates in the same manner as in a case where a printed wiring board 2 is transported from one mounting unit to another mounting unit.

As has been described, after the conveyer 34 and the conveyer 53 become ready for transportation, in Step S1 in the flowchart shown in FIG. 21, the board transportation control device 40 confirms the absence of a printed wiring board 2 between the conveyer 34 and the conveyer 53 using the board stop disabled position sensors 39, after which it proceeds to Step S2. Upon determining in Step S1 that there is a printed wiring board 2 between these conveyers 34 and 53, the board transportation control device 40 stops the entire apparatus by activating an alarm notifying a transportation abnormality in Step S3.

Step S2 shows an operation after electronic components are mounted. More specifically, the board transportation control device 40 in this instance moves the table 32 from the mounting position to the transportation position and releases the printed wiring board 2 clamped by the clamp mechanism 35.

Subsequently, as is shown in Step S4, the board transportation control device 40 determines whether the printed wiring board 2 is placed on the conveyer 53 at the proper position according to the detection result from the holding position sensor 38. In a case where an abnormality is determined in this instance, the board transportation control device 40 stops the entire apparatus by activating an alarm notifying a transportation abnormality in Step S5.

Upon determining that the printed wiring board 2 is properly placed on the conveyer 53, the board transportation control device 40 proceeds to Step S6 and determines whether the printed wiring board 2 is positioned in a region to which the tab members 71 are to be moved according to the detection results from the reflective sensors 117 on the side of the tab members 71. In a case where the printed wiring board 2 is not positioned in such a region, the board transportation control device 40 proceeds to Step S7. In a case where the printed wiring board 2 is positioned in such a region, the board transportation control device 40 determines whether an operation to widen the interval between the tab members 71 and 71 has been performed a predetermined number of times in the past in Step S8.

In a case where the determination result is NO, that is, the operation to widen the interval has not been performed the predetermined number of times, the board transportation control device 40 activates the transportation drive device 81 and the interval changing drive device 92 and thereby widens the interval between the tab members 71 and 71 by a predetermined length. In this embodiment, the interval is widened by several mm in this instance. After the interval between the tab members 71 and 71 is widened in this manner, the board transportation control device 40 returns to Step S6 and detects again a condition below the tab members 71 using the reflective sensors 117.

In a case where the operation to widen the interval has been performed the predetermined number of times, the board transportation control device 40 proceeds to Step S10 from Step S8 and proceeds to Step S7 by determining that there is no printed wiring board 2 to be transported.

In Step S7, the board transportation control device 40 causes the piston rods 113*a* of the cylinders 113 provided to the first and second transfer members 61 and 62 to advance, so that a pair of the tab members 71 in these transfer members 61 and 62 oscillates to the transportation positions.

In this instance, as are shown in FIG. 16 and FIG. 17, these tab members 71 oscillate to be in a state where they extend downward from a state where they extend in almost horizontally. To be more specific, the tab member 71 in the first transfer member 61 is located upstream of the printed wiring board 2 in the transportation direction and oscillates from the evacuation position at which it points upstream in the transportation direction to the transportation position at which it points downward. Meanwhile, the tab member 71 in the second transfer member 62 is located downstream of the printed wiring board 2 in the transportation direction and oscillates from the evacuation position at which it points downstream in the transportation direction to the transportation position where it points downward. Owing to the oscillations of the two tab members 71 in this manner, the tab members 71 are located at positions at which they pinch the printed wiring board 2 from the both sides in the transportation direction.

These tab members 71 come in close proximity to the printed wiring board 2 from upstream and downstream in the transportation direction as has been described. Accordingly, in the board transfer device 14, should the reflective sensors 117 fail to detect that the printed wiring board 2 is slightly displaced in the transportation direction from the predetermined position for some reason, the printed wiring board 2 is pushed by the tab members 71 as they oscillate and is thus moved to be consequently located at the predetermined position between the both tab members 71 and 71.

After the tab members 71 and 71 are moved to the transportation positions, in Step S11, the board transportation control device 40 brings the tab members 71 and 71 in close proximity to the printed wiring board 2 by the second change quantity. In this instance, the tab member 71 (the rear tab member) in the first transfer member 61 located upstream of the printed wiring board 2 in the transportation direction is driven by the transportation drive device 81 and moves together with the respective tab members 71 in the third, fifth, seventh, and ninth transfer members 61, 65, 67, and 69. The tab member 71 (the front tab member) in the other second transfer member 62 is driven by the interval changing drive device 92 and moves with respect to the tab member 71 in the first transfer member 61.

Subsequently, in Step S12, the board transportation control device 40 determines whether the piston rods 113a in the cylinders 113 have moved to the end portions on the advanced side according to the detection results from the position sensors 118 provided to the cylinders 113 in the respective transfer members 61 and 62. In a case where the piston rods 113a have not moved to the end portions on the advanced side, the board transportation control device 40 gives off an alarm notifying that the positions of the tab members 71 are abnormal and stops the entire apparatus in Step S13.

Upon determining a normality in Step S12, the board transportation control device 40 activates the transportation drive device 81 in Step S14, and drives the first and second transfer members 61 and 62 by the motor 83 and moves them together with the third through tenth transfer members 63 through 70 downstream in the transportation direction by the predetermined transportation stroke.

As is shown in Step S15, the board transportation control device 40 determines whether a moving operation is overloaded using the detection results from the position sensors 118 while the transfer members 61 through 70 are moving. This determination is made by determining whether the piston rods 113 have moved from the advanced positions according to the detection results from the position sensors 118. Upon determining an overload in Step S15, the board transportation control device 40 gives off an alarm notifying a transportation abnormality and stops the entire apparatus in Step S16.

As the transfer members 61 and 62 move in this manner, the printed wiring board 2 transfers only by the transportation stroke of the first and second transfer members 61 and 62 and thereby transfers from the conveyer 53 in the carry-in device 12 onto the conveyer 34 in the first mounting unit 3. It should be noted that all the transfer members 61 through 70 move by the same transportation stroke during this transportation.

After the transfer members 61 through 70 have moved by the predetermined transportation stroke, the board transportation control device 40 stops the transportation drive device 81 in Step S17. The first through tenth transfer members 61 through 70 and the printed wiring board 2 stop as the transportation drive device 81 stops.

During this stop, the rotational speed of the motor 83 in the transportation drive device 81 is gradually decreased by the stopping member 136. As the rotational speed of the motor 83 decreases and a movement rate of the tab members 71 decreases gradually in this manner, the printed wiring board 2 being transferred moves downstream in the transportation direction by the interval L2 by inertia relatively with respect to the tab members 71 and comes into contact with the tab member 71 located downstream in the transportation direction from behind. In this instance, although the printed wiring board 2 gradually decreases the rate, it comes into contact with the tab member 71 that is moving. Hence, even in a case where electronic components have been already mounted thereon, the electronic components will not move.

Thereafter, the printed wiring board 2 stops together with the transfer members 61 and 62 while maintaining a state in contact with the tab member 71 on the downstream side in the transportation direction as descried above. In a case where a frictional force between the printed wiring board 2 and the conveyers 34 and 53 is sufficiently large and rotational resistance of the conveyers 34 and 53 equals to an inertial force of the printed wiring board 2, even when the rate of the tab member 71 is decreasing, the printed wiring board 2 stops together with the tab member 71 while maintaining the contact with the tab member 71 located upstream in the transportation direction.

After the transportation ends, as is shown in Step S18, the board transportation control device 40 confirms the absence of the printed wiring board 2 between the conveyers 34 and 53 according to the detection results from the board stop disabled position sensors 39. Further, as is shown in Step S19, it confirms that the printed wiring board 2 is stopped at the proper position using the holding position sensors 38. Upon determining failures in Steps S18 and Step S19, the board transportation control device 40 gives off an alarm notifying a transportation abnormality and stops the entire apparatus in Steps S20 and S21, respectively.

Thereafter, in Step S22, the board transportation control device 40 actives the transportation drive device 81 and the interval changing drive device 92 and widens the interval between the tab members 71 and 71 by the second change quality. The board transportation control device 40 then activates the cylinders 113 to move the tab members 71 and 71 to the evacuation positions.

After the tab members 71 and 71 have moved to the evacuation positions, in Step S23, the board transportation control device 40 activates the Y direction drive device 33 and moves the table 32 from the transportation position to the mounting position. In this instance, the printed wiring board 2 is fixed by the clamp mechanism 35 so as not to move with respect to the table 32. Alternatively, the printed wiring board 2 may be fixed after the table 32 has moved to the mounting position. Also, when the table 32 is moved to the mounting position, the board transportation control device 40 activates the transportation drive device 81 and returns the first through tenth transfer members 61 through 70 to the initial positions which are positions before the transportation.

After the table 32 has moved to the mounting position, the electronic transfer device 27 mounts electronic components from the tape feeders 25 onto the printed wiring board 2. After the mounting of the electronic components completes, the board transportation control device 40 returns to Step S1 in the flowchart shown in FIG. 21 and confirms the absence of a printed wiring board 2 between the conveyers, after which it activates the Y direction drive device 33 and moves the table 32 from the mounting position to the transportation position.

In this manner, the printed wiring board 2 having moved to the transportation position is transported onto the conveyer 34 in the second mounting unit 4 by the board transfer device 14 after the transportation preparing operation by the board transportation control device 40 made up of Steps S4 through S13 describe above ends. A following printed wiring board 2 is transported from the carry-in device 12 to the first mounting unit 3 simultaneously with this transportation.

In the second through fourth mounting units 4 through 6, too, a mounting operation same as the mounting operation by the first mounting unit 3 as described above is performed. In short, while the conveyers 34 in the respective mounting units 3 through 6 are located in the transportation path 51, the board transfer device 14 transports five printed wiring boards 2 at a time.

In the surface mounting apparatus 1 of this embodiment, in a case where a printed wiring board 2 subject to mounting is replaced with the one having a different length in the transportation direction, predetermined mounting is performed on the printed wiring boards 2 in the first through fourth mounting units 3 through 6 first, and thence all the printed wiring boards 2 are successively transported to the carry-out device 13 and further carried out to an apparatus in a post-process. In this case, a printed wiring board 2 having a different length in the transportation direction will not be supplied to the first mounting unit 3 from the carry-in device 12 until all the printed wiring boards 2 are carried out from the first through fourth mounting units 3 through 6. Accordingly, either the front and rear tab members 71 and 71 in the first transportation unit 121 are maintained at the evacuation positions or the table 52 in the carry-in device 12 on which is placed the printed wiring board 2 having a different length is maintained at the carry-in position.

After all the printed wiring boards 2 are discharged from the first through fourth mounting units 3 through 6, the second drive member 91 is moved by the interval changing drive device 92 with respect to the first drive member 77 in response to the length of the printed wiring board 2. Owing to the movement of the second drive member 91, the second, fourth, sixth, eighth, and tenth transfer members 62, 64, 66, 68, and 70 move with respect to the first, third, fifth, seventh, and ninth transfer members 61, 63, 65, 67, and 69 in the same direction as the second drive member 91. Accordingly, the interval between the front tab member 71 and the rear tab member 71 in each of the transportation units 121 through 125 changes in response to the printed wiring board 2.

In order to mount electronic components on the printed wiring board 2, it is possible to adopt a method by which all the electronic components are mounted on a single printed wiring board 2 by the first through fourth mounting units 3 through 6 each mounting allocated electronic components and a method by which all the electronic components are mounted onto a single printed wiring board 2 by a single mounting unit.

When the mounting by the fourth mounting unit 6 completes, the printed wiring board 2 is transported by the board transfer device 14 and transferred onto the conveyer 53 in the carry-out device 13 and sent to the predetermined position in the X direction within the carry-out device 13 as the conveyer 53 is driven. Thereafter, the conveyer 53 in the carry-out device 13 is driven by the Y direction drive device 54 and moves to the carry-out position. The printed wiring board 2 is then sent to an apparatus that performs a post-process from the conveyer 53.

The printed wiring board 2 can be transported to the carry-out device 13 as is shown in FIG. 23 or FIG. 24. An example of operations shown in FIG. 23 is a case where mounting of the electronic components has completed in all the mounting units 3 through 6 almost at the same time. An example of operations shown in FIG. 24 is a case where the mounting has completed earlier in the third mounting unit and the fourth mounting unit 6 than in the first and second mounting units 3 and 4. In these drawings, reference numeral 2A denotes printed wiring boards with which mounting of electronic components in the respective mounting units has completed and reference numeral 2B denotes printed wiring boards on which electronic components are being mounted. Numeral reference 2C denotes a printed wiring board to be sent from the carry-in device 12 to the first mounting unit 3.

Figure 23A:
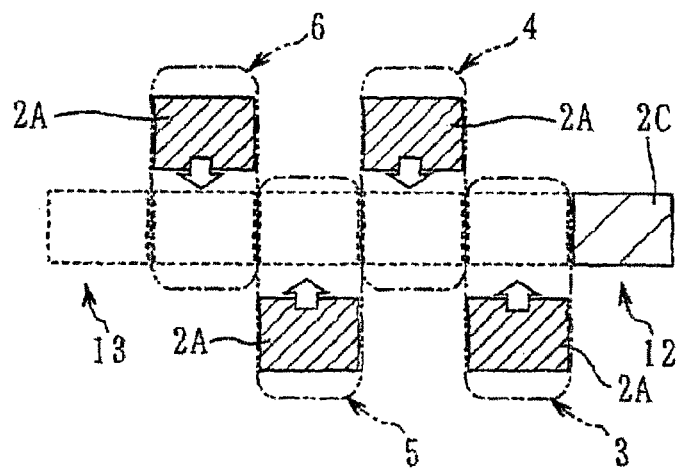
FIG. 23 is a diagram showing the configuration in an example of operations to transport four printed wiring boards at a time.
Figure 23B:
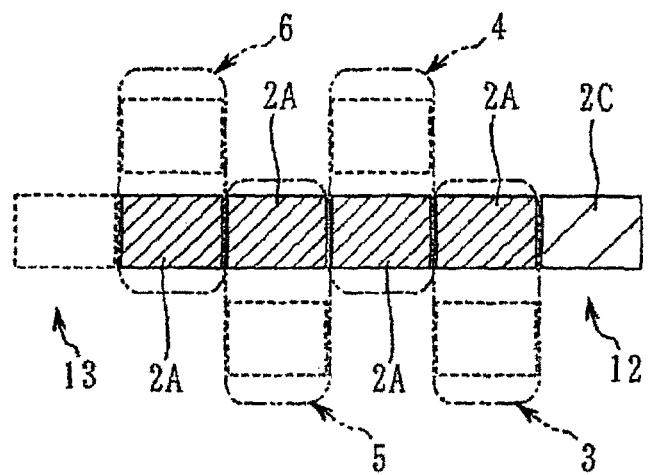
Figure 23C:
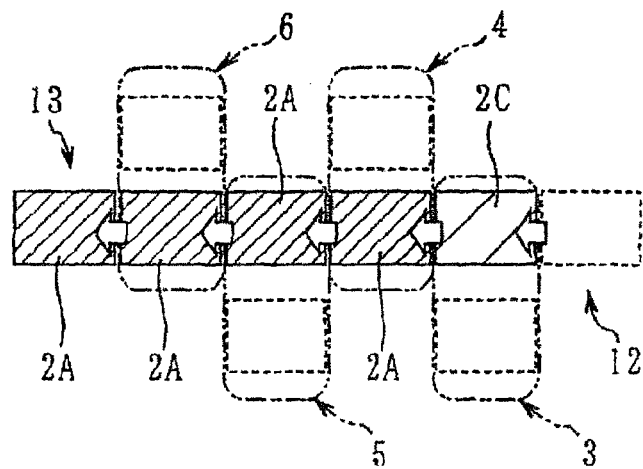

In a case where mounting has completed in all the mounting units 3 through 6 almost at the same time (FIG. 23A), as is shown in FIG. 23B, the tables 32 move from the mounting positions to the transportation positions in the respective mounting units 3 through 6. Thereafter, as is shown in FIG. 23C, the printed wiring boards 2A in the respective mounting units 3 through 6 and the printed wiring board 2C in the carry-in device 12 are moved downstream in the transportation direction by one pitch by the board transfer device 14. In this case, five printed wiring boards 2A and 2C are transported at a time.

Figure 24A:
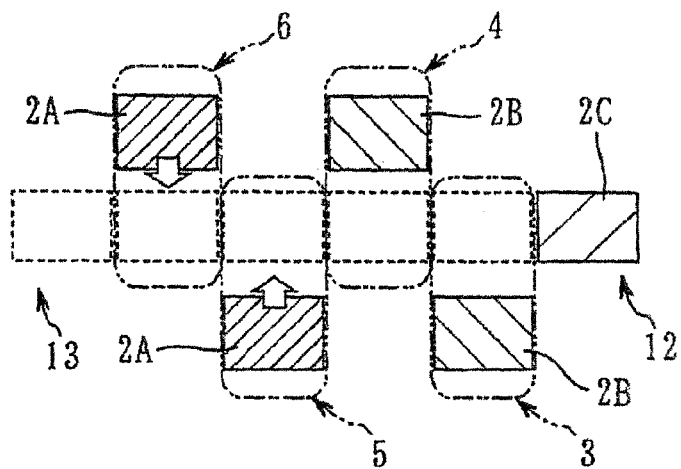
FIG. 24 is a diagram showing the configuration in an example of operations to transport two printed wiring boards at a time.
Figure 24B:
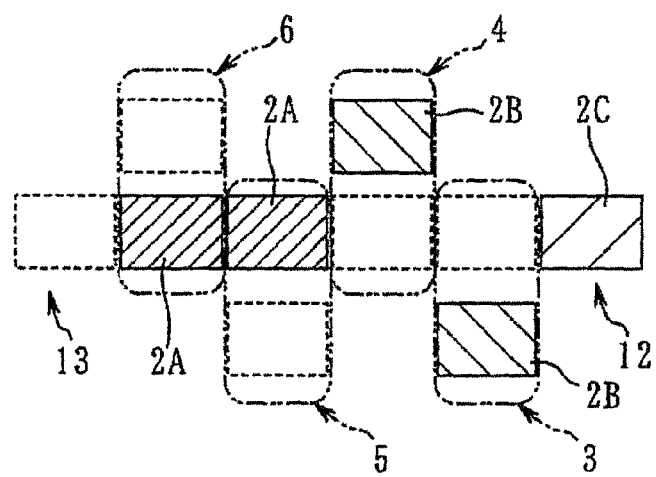
Figure 24C:
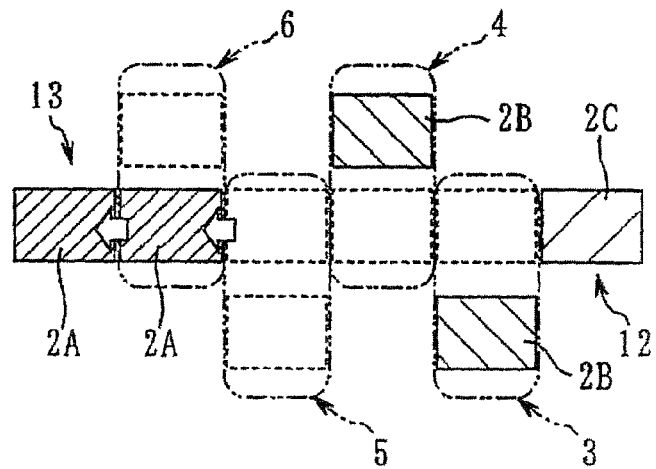

Meanwhile, in a case where mounting has completed earlier in the third mounting unit 5 and the fourth mounting unit 6 than in the first and second mounting units 3 and 4 (FIG. 24A), as is shown in FIG. 24B, tables 32 move from the mounting positions to the transportation positions while the electronic components are being mounted in the first and second mounting units 3 and 4. Thereafter, as is shown in FIG. 24C, the printed wiring boards 2A and 2A in the third mounting unit 5 and the fourth mounting unit 6 are transported by one pitch by the seventh through tenth transfer members 67 through 70 in the board transfer device 14. In this instance, all the tab members 71 in the first through sixth transfer members 61 through 66 are held at the evacuation positions.

The printed wiring board 2A transported from the fourth mounting unit 6 to the carry-out device 13 is sent to an apparatus for a post-process. Regarding the printed wiring board 2A transported from the third mounting unit 5 to the fourth mounting unit 6, either a rest of electronic components are mounted thereon by the fourth mounting unit 6 or it is transported to the carry-out device 13 after the printed wiring board 2A that has been sent to the carry-out device 13 earlier is carried out. Even in a case where mounting has completed earlier in the fourth mounting unit 6 than in the other three mounting units 3 through 5, or in a case where mounting has completed earlier in the second through fourth mounting units 4 through 6 than in the first mounting unit 3, the printed wiring boards 2A are transported in the same manner as above without having to wait for the mounting to be completed in any other mounting unit that is performing the mounting operation.

In the surface mounting apparatus 1 configured as above, the conveyers 34 are not equipped with drive devices to drive the endless belts 37, because a printed wiring board 2 is transported using two tab members 71 and 71 located upstream and downstream of the printed wiring board 2 in the transportation direction. Hence, according to the surface mounting apparatus 1, it is possible to move the tables 32 that support the corresponding conveyers 34 in the Y direction faster than the conventional surface mounting apparatus.

Also, according to the surface mounting apparatus 1, it is possible to prevent a printed wiring board 2 from continuing to move downstream in the transportation direction exceedingly by inertia when the printed wiring board 2 is transported and then stopped by the board transfer device 14 using the front tab member 71. Hence, according to the surface mounting apparatus 1, it is possible to transport the printed wiring board 2 at a higher rate than a conventional surface mounting apparatus.

Also, even in a case where a part of electronic components have been already mounted on a printed wiring board by a surface mounting apparatus that performs a preceding process, by gradually decreasing a rate when the printed wiring board 2 is transported and then stopped by the board transfer device 14, it is possible to prevent the electronic components from moving by inertia when the printed wiring board 2 is stopped. Hence, according to the surface mounting apparatus 1, it is possible to increase a transportation rate of printed wiring boards.

Also, the surface mounting apparatus 1 of this embodiment adopts the configuration not only to set the mounting positions (mounting regions) of the table 32 on the both sides of the transportation path 51 for printed wiring boards 2 but also to include a plurality of mounting units 3 through 6 aligned in the X direction. Electronic components can be therefore mounted on four printed wiring boards 2 at a time, which makes it possible to achieve higher mounting efficiency.

Hence, according to this embodiment, it is possible to fabricate a surface mounting apparatus 1 that adopts the configuration to set the mounting regions on the both sides of the transpiration path 51 for printed wiring boards 2 and yet achieves a higher movement rate for the printed wiring board 2 and hence higher productivity.

In the surface mounting apparatus 1 of this embodiment, the interval between the front tab member 71 and the rear tab member 71 can be readily changed by driving the interval changing drive device 92. Hence, according to the surface mounting apparatus 1, it is possible to shorten a time to stop the board transfer device 14 when a printed wiring board 2 having a different length in the transportation direction is to be transported to the extent possible. Consequently, according to this embodiment, it is possible to shorten a time needed for so-called a size arrangement and hence to fabricate a surface mounting apparatus 1 achieving further higher productivity.

Also, in a case where a printed wiring board is present at the positions to which the front tab member 71 and the rear tab member 71 are to be lowered when these tab members 71 are moved to the transportation positions, because these tab members 71 move in a direction to be spaced apart from the printed wiring board 2, it is possible to forestall these tab members 71 from coming into contact on the printed wiring board 2.

Hence, not only is it possible to transport a printed wiring board 2 on which electronic components have been already mounted while preventing the electronic components from moving on the printed wiring board 2, but it is also possible to mount a rest of the electronic components on this printed wiring board 2.

Also, in this embodiment, the reflective sensors 117 to detect a condition below the tab members 71 are provided to the first through tenth transfer members 61 through 70 that move together with the tab members 71. Accordingly, even in a case where a printed wiring board 2 is present at the positions to which the front tab member 71 and the rear tab member 71 are to be lowered, it is possible to detect this printed wiring board 2 directly using the reflective sensors 117. Hence, according to this embodiment, in comparison with a case where the positions of the both tab members 71 and 71 and the position of a printed wiring board 2 are found indirectly from the number of rotations of the drive motors 83 and 94, it is possible to determine whether the tab members 71 will abut on the printed wiring board 2 with higher reliability.

Also, in the surface mounting apparatus 1 of this embodiment, it is possible to transport a printed wiring board 2 by moving the tab members 71 in the transportation direction while keeping the tab members 71 located at the transportation positions. In addition, by moving the tab members 71 in the transportation direction after they have been moved to the evacuation positions, the tab members 71 are allowed to pass above the printed wiring board 2.

Hence, of all the first through fourth mounting units 3 through 6, in a case where the mounting of electronic components on a printed wiring board 2 has completed earlier, for example, in the fourth mounting unit 6 located at the most downstream end in the transportation direction than the other mounting units, it is possible to move the printed wiring board 2 in the mounting unit located at the most downstream end from the mounting position to the transportation position, so that it is transported downstream by the board transfer device 14. In other words, according to the surface mounting apparatus 1, a printed wiring board can be transported downstream in the mounting unit located downstream in the transportation direction without having to wait for the mounting of electronic components to be completed in the mounting units located upstream in the transportation direction. The productivity can be thus enhanced further.

Also, in the surface mounting apparatus 1 of this embodiment, the first through fourth mounting units 3 through 6 are provided on the base stand 11 to be positioned in a staggered fashion when viewed in a plane, and a part of an adjacent mounting unit is provided in a space defined in each of the mounting units 3 through 6 on the opposite side with the transportation path 51 in between. Hence, according to this embodiment, it is possible to provide the four mounting devices 3 through 6 compactly in the X direction.

Hence, according to this embodiment, it is possible to fabricate a compact surface mounting apparatus 1 that achieves high productivity.

Also, according to the surface mounting apparatus 1 configured as above, because all the Y frames 16 through 21 are interconnected via the center frame 23, it is possible to reinforce these Y frames 16 through 21 by the center frame 23, which can enhance rigidity of the Y frames 16 through 21. In particular, the Y frames 17 through 20 having one end portions shaped like cantilever beams can have sufficient rigidity because these one end portions are held by the center frame 23.

Consequently, when the head unit 45 in the electronic component transfer device 27 is operated at a high speed, the entire electronic component transfer device 27 including the Y frames 16 through 21 will not vibrate.

It thus becomes possible to maintain the attracting heads 48 stationary so as not to move either in the X direction or the Y direction when electronic components are mounted on a printed wiring board 2 by the electronic component transfer device 27. The electronic components can be therefore mounted at a higher degree of accuracy.

Further, because the board transfer device 14 is supported on the center frame 23, it is possible to support the board transfer device 14 firmly using the center frame 23, which is a reinforcing member.

Second Embodiment

Figure 25A:
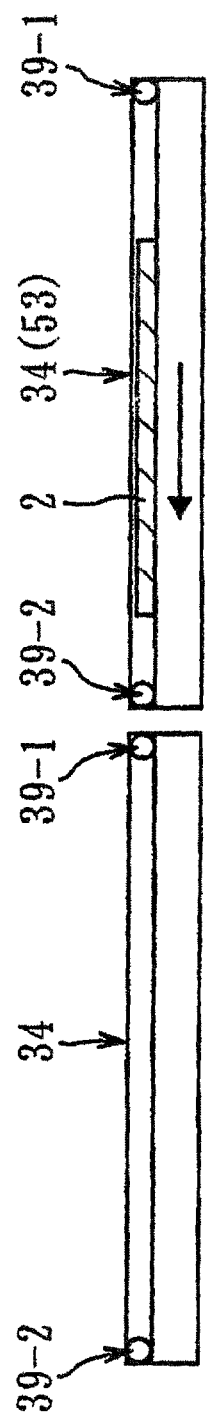
FIG. 25 is a side diagram showing a second embodiment configured to detect the position of a printed wiring board using sensors provided to conveyers.
Figure 25B:
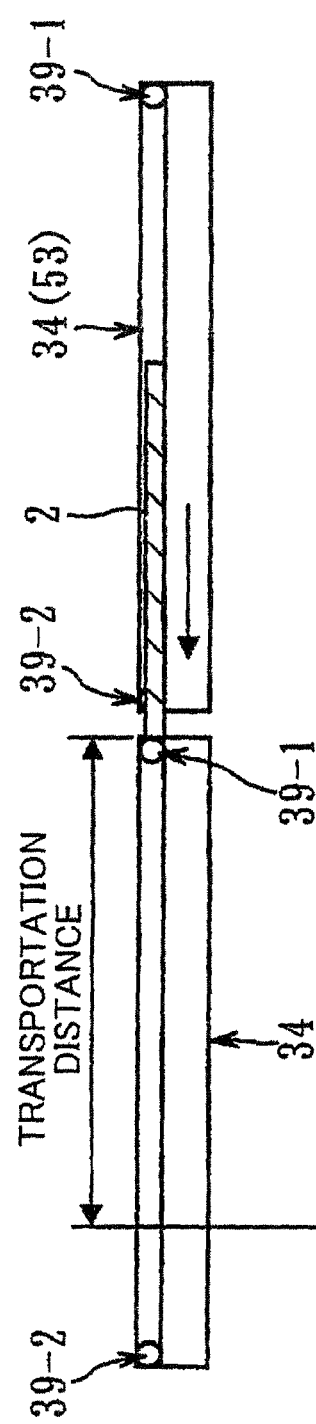
Figure 25C:
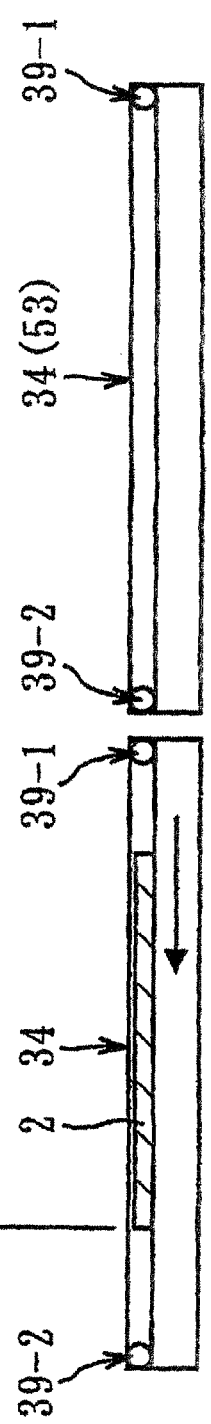
Figure 26:
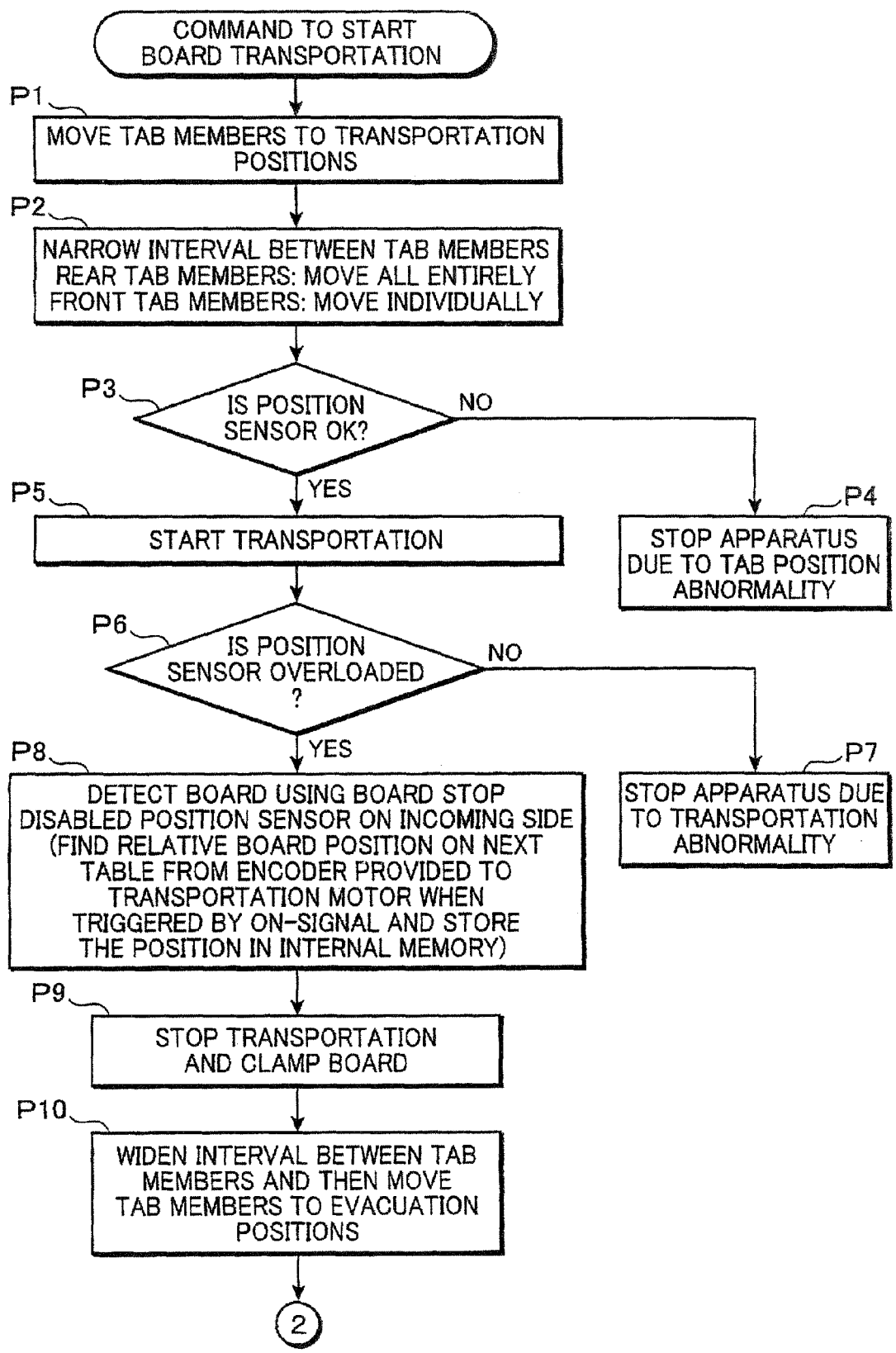
FIG. 26 is a flowchart used to describe operations of a board transportation control device according to the second embodiment.
Figure 27:
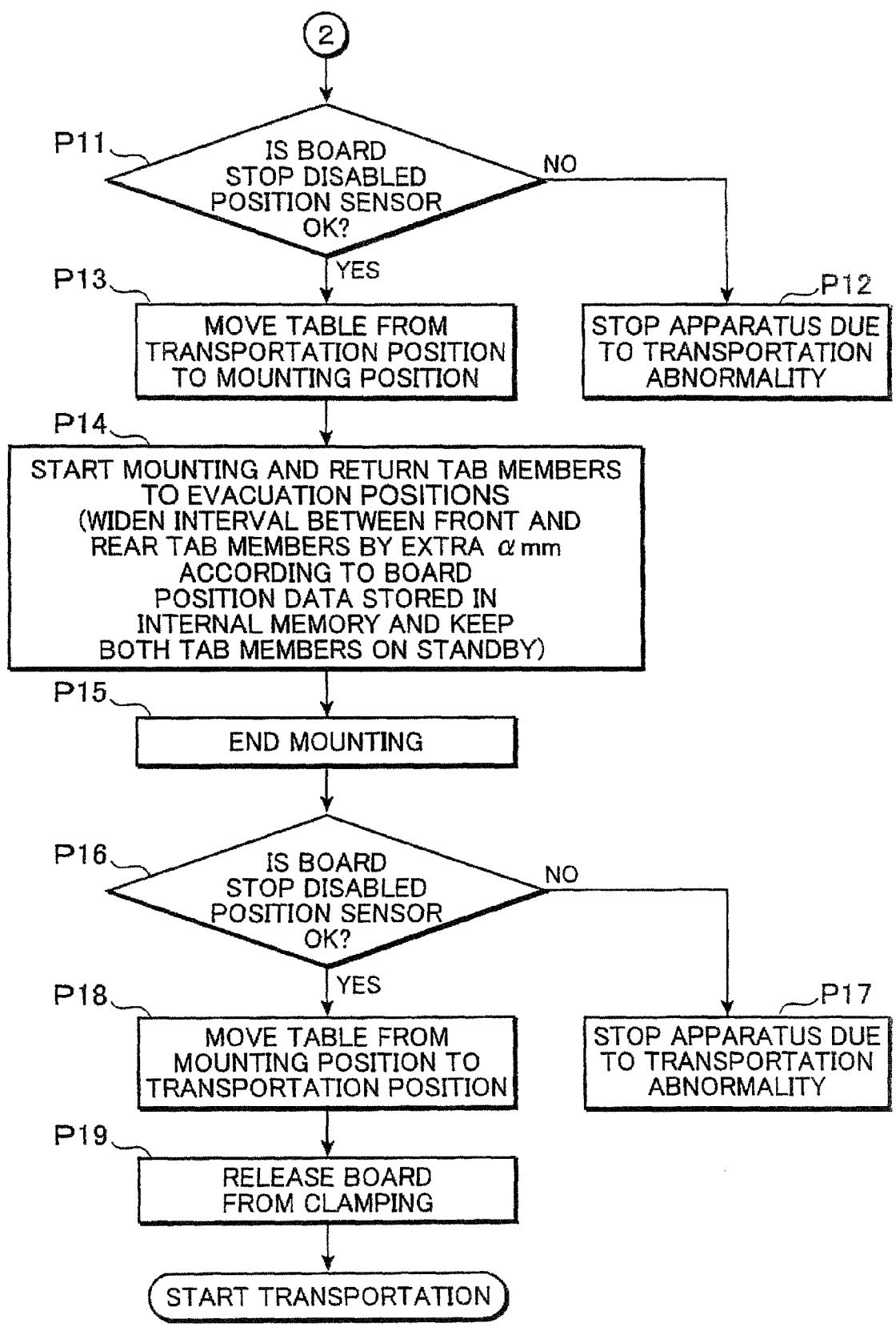
FIG. 27 is another flowchart used to describe operations of the board transportation control device according to the second embodiment.

It is possible to determine whether a printed wiring board 2 is located at the positions to which the tab members 71 are to be lowered in a manner as are shown in FIG. 25 through FIG. 27.

FIG. 25 is a side view showing another embodiment to detect the position of a printed wiring board using sensors provided to the conveyers. FIG. 26 and FIG. 27 are flowcharts used to describe operations of a board transportation control device. In these drawings, members same or equivalent to those described with reference to FIG. 1 through FIG. 24 are labeled with same reference numerals and detailed descriptions of such components are omitted where appropriate.

In this embodiment, as are shown in FIG. 25A through FIG. 25C, the position of a printed wiring board 2 is detected using the board stop disabled position sensors 39 provided to the conveyers 34 and 53 instead of the reflective sensors 117. Referring to FIG. 25, the board stop disabled position sensors provided in the end portions of the conveyers 34 and 53 on the upstream side in the transportation direction are indicated by reference numeral 39-1, and the board stop disabled position sensors provided in the end portions on the downstream side in the transportation direction are indicated by reference numerals 39-2. The board transportation control device 40 used to adopt this embodiment is provided with a memory (not shown) to store the position of a printed wiring board 2 after transportation.

In this embodiment, in order to determine whether a printed wiring board 2 is located at the positions to which the tab members 71 are to be lowered, as is shown in FIG. 25B, a transportation distance between the board stop disabled position sensor 39-1 and the position of the front end of the printed wiring board 2 that is stopped after transportation is found first. The transportation distance is found through computation using an encoder (not shown) provided to the motor 83 in the transportation drive device 81.

The board transportation control device 40 of this embodiment stores a position spaced apart by the transportation distance on the downstream side in the transportation direction from the board stop disabled position sensor 39-1 into the memory as the position of the edge (front edge) of the printed wiring board 2 on the downstream side in the transportation direction. Also, the board transportation control device 40 stores a position spaced apart by the length of the printed wiring board 2 on the upstream side in the transportation direction from the position of the front edge in the memory as the position of the edge (rear edge) of the printed wiring board 2 on the upstream side in the transportation direction. A value pre-stored in the board transportation control device 40 is used as the length of the printed wiring board 2.

Operations of the board transportation control device 40 when this embodiment is adopted will be described using the flowcharts shown in FIG. 26 and FIG. 27.

When the conditions to transport a printed wiring board 2 are satisfied, as is shown in Step P1 in the flowchart shown in FIG. 26, the board transportation control device 40 moves the tab members 71 to the transportation positions, and it brings the tab members 71 and 71 into close proximity to the printed wiring board 2 by the second change quantity described above in Step P2.

Subsequently, in Step P3, the board transportation control device 40 determines whether the piston rods 113a in the cylinder 113 have moved to the end portions on the advanced side according to the detection results from the position sensors 118. In a case where the piston rods 113a have not moved to the end portions on the advanced side, the board transportation control device 40 gives off an alarm notifying that the positions of the tab members 71 are abnormal and stops the entire apparatus in Step P4.

Upon determining in Step P3 that the piston rods 113a have moved to the end portions on the advanced side and the positions of the tab members 71 are normal, the board transportation control device 40 activates the transportation control device 81, so that the respective transfer members 61 through 70 are driven to move downstream in the transportation direction by the predetermined transportation stroke by the motor 83 in Step P5.

The board transportation control device 40 determines whether the moving operation is overloaded using the detection results from the position sensors 118 in Step P6 while the transfer members 61 through 70 are moving. Upon determining an overload in Step P6, the board transportation control device 40 gives off an alarm notifying a transportation abnormality and stops the entire apparatus in Step P7.

The printed wiring board 2 then transfers onto the conveyer 34 located downstream from the conveyer 34 or 53 located upstream in the transportation direction through the driving operation of the transportation drive device 81. When the printed wiring board 2 transfers onto the conveyer 34 or 53 located downstream, the printed wiring board 2 is detected by the board stop disabled position sensor 39-1 on the upstream side in the transportation direction in the conveyer 34 located downstream (Step P8).

The board transportation control device 40 starts to read the value of the encoder provided to the motor 83 in the transportation drive device 81 since a point in time when a signal indicating the detection of a printed wiring board is sent by the board stop disabled position sensor 39-1. The board transportation control device 40 keeps reading the value of the encoder and stores the read value in the memory until the printed wiring board 2 stops.

After the transfer members 61 through 70 are moved only by the predetermined transportation stroke, the board transportation control device 40 stops the transportation drive device 81 in Step P9 and fixes the stopped printed wiring board 2 with respect to the corresponding table 32 using the clamp mechanism 35. After the printed wiring board 2 stops, the board transportation control device 40 finds the transportation distance (see FIG. 23) through computation since the printed wiring board 2 is detected by the board stop disabled position sensor 39-1 until it stops according to the values of the encoder, and finds the position of the front end and the position of the rear end of the printed wiring board at the stopped position through computation.

Thereafter, in Step P10, the board transportation control device 40 widens the interval between the tab members 71 and 71 by the second change quantity by activating the transportation drive device 81 and the interval changing drive device 92, after which it activates the cylinders 113 to move the tab members 71 and 71 to the evacuation positions. Subsequently, in Step P11, the board transportation control device 40 confirms the absence of a printed wiring board 2 between the conveyers 34 and 53 according to the detection results from the board stop disabled position sensors 39-1 and 39-2. In a case where the detection result indicates a failure, the board transportation control device 40 gives off an alarm notifying a transportation abnormality and stops the entire apparatus in Step P12.

In a case where the detection results from the board stop disabled position sensors 39-1 and 39-2 are satisfactory, the board transportation control device 40 moves the table 32 from the transportation position to the mounting position by activating the Y direction drive device 33 in Step P13. After the table 32 has moved to the mounting position, electronic components are mounted on the printed wiring board 2 from the tape feeders 25 by the electronic component transfer device 27 (Step P14).

The board transportation control device 40 returns the first through tenth tab members 61 through 70 to the positions before transportation by activating the transportation drive device 81 while the electronic components are being mounted. In this instance, the board transportation control device 40 reads out the position of the printed wiring board 2 found after the printed wiring board 2 was stopped in Step P9 from the memory and moves the tab members 71 to the positions spaced apart by a predetermined dimension (a dimension comparable to the second change quantity) to be located upstream and downstream of the printed wiring board 2 in the transportation direction.

After the mounting of electronic components on the printed wiring board 2 has completed, the board transportation control device 40 confirms the absence of the printed wiring board 2 between the conveyers 34 and 53 according to the detection results from the board stop disabled position sensors 39-1 and 39-2. In a case where the detection results indicate a failure, the board transportation control device 40 gives off an alarm notifying a transportation abnormality and stops the entire apparatus in Step P17.

In a case where the detection results from the board stop disabled position sensors 39-1 and 39-2 are satisfactory, the board transportation control device 40 moves the table 32 from the mounting position to the transportation position in Step P18 and subsequently it releases the printed wiring board 2 from the fixing by the clamp mechanism 35 in Step P19.

Hence, according to this embodiment, the position at which the printed wiring board 2 stops is found using the board stop disabled position sensor 39-1 and the encoder provided to the motor 83, and the tab members 71 are located to the positions spaced apart from the printed wiring board 2. It is therefore possible to prevent the tab members 71 from abutting on the printed wiring board 2 in a reliable manner. The example of the operations above described a case where the printed wiring board 2 is transported from the carry-in device 12 to the first mounting unit 3 and a case where the printed wiring board 2 is transported from one mounting unit to another. It should be appreciated, however, that the position of a printed wiring board 2 can be also specified by the same operations in a case where the printed wiring board 2 is transported into the carry-in device 12 from a surface mounting apparatus that performs a preceding process.

In this embodiment, the board stop disabled position sensors 39 provided to the conveyers 34 and 53 are used. Hence, in comparison with a case where the reflective sensors 117 provided to the first through tenth transfer members 61 through 70 are used, a weight can be lessened, which makes it possible to reduce a load while the transportation drive device 81 and the interval changing drive device 92 are operating.

Third Embodiment

Figure 28:
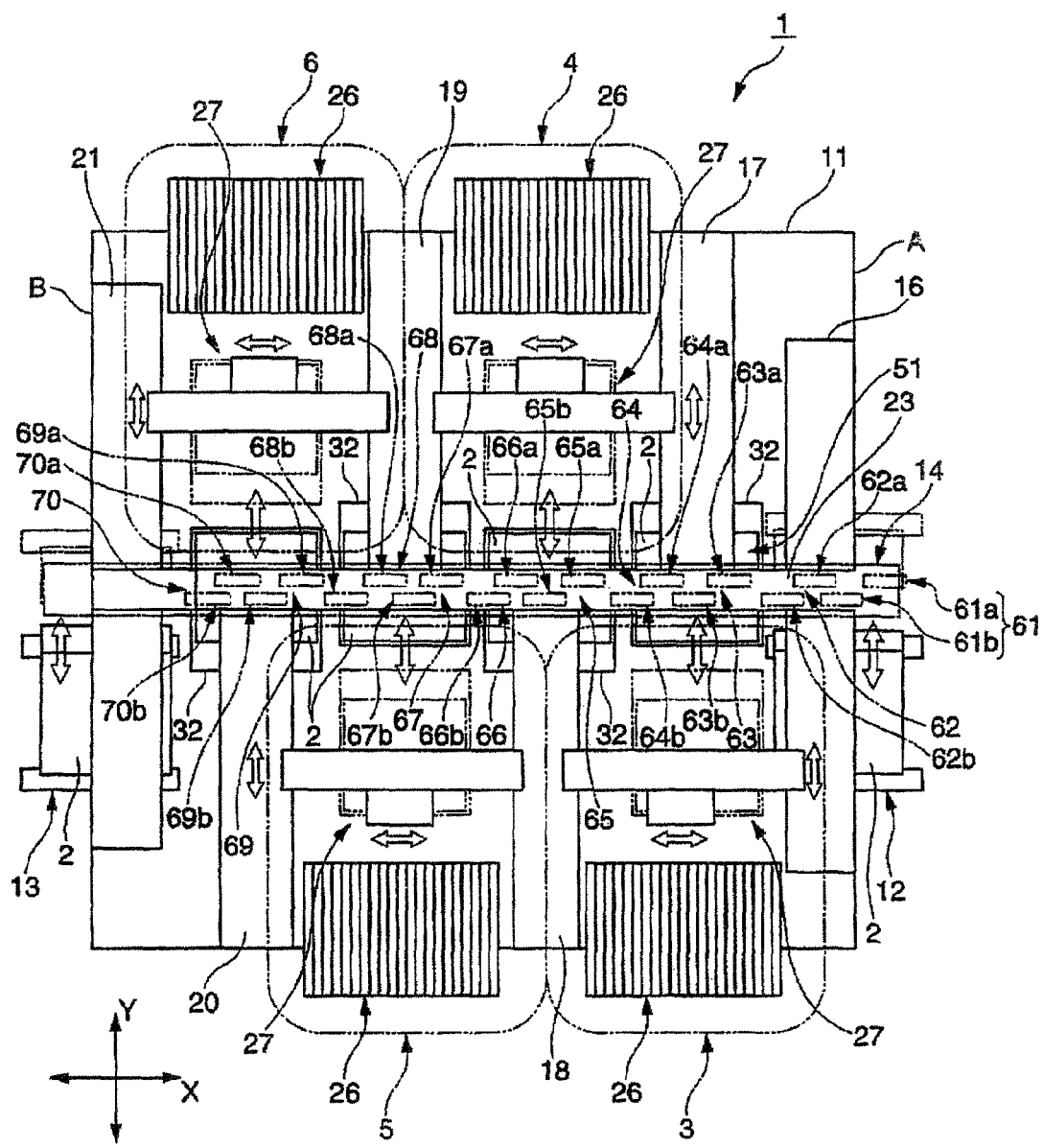
FIG. 28 is a plan view schematically showing a configuration of a surface mounting apparatus according to a third embodiment.

FIG. 28 and FIG. 29 show a third embodiment.

Figure 29A:
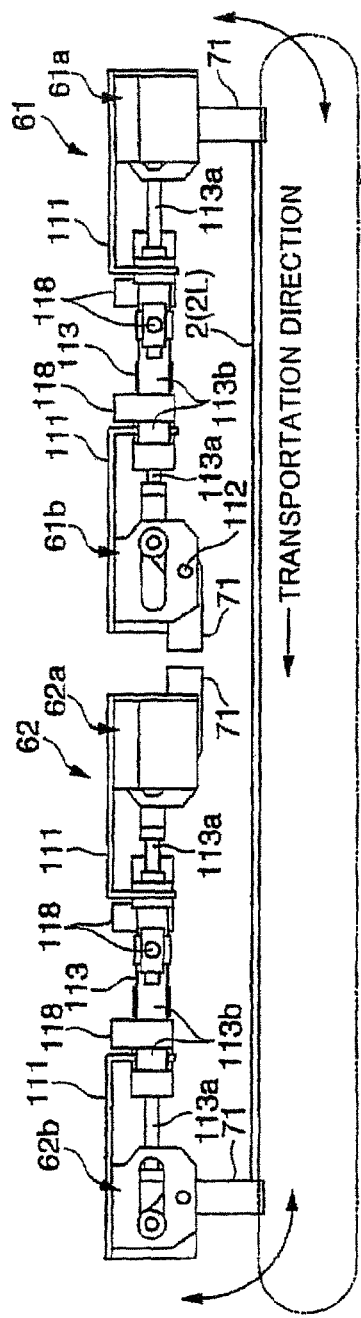
FIG. 29 is a side view showing the relation of the positions of the tab members and a transportation pattern in the third embodiment.
Figure 29B:
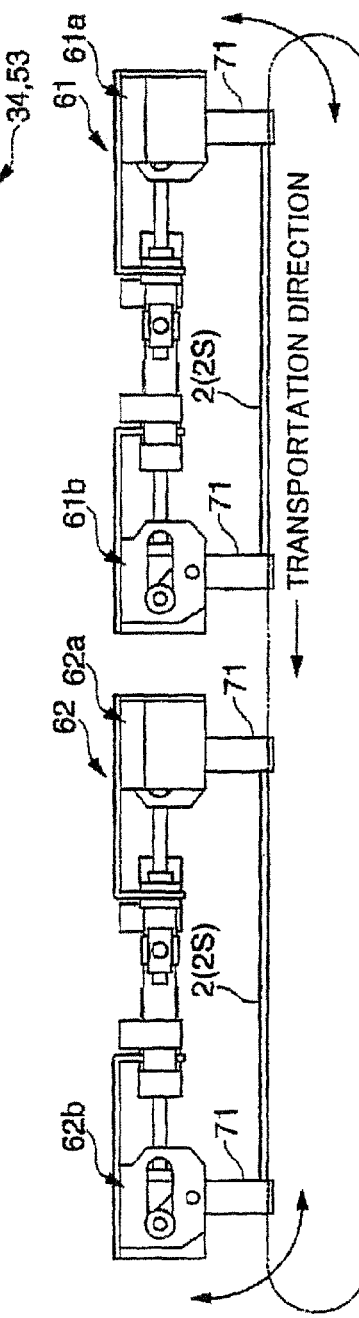
Figure 29C:
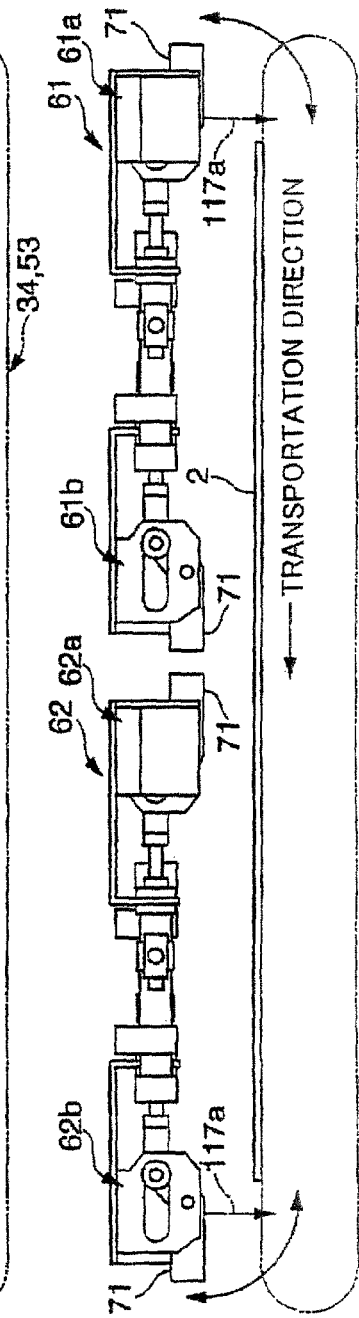

FIG. 28 is a plan view schematically showing the configuration of a surface mounting apparatus according to the third embodiment. FIG. 29 is a side view showing a relation of the positions of the tab members and a transportation pattern. FIG. 29A shows a state where the transfer members return to the initial positions after transportation. FIG. 29B shows a state where a small printed wiring board is transported. FIG. 29C shows a state where a large printed wiring board is transported.

In this embodiment, the board transfer device 14 includes the first through tenth transportation units 61 through 70 located below the center frame 23, and a printed wiring board 2 is transported in the X direction using the tab members 71 provided to the respective transportation units 61 through 70. The respective transportation units 61 through 70 include rear transfer members 61a through 70a located upstream in the transportation direction of the printed wiring board 2 and front transfer members 61b through 70b located downstream in the transportation direction, respectively. In this embodiment, the tab members 71 form members referred to as abutting members in the invention.

The board transfer device 14 of this embodiment can adopt a pattern in which five printed wiring boards 2 are transported at a time using the first through tenth transportation units 61 through 70 or a pattern in which two printed wiring boards 2 are transported by a single transportation unit, that is, a total of ten printed wiring boards 2 are transported at a time by the first through tenth transportation units 61 through 70.

To be more specific, of the first through tenth transportation units 61 through 70, the first transportation unit 61 and the second transportation unit 62 transport one or two printed wiring boards 2 in cooperation with each other from the carry-in device 12 to the first mounting unit 3. In a case where a single printed wiring board 2 is transported by these transportation units 61 and 62, as is shown in FIG. 29A, the tab member 71 in the rear transfer member 61a of the first transportation unit 61 and the tab member 71 in the front transfer member 62b of the second transportation unit 62 are moved to the transportation positions, and these tab members 71 and 71 are opposed to the both end faces of a large printed wiring board 2L in the transportation direction. In short, the tab members 71 are moved to positions at which they pinch a large printed wiring board 2L from the both sides in the transportation direction. In this case, the tab member 71 in the front transfer member 61b of the first transportation unit 61 and the tab member 71 in the rear transfer member 62a of the second transportation unit 62 are located at the evacuation positions.

In a case where two printed wiring boards 2 are transported by the first and second transportation units 61 and 62, as is shown in FIG. 29B, the tab members 71 in all the transfer members 61a, 61b, 62a, and 62b are moved to the transportation positions. In this instance, the tab member 71 in the rear transfer member 61a and the tab member 71 in the front transfer member 61b of the first transportation unit 61 move to the positions at which they pinch one small printed wiring board 2S from the both sides in the transportation direction. Also, the tab member 71 in the rear transfer member 62a and the tab member 71 in the front transfer member 62b of the second transportation unit 62 move to the positions at which they pinch the other small printed wiring board 2S from the both sides in the transportation direction.

As the large printed wiring board 2L, it is possible to use a printed wiring board of a size that occupies almost the entire electronic component mountable region in each of the first through fourth mounting units 3 through 6. As the small printed wiring board 2S, it is possible to use a printed wiring board of a size of about ½ of the large printed wiring board 2L or smaller in the length in the transportation direction.

As is shown in FIG. 29C, the tab members 71 are moved to the evacuation positions in a case where the first and second transportation units 61 and 62 are returned to the initial positions after the transportation of the printed wiring board 2 ends or in a case where the transportation units 61 and 62 do not transport a printed wiring board 2 but a printed wiring board 2 is transported in any other mounting unit.

As with the first and second transportation units 61 and 62 described above, the third transportation unit 63 and the fourth transportation unit 64 transport one or two printed wiring boards 2 in cooperation with each other from the first mounting unit 3 to the second mounting unit 4.

As with the first and second transportation units 61 and 62 described above, the fifth transportation unit 65 and the sixth transportation unit 66 transport one or two printed wiring boards 2 in cooperation with each other from the second mounting unit 4 to the third mounting unit 5.

As with the first and second transportation units 61 and 62 described above, the seventh transportation unit 67 and the eighth transportation unit 68 transport one or two printed wiring boards 2 in cooperation with each other from the third mounting unit 5 to the fourth mounting unit 6.

As with the first and second transportation units 61 and 62 described above, the ninth transportation unit 69 and the tenth transportation unit 70 transport one or two printed wiring boards 2 in cooperation with each other from the fourth mounting unit 6 to the carry-out device 13.

In this embodiment, in the first through tenth transportation units 61 through 70, in a case where the number of the printed wiring boards 2 to be transported by a single mounting unit is changed from one to two or two to one, the mounting operation is completed first for all the printed wiring boards 2 having been sent to the respective mounting units 3 through 6 and these printed wiring boards 2 are transported to the carry-out device 13. Subsequently, the cylinders 113 are operated in the rear transfer members 61a through 70a and the front transfer members 61b through 70b, so that the pattern (see FIG. 29A) in which a single mounting unit transports one printed wiring board and the pattern (see FIG. 29B) in which a single mounting unit transports two printed wiring boards are switched.

According to the surface mounting apparatus 1 of this embodiment, the tab members 71 in the rear transfer members 61a through 70a and the tab members 71 in the front transfer members 61b through 71b are moved to the transportation positions to be located on the both sides of the printed wiring board 2 in the transportation direction. The printed wiring board can be transported by moving the tab members 71 further in the transportation direction. In the surface mounting apparatus 1 of this embodiment, in a case where a small printed wiring board 2S having a relatively short length in the transportation direction is transported, all of the tab members 71 in the rear transfer members 61a through 70a and the tab members 71 in the front transfer members 61b through 70b are used. In this case, printed wiring boards 2 as many as the transfer members can be transported.

Meanwhile, in a case where a large printed wiring board 2L having a relatively long length in the transportation direction is transported, in the surface mounting apparatus 1, the tab member 71 in the front transfer member located at the most upstream end in the transportation direction and the tab member 71 in the rear transfer member located at the most downstream end in the transportation direction in two adjacent transportation units among the first through tenth transportation units 61 through 70 are used. In this case, one printed wiring board is transported by the two transportation units.

Accordingly, in the surface mounting apparatus 1 of this embodiment, the number of printed wiring boards 2 to be transported at a time can be changed with ease by merely shifting over the tab members 71. Hence, in comparison with a conventional surface mounting apparatus that requires a work to move the positions of the tab members, the productivity can be increased.

Fourth Embodiment

FIG. 30 through FIG. 34 show a fourth embodiment.

Figure 30:
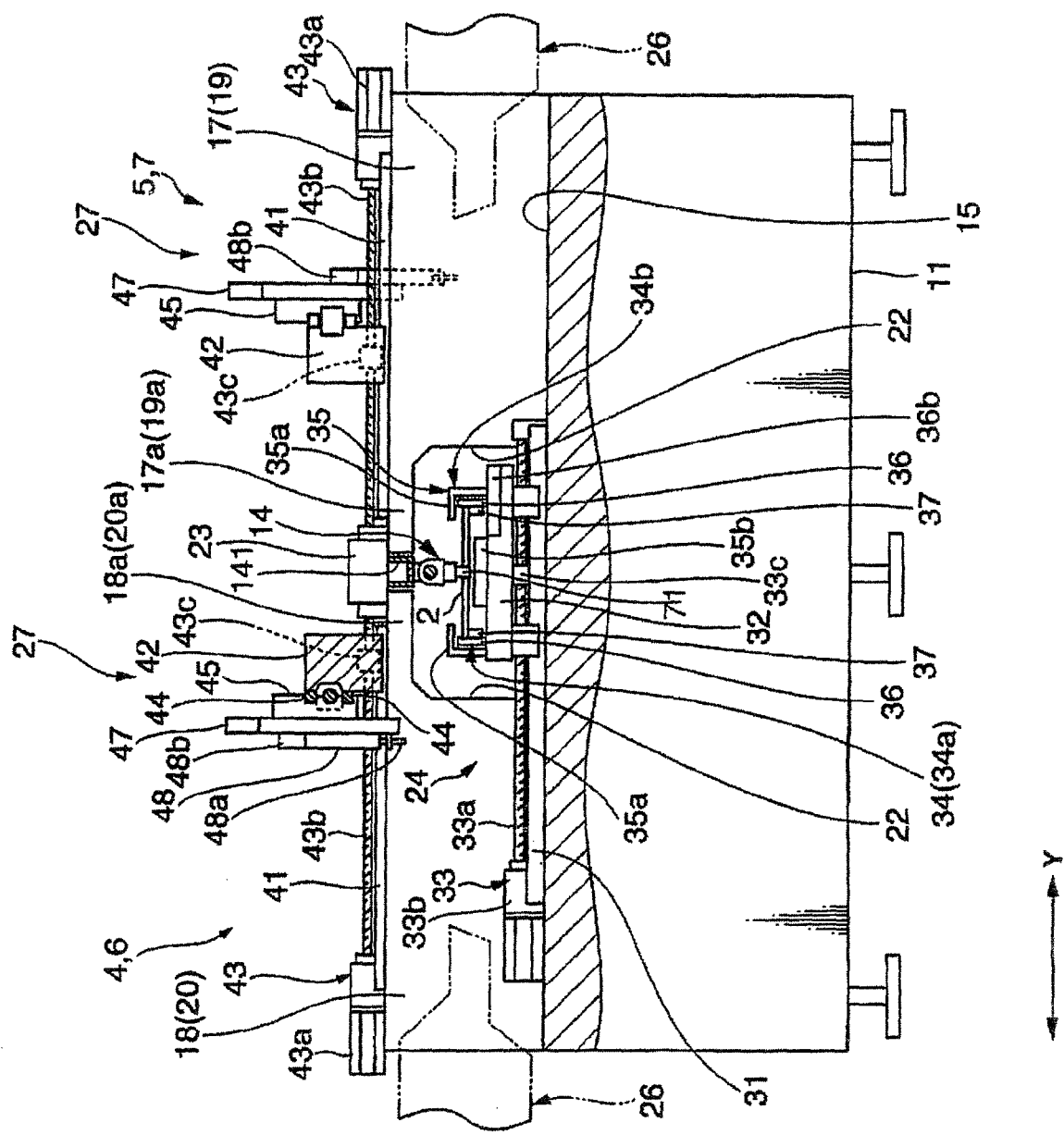
FIG. 30 is a cross sectional view of a surface mounting apparatus according to a fourth embodiment.
Figure 31:
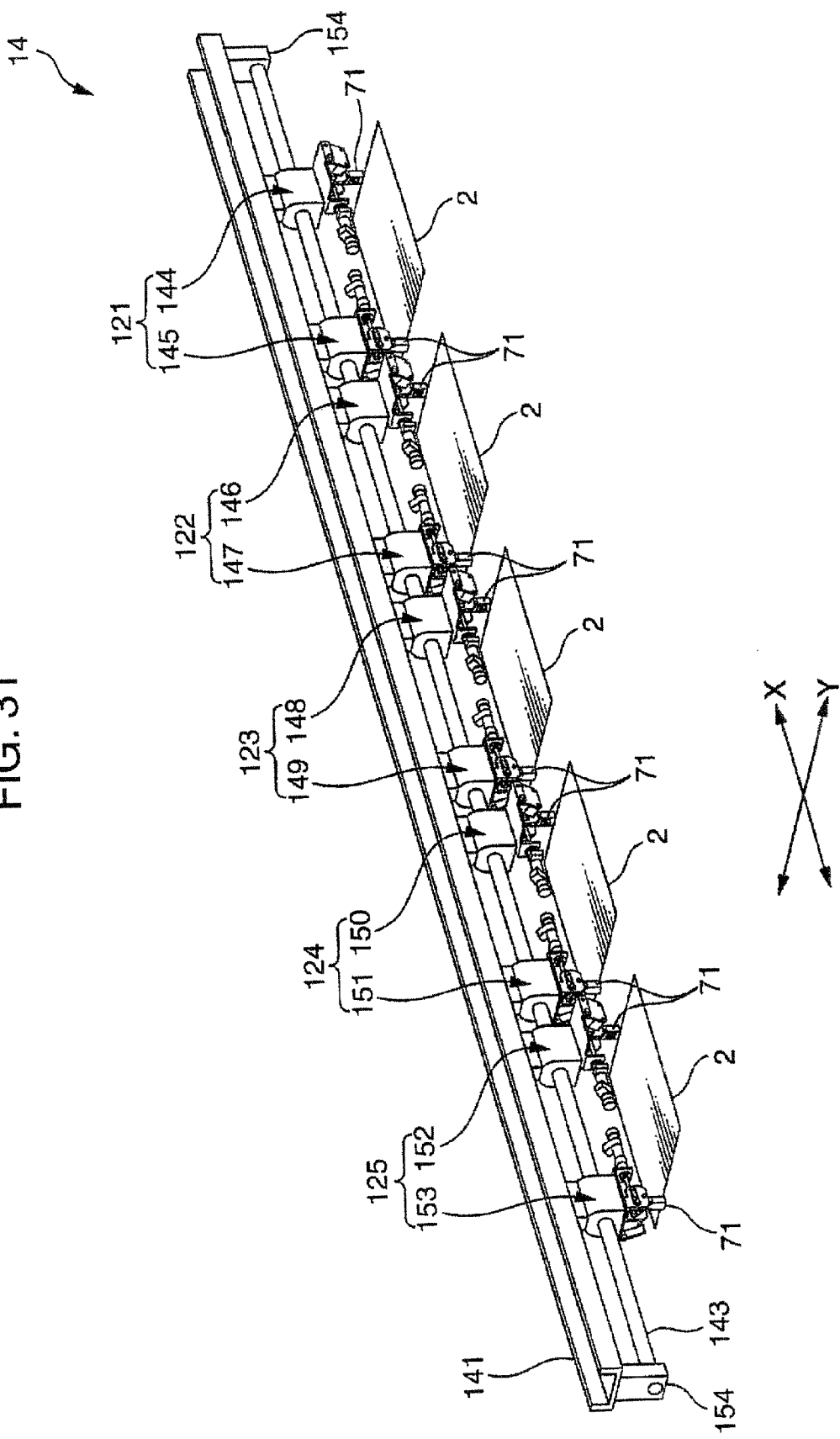
FIG. 31 is a perspective view of a board transfer device in the fourth embodiment.
Figure 32:
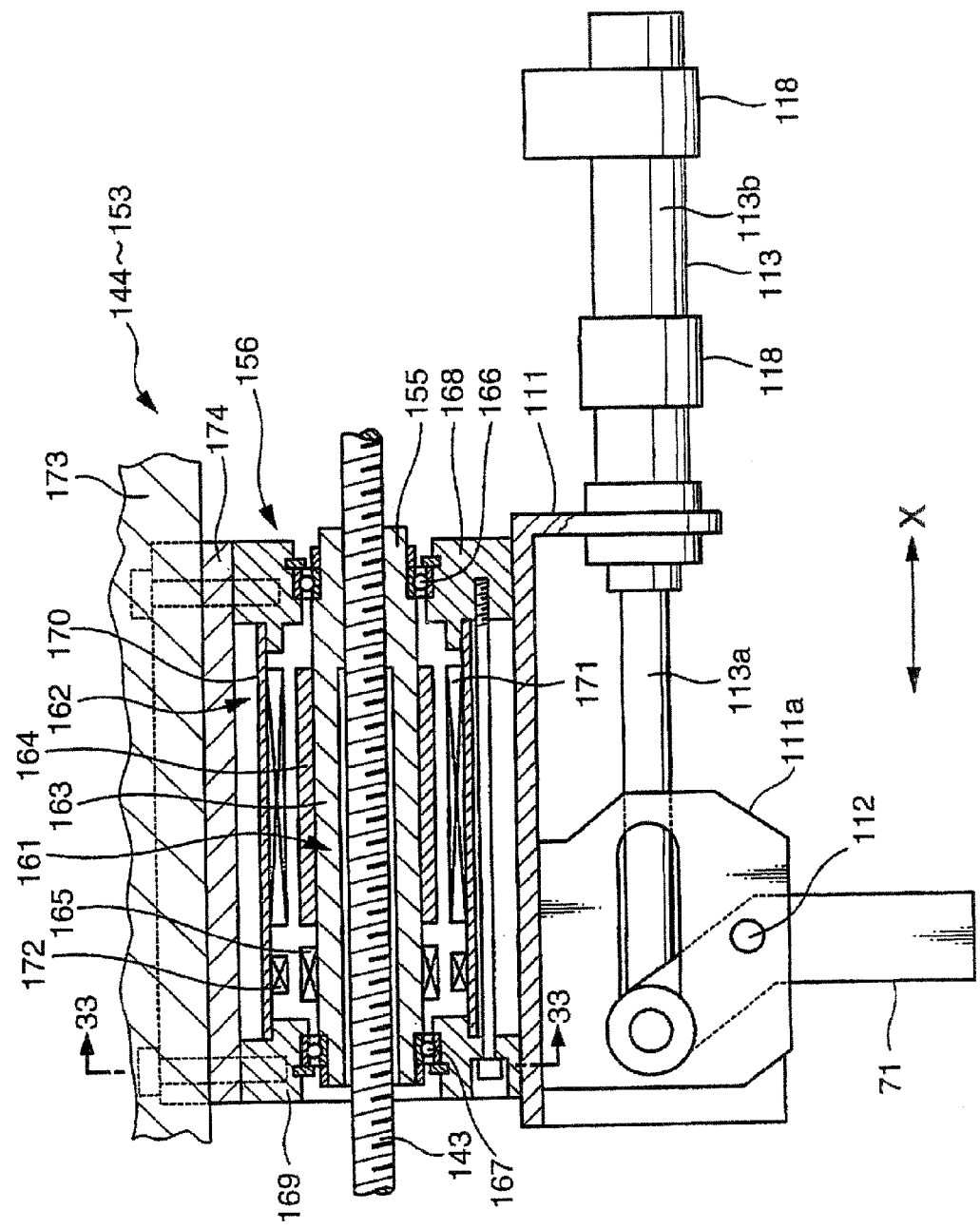
FIG. 32 is a cross sectional view of a hollow motor in the fourth embodiment.
Figure 33:
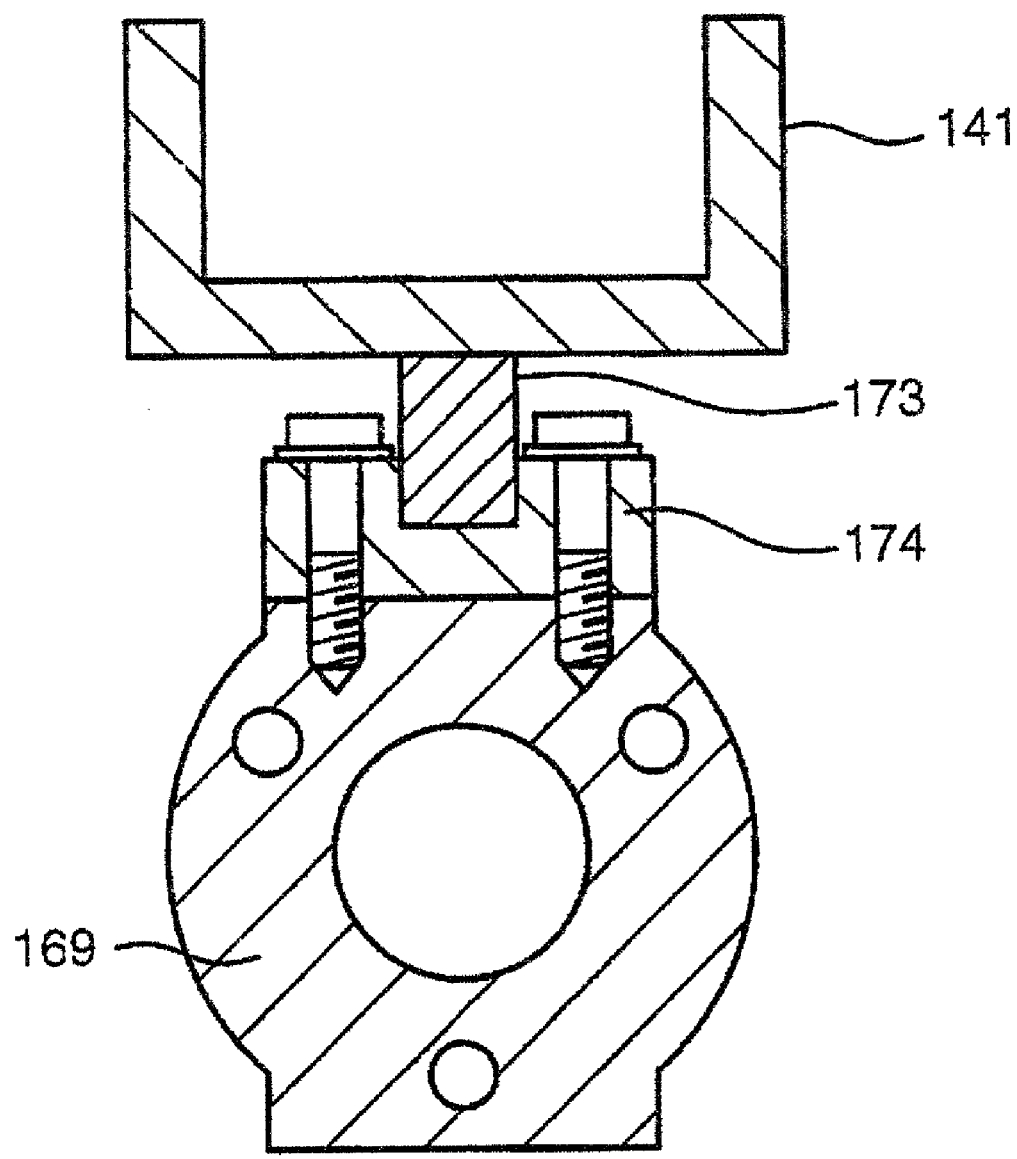
FIG. 33 is a cross sectional view taken along the line 33-33 of FIG. 32.
Figure 34:
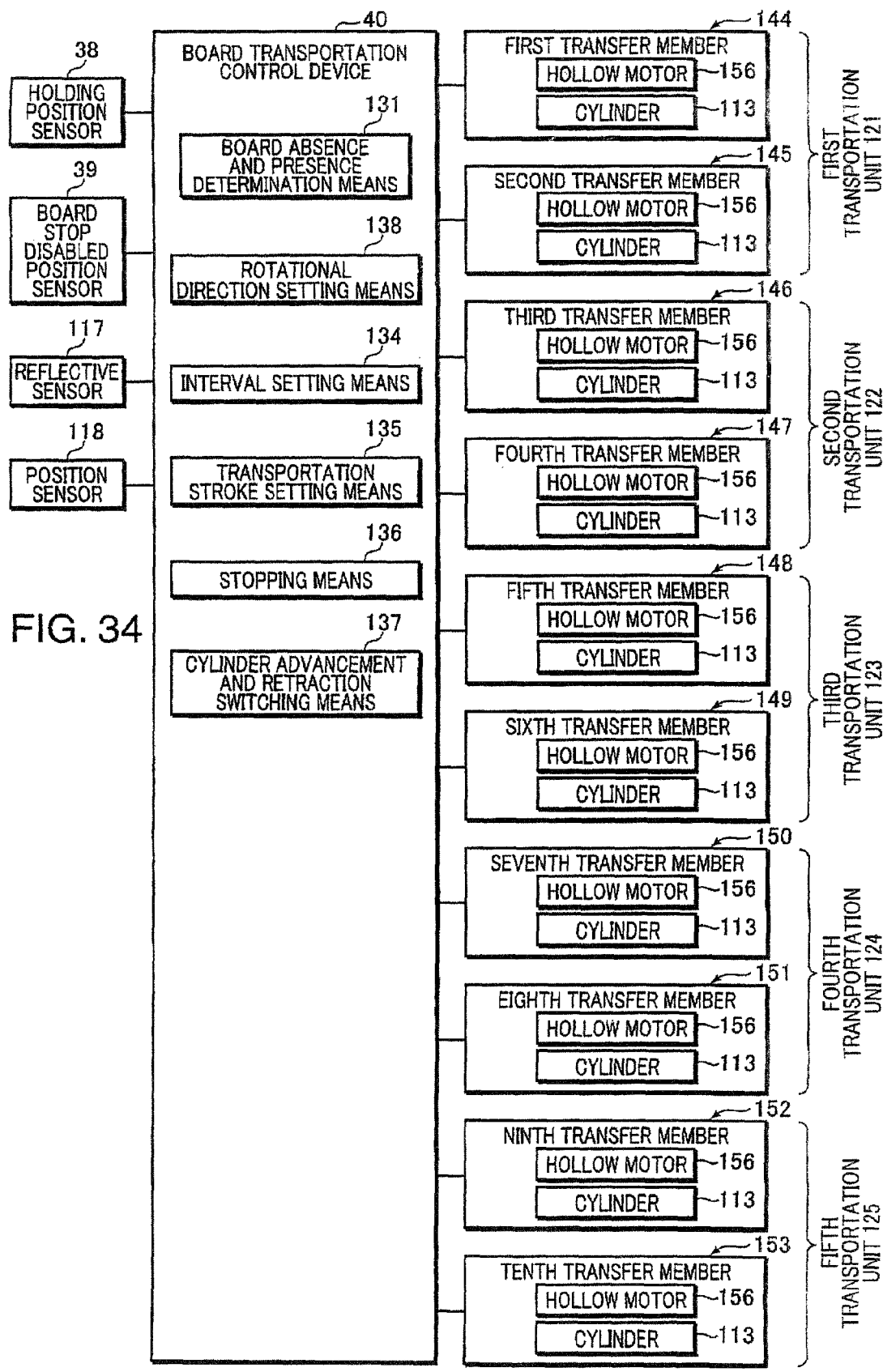
FIG. 34 is a block diagram showing a configuration of a control system of the board transfer device in the fourth embodiment.

FIG. 30 is a cross sectional view of a surface mounting apparatus according to the fourth embodiment of the invention. FIG. 31 is a perspective view of a board transfer device. FIG. 32 is a cross sectional view of a hollow motor. FIG. 33 is a cross sectional view of the hollow motor taken along the line 33-33 of FIG. 32. FIG. 34 is a block diagram showing the configuration of a control system of the board transfer device.

In this embodiment, as is shown in FIG. 30, the board transfer device 14 is supported on the center frame 23 via a supporting frame 141 and transports a printed wiring board 2 located at the transportation position in the X direction using the tab members 71. To be more specific, as is shown in FIG. 31, the board transfer device 14 includes the supporting frame 141 fixed at the bottom of the center frame 23, a single ball screw shaft 143 attached to the both ends of the supporting frame 141 and extending in the X direction, first through tenth transfer members 144 through 153 supported on the ball screw shaft 143, and a board transportation control device 40 (see FIG. 34) to control operations of these transfer members 144 through 153.

The supporting frame 141 is formed to have a length almost equal to the length of the center frame 23 and supports the both end portions of the ball screw shaft 143 via supporting members 154 at the both end portions. The both end portions of the ball screw shaft 143 are fixed to the supporting members 154 so as not to rotate.

As is shown in FIG. 32, each of the first through tenth transfer members 144 through 153 includes a ball nut 155 threaded with the ball screw shaft 143, a hollow motor 156 to rotate the ball nut 155, a tab member 71 provided to the lower end portion of the hollow motor 156, and a cylinder 113.

The hollow motor 156 includes a rotor 161 integrally provided to the ball nut 155 and a stator 162 surrounding the rotor 161.

The rotor 161 includes a cylindrical body 163 in which the ball screw shaft 143 penetrates through in a loose-fit state, a permanent magnet 164 and a resolver rotor coil 165 both fixedly attached to the outer peripheral surface of the cylindrical body 163. The cylindrical body 163 is formed to protrude in the axial direction from one end portion of the ball nut 155 in the axial direction. In order to prevent deflection of the ball screw shaft 143, a slider 174 may be suspended in a rotatable manner using a guide rail 173.

The stator 162 includes a pair of motor brackets 168 and 169 connected to the cylindrical body 163 in the outer peripheral portions at the both end portions, respectively, via bearings 166 and 167 to be rotatable relatively with each other, a cylindrical motor case 170 pinched by these motor brackets 168 and 169, and a stator coil 171 and a resolver stator coil 172 both provided in an inner peripheral portion of the motor case 170.

As are shown in FIG. 32 and FIG. 33, the slider 174 in which to fit the guide rail 173 provided to protrude from the bottom portion of the supporting frame 141 in a slidable manner is provided on the upper end portions of the motor brackets 168 and 169. By fitting the slider 174 in the guide rail 173 in this manner, it becomes possible to restrict members on the side of the stator 162 in the hollow motor 156 from rotating together with the ball nut 155. More specifically, the first through tenth transfer members 144 through 153 having the hollow motors 156 move in parallel along the ball screw shafts 143 as the ball nuts 155 are rotated by the hollow motors 156. Operations (the rotational direction, the rotational speed, and so forth) of the hollow motor 156 are controlled by the board transportation control device 40 described below.

As is shown in FIG. 32, a supporting bracket 111 is attached to the lower end portions of the motor brackets 168 and 169. The tab member 71 is provided to the supporting bracket 111 to be able to oscillate via a supporting member 111a provided to the supporting bracket 111 to protrude downward and a supporting shaft 112 attached to the supporting member 111a. Also, the cylinder 113 to oscillate the tab member 71 is provided.

The first and second transfer members 144 and 145 form a first transportation unit 121. The third and fourth transfer member 146 and 147 form a second transportation unit 122. The fifth and sixth transfer members 148 and 149 form a third transportation unit 123. The seventh and eighth transfer members 150 and 151 form a fourth transportation unit 124. The ninth and tenth transfer members 152 and 153 form a fifth transportation unit 125.

The configurations of the tab members 71, the cylinders 113, and so forth are the same as those of the counterparts in the first embodiment above.

As is shown in FIG. 34, the board transportation control device 40 includes board absence and presence determination means 131, rotational direction setting means 138, interval setting means 134, transportation stroke setting means 135, stopping means 136, and cylinder advancement and retraction switching means 137.

The rotational direction setting means 138 sets a direction in which to rotate the hollow motor 156 provided to each of the transfer members 144 through 153. When a printed wiring board 2 is transported by the first through tenth transfer members 144 through 153, the hollow motor 156 in each transfer member is rotated, for example, in a forward direction. Also, in a case where the first through tenth transfer members 144 through 153 are returned to the initial positions after the transportation of the printed wiring board 2, the rotational direction setting means 138 rotates the hollow motor 156 in each transfer member in a direction opposite to the direction at the time of transportation after all the tab members 71 in the first through tenth transfer members 144 through 153 have been oscillated to the evacuation positions by the cylinder advancement and retraction switching means 137.

The transportation stroke setting means 135 sets the transportation stroke (movement distance) by the respective transfer members during the transportation for each of the first through fifth transportation units 121 through 125. More specifically, the transportation stroke setting means 135 sets the transportation stroke during the transportation by the first and second transfer members 144 and 145 forming the first transportation unit 121 in response to the interval between the carry-in device 12 and the first mounting unit 3.

Likewise, the transportation stroke setting means 135 sets the transportation stroke during the transportation by the third and fourth transfer members 146 and 147 forming the second transportation unit 122 in response to the interval between the first mounting unit 3 and the second mounting unit 4.

The transportation stroke setting means 135 sets the transportation stroke during the transportation by the fifth and sixth transfer members 148 and 149 forming the third transportation unit 123 in response to the interval between the second mounting unit 4 and the third mounting unit 5.

The transportation stroke setting means 135 sets the transportation stroke during the transportation by the seventh and eighth transfer members 140 and 141 forming the fourth transportation unit 124 in response to the interval between the third mounting unit 5 and the fourth mounting unit 6.

The transportation stroke setting means 135 sets the transportation stroke during the transportation by the ninth and tenth transfer members 142 and 143 forming the fifth transportation unit 125 in response to the interval between the fourth mounting unit 6 and the carry-out device 13.

Also, the transportation stroke setting means 135 is configured in such a manner that it is able to adjust the transportation stroke by the respective transfer members during the transportation for each transportation unit. The purpose of this configuration is to locate a printed wiring board 2 in close proximity to a tape feeder 25 that is frequently used (used to mount a larger number of electronic components) among a large number of tape feeders 25 provided to the respective mounting units 3 through 6. For example, in a case where a frequently used tape feeder 25 is on one end side in the X direction in each mounting unit, the transportation stroke setting means 135 sets the transportation stroke in such a manner that a printed wiring board 2 is transported to a position leaning to this one end side in the X direction within the mounting region. By changing the position of the printed wiring board 2 in the X direction within the mounting region so as to come in close proximity to the frequently used tape feeder 25 in this manner, it becomes possible to shorten a travel distance for the head unit 45 to reciprocate between the tape feeder 25 and the printed wiring board 2.

The functions of the board absence and presence determining means 131, the interval setting means 134, the stopping means 136, and the cylinder advancement and retraction switching means 137 are the same as those of the counterparts described above with reference to FIG. 20.

Hence, in the surface mounting apparatus 1 equipped with the board transfer device 14 configured as described above, a printed wiring board 2 can be transported by moving the tab members 71 together with the respective transfer members 144 through 153 through the driving of the hollow motors 156 provided to the respective first through tenth transfer members 144 through 153. The positions of the tab members 71 can be therefore changed readily through the driving of the hollow motors 156.

Accordingly, in the surface mounting apparatus 1 of this embodiment, there is no need to perform a special size arrangement work when a printed wiring board 2 having a different length in the transportation direction is to be transported. Consequently, according to this embodiment, it is possible to fabricate a surface mounting apparatus 1 that can achieve higher productivity in a case where a printed wiring board 2 having a different length in the transportation direction is transported, too.

Also, according to this embodiment, because the respective tab members 71 move through the driving of the hollow motors 156, it is possible to transfer printed wiring boards properly to the transportation positions in the respective first through fourth mounting units 3 through 6. When a plurality of printed wiring board 2 are to be transported, the movements of the tab members 71 can be controlled for each printed wiring board 2. Hence, it is possible to change a moving distance of the printed wiring board 2 in response to the mounting position and it is also possible to change the timings to move printed wiring boards 2 with ease, for example, in such a manner that printed wiring boards 2 are successively transported from the one that becomes ready for transportation.

Hence, according to this embodiment, a degree of freedom in the length of a printed wiring board 2 in the transportation direction, a movement distance, moving timing, and so forth can be increased when the printed wiring board 2 is transported, which eliminates the need to stop a mounting operation of electronic components more than necessary to change the foregoing factors. It thus becomes possible to fabricate a surface mounting apparatus 1 achieving higher productivity.

Also, in the surface mounting apparatus 1 of this embodiment, it is possible to change the transportation stroke by the respective transfer members 144 through 153 during the transportation for each of the transportation units 121 through 125. It thus becomes possible to locate a printed wiring board 2 in close proximity to the frequently used tape feeder 25 among a large number of tape feeders 25 provided to the respective mounting units 3 through 6. Consequently, according to the surface mounting apparatus 1, it becomes possible to shorten a travel distance for the head unit 45 to reciprocate between the tape feeder 25 and the printed wiring board 2, which can in turn enhance the mounting efficiency further.

Fifth Embodiment

Figure 35:
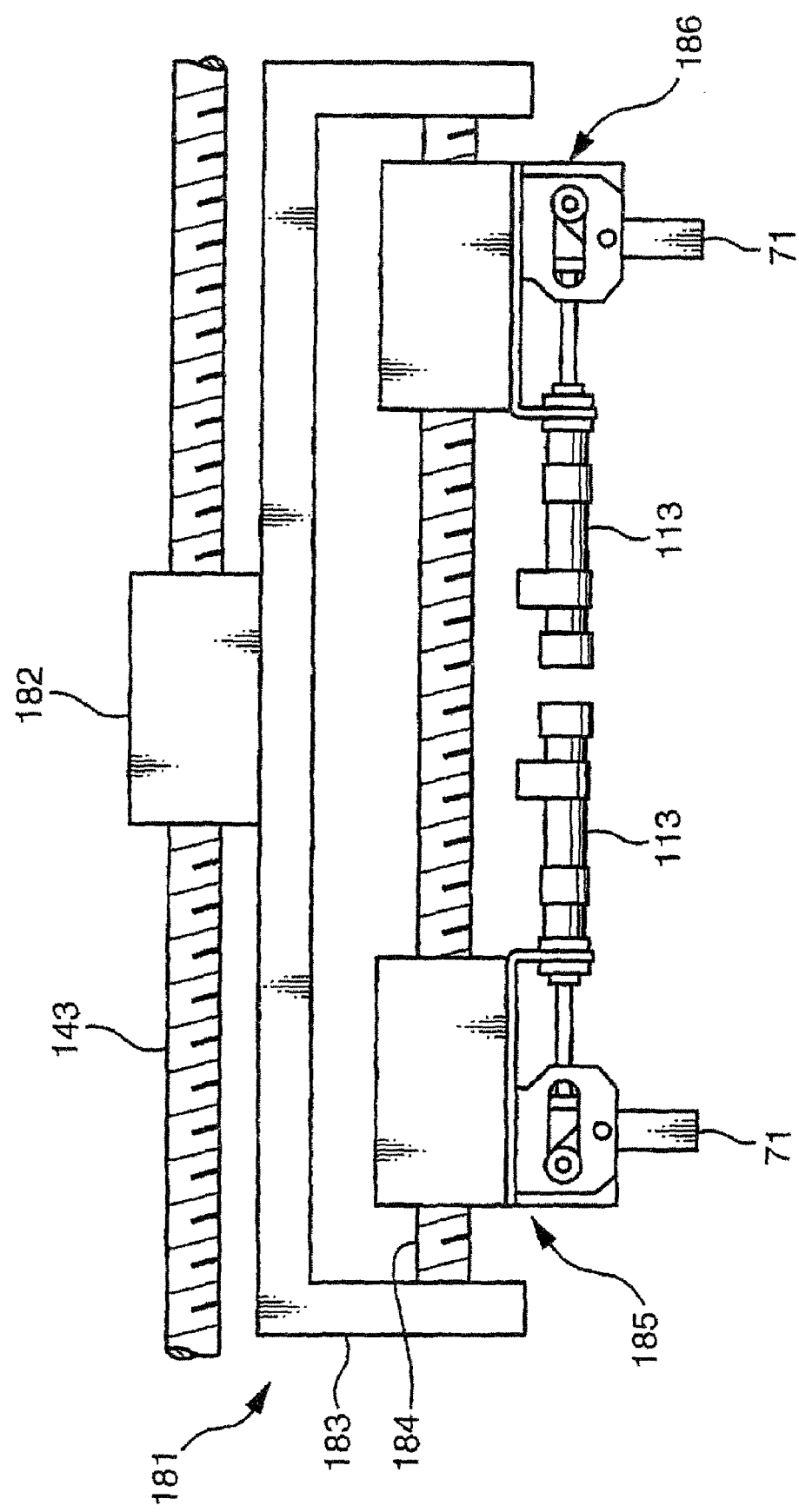
FIG. 35 is a side view showing a transportation unit according to a fifth embodiment.
Figure 36:
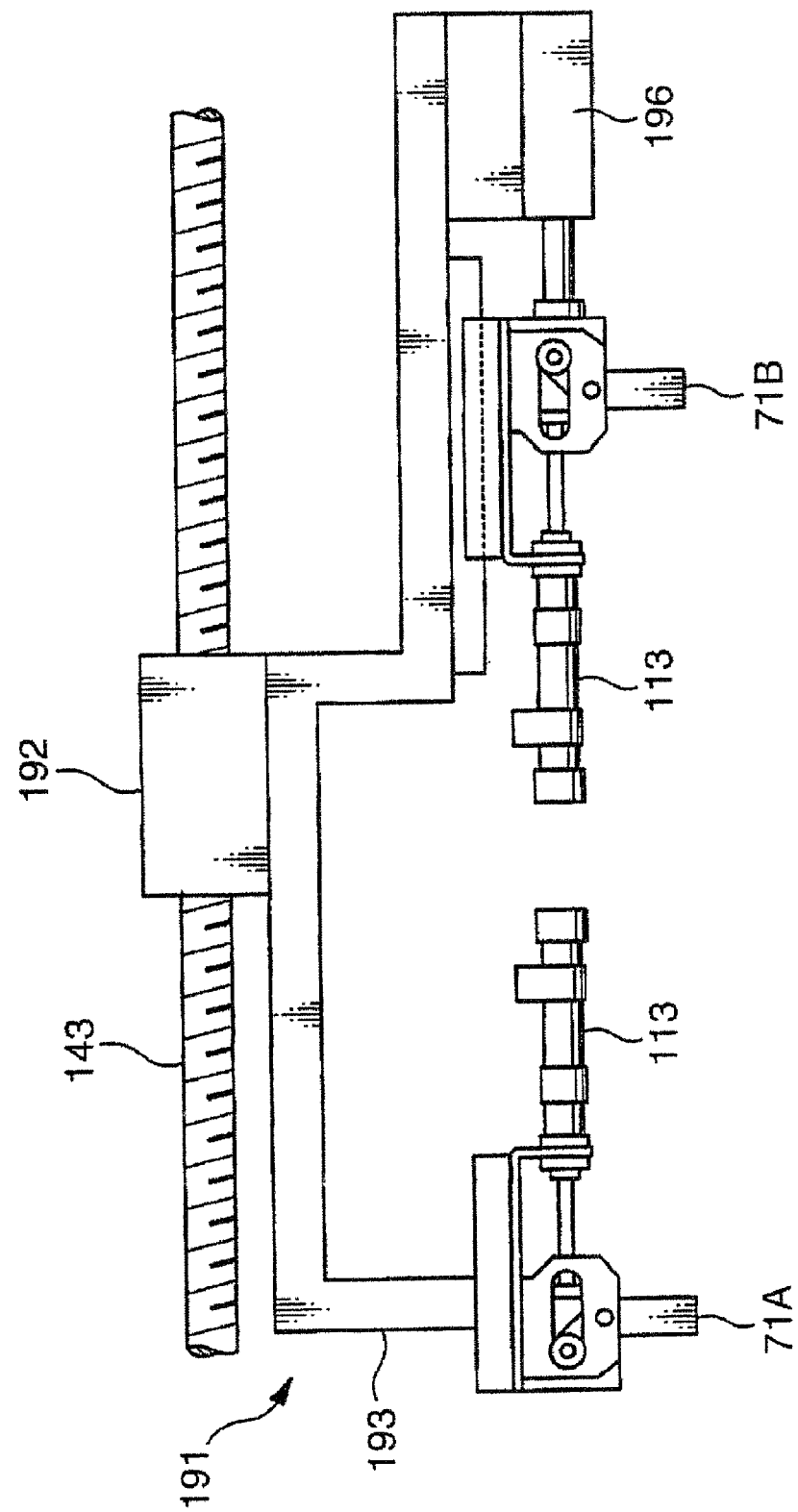
FIG. 36 is a side view showing another embodiment of the transportation unit.

A transportation unit in a surface mounting apparatus of the invention can be configured as are shown in FIG. 35 and FIG. 36.

FIG. 35 and FIG. 36 are side views showing other embodiments of the transportation unit. In these drawings, same or equivalent members as those described in the fourth embodiment above are labeled with the same reference numerals and detailed descriptions of these components are omitted where appropriate.

A transportation unit 181 shown in FIG. 35 includes a transportation moving member 182 supported on a ball screw shaft 63 in a movable manner, and a front transfer member 185 and a rear transfer member 186 supported on the transportation moving member 182 via a bracket 183 and a ball screw shaft 184.

Although it is not shown in the drawing, the transportation moving member 182 includes a ball nut threaded with the ball screw shaft 143 and a hollow motor to rotate the ball nut. These ball nut and hollow motor used herein are of the same structure as the hollow motor 76 described in the first embodiment above.

The front transfer member 185 and the rear transfer member 186 adopt the same structure as the transfer members 144 and 145 described in the fourth embodiment above, and each includes the tab member 71.

In the transportation unit 181, the transportation moving member 182 moves by a predetermined transportation stroke when a printed wiring board 2 is transported. Also, in a case where the interval between the tab members 71 is changed in response to the length of the printed wiring board 2 in the transportation direction, the interval is changed by moving at least one of the front transfer member 185 and the rear transfer member 186.

A transportation unit 191 shown in FIG. 36 includes a transportation moving member 192 provided to a ball screw shaft 143 in a movable manner, a first tab member 71A supported on the transportation moving member 192 via a bracket 193, and a second tab member 71B supported on the bracket 193 movably in the transportation direction.

The transportation moving member 192 used herein is of the same structure as the transportation moving member 182 shown in FIG. 35.

The first tab member 17A is attached to the bracket 193 so as not to move in the transportation direction. Also, as in a case where the fourth embodiment above is adopted, the first tab member 71A is configured in such a manner that it oscillates between the transportation position and the evacuation position through the driving operation of the cylinder 113.

As in a case where the fourth embodiment above is adopted, the second tab member 71B adopts a configuration by which it oscillates between the transportation position and the evacuation position through the driving operation of the cylinder 113. Also, an interval changing cylinder 196 is connected to the second tab member 71B, and it is configured in such a manner that, through the driving operation of the cylinder 196, the second tab member 71B is allowed to reciprocate between two positions: a position at which it comes in close proximity to the first tab member 71A and a position at which it is spaced apart from the first tab members 71A.

In other words, in the transportation unit 191 shown in FIG. 36, it is possible to transport two types of printed wiring boards having different lengths in the transportation direction. It should be noted that the transportation unit 191 can take a configuration in which the first tab member 71A is located upstream in the transportation direction or a configuration in which the second tab member 71B is located upstream in the transportation direction.

Sixth Embodiment

The embodiments above described the surface mounting apparatus equipped with four mounting units aligned in a staggered fashion when viewed in a plane. A surface mounting apparatus of the invention can be also applied to a surface mounting apparatus equipped with four mounting units as is shown in FIG. 37.

Figure 37:
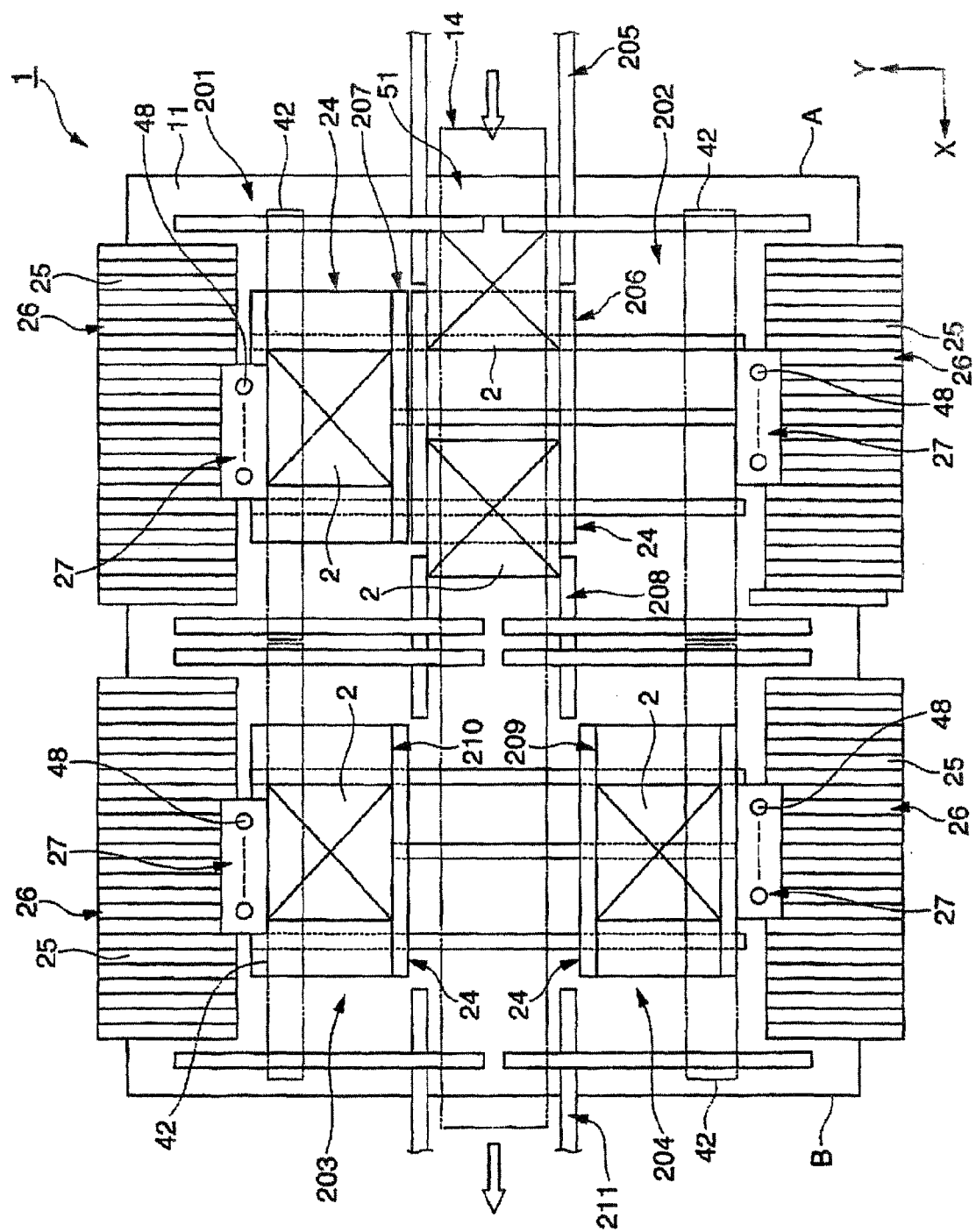
FIG. 37 is a plan view showing a surface mounting apparatus according to a sixth embodiment.

FIG. 37 is a plan view showing another example of the surface mounting apparatus. In the drawing, same or equivalent members as those described in the embodiments above are labeled with the same reference numerals and detailed descriptions of such members are omitted where appropriate.

The surface mounting apparatus 1 shown in FIG. 37 is equipped with four mounting units 201 through 204 aligned in the X direction and in the Y direction, and includes a plurality of conveyers 205 through 211 to form a transportation path 51 at the center portion in the Y direction. These conveyers 205 through 211 adopt the same structure as the conveyers 34 and 53 in the supporting devices 24 described in the first embodiment above.

The first mounting unit 201 and the second mounting unit 202 are provided to be aligned side by side in the Y direction at the same position in the X direction in an upstream end portion A of the base stand 11 in the transportation direction. The third mounting unit 203 and the fourth mounting unit 204 are provided to be aligned side by side in the Y direction at the same position in the X direction in a downstream end portion B of the base stand 11 in the transportation direction.

Each of the mounting units 201 through 204 includes a supporting device 24 to support a transportation board 2, an electronic component supply device 26 provided adjacently to one side of the supporting device 24, and an electronic component transfer device 27 to transfer electronic components from tape feeders 25 in the electronic components supply device 26 onto a printed wiring board 2 on the supporting device 24.

The supporting device 24, the electronic component supply device 26, and the electronic component transfer device 27 adopt the structures same as those of the counterparts described in the first embodiment above.

The supporting device 24 reciprocates in the Y direction between the transportation position on the transportation path 51 and the mounting position in close proximity to the electronic component supply device 26.

The supporting device 24 in the first mounting unit 201 and the supporting device 24 in the second mounting unit 202 can be configured in such a manner that when one of these supporting devices 24 and 24 is at the mounting position, the other is allowed to move to the transportation position.

The supporting device 24 in the third mounting unit 203 and the supporting device 24 in the fourth mounting unit 204 can be configured in such a manner that when one of these supporting devices 24 and 24 is at the mounting position, the other is allowed to move to the transportation position.

The board transfer device 14 to be incorporated into the surface mounting apparatus 1 of this embodiment is equipped with at least four of transfer members each having the tab member 71, so that at least two printed wiring board 2 can be transported at a time.

Even in the case that the mounting units 201 through 204 are configured in this manner, it is possible to achieve the effect achieved in the first embodiment above.

The respective embodiments above described a case where rod-shaped tab members form the abutting members. It should be appreciated, however, that the shape of the abutting members can be changed as needed to a plate shape formed so that the width in the Y direction is wider than the tab member, a lattice shape provided with a plurality of longitudinal members extending in the top-bottom direction, or the like.

As has been described, a surface mounting apparatus according to the invention is a surface mounting apparatus that includes a transportation path forming member that supports a printed wiring board movably in a transportation direction, and a board transfer device that lowers abutting members to positions spaced apart upstream and downstream of the printed wiring board placed on the transportation path forming member in the transportation direction and moves the abutting members in the transportation direction, which is configured in such a manner that the board transfer device includes: an interval changing device that changes an interval between a pair of the abutting members; a sensor that detects a position of the printed wiring board positioned on the transportation path forming member; interference determination means for determining absence or presence of the printed wiring board at the positions to which both the abutting members are to be lowered according to the position of the printed wiring board detected by the sensor; and interval setting means for moving the abutting members by driving the interval changing device according to a detection result of the interference determination means.

According to the invention, it is possible to prevent both a front abutting member and a rear abutting member from coming into contact on the printed wiring board when they are lowered to the transportation positions. Consequently, according to the surface mounting apparatus of the invention, not only is it possible to transport a printed wiring board on which electronic components have been already mounted while preventing the electronic components from moving on the printed wiring board, but it is also possible to mount a rest of the electronic components on this printed wiring board.

In the surface mounting apparatus of the invention, it is preferable that the sensor is provided to a member that moves in the transportation direction together with each abutting member.

In the case of being configured in this manner, in a case where a printed wiring board is present at the positions to which the front abutting member and the rear abutting member are to be lowered, it is possible to directly detect this printed wiring board using the sensors. Hence, according to the invention, in comparison with a case where the positions of the both abutting members and the position of the printed wiring board are found indirectly from the number of rotations of the drive motor or the like, it is possible to determine whether the abutting members will abut on the printed wiring board with higher reliability.

Alternatively, the sensor may be provided to the transportation path forming member.

In the case of being configured in this manner, in comparison with a case where the sensor is provided to a member that moves integrally with the abutting member, a load on the drive device to move the abutting member in the transportation direction can be reduced.

In the surface mounting apparatus of the invention, it is preferable that each abutting member is formed movably between a transportation position at which the abutting member opposes an end face of the printed wiring board and an evacuation position at which the abutting member is spaced apart above from the transportation path of the printed wiring board, and that an abutting member drive device is connected to each abutting member so as to drive the abutting member to move between the transportation position and the evacuation position.

In the case of being configured in this manner, it is possible to transport the printed wiring board by moving the abutting members in the transportation direction while they are located at the transportation positions. In addition, by locating the abutting members to the evacuation positions after transportation of the printed wiring board ends and moving them in a direction opposite to the transportation direction, it becomes possible to return the abutting members to the initial positions before transportation while avoiding interference with the printed wiring board.

Also, in the surface mounting apparatus of the invention, it is preferable that the board transfer device further includes a transportation unit having a front abutting member located downstream of the printed wiring board in the transportation direction and a rear abutting member located upstream in the transportation direction, and adopts a configuration by which the printed wiring board is stopped at a mounting position by gradually decreasing a movement rate of the transportation unit.

In the case of being configured in this manner, it is possible to transport the printed wiring board by moving the both abutting members while the printed wiring board is pinched by the front abutting member and the rear abutting member. When the printed wiring board is stopped for the positioning during transportation, the printed wiring board is stopped by gradually decreasing the movement rate of the both abutting members. Accordingly, it is possible to prevent mounted components from moving by inertia when the printed wiring board is stopped.

Also, in the surface mounting apparatus of the invention, it is preferable that: the board transfer device is disposed on a base stand; the transportation path forming member is provided on the base stand and capable of reciprocating between a transportation position below the board transfer device and a mounting position spaced apart from the transportation position in a second direction orthogonal to a first direction that is the transportation direction; a plurality of mounting units each having the transportation path forming member, an electronic component supply device provided on the base stand on a side opposite to the transportation position with the mounting position of the transportation path forming member at a boundary, and an electronic component transfer device that transfer electronic components onto the printed wiring board on the transportation path forming member at the mounting position from the electronic component supply device by moving an attracting head for attracting the electronic components in the first direction and in the second direction above the base stand, are provided on the base stand in the first direction; and the board transfer device further includes a transportation unit having a front abutting member located downstream of the printed wiring board in the transportation direction and a rear abutting member located upstream in the transportation direction and as many transportation units as the plurality of mounting units are aligned in the transportation direction.

In the case of being configured in this manner, a plurality of mounting units can be provided so that they are aligned in the first direction, which makes it possible to mount electronic components on a plurality of printed wiring boards at a time. It thus becomes possible to provide a surface mounting apparatus achieving further higher mounting efficiency.

In this surface mounting apparatus, it is preferable that: the board transfer device is disposed above a center portion of the base stand in the second direction; the mounting units in each of which the electronic component supply device, the mounting position of the transportation path forming member, and the electronic component transfer device are disposed on one side in the second direction with the center portion of the base stand in the second direction at a boundary, and the mounting units in each of which the electronic component supply device, the mounting position of the transportation path forming member, and the electronic component transfer device are disposed on the other side in the second direction with the center portion of the base stand in the second direction at the boundary, are disposed alternately in the first direction; two mounting units that are adjacent to each other in the first direction among the plurality of mounting units are positioned in a staggered fashion when viewed in a plane by shifting one mounting unit in the first direction with respect to the other mounting unit; and respective transportation path forming members in the mounting units are aligned in the first direction while being located at the transportation positions and thereby form a transportation path of the printed wiring board.

In the case of being configured in this manner, it is possible to provide a part of an adjacent mounting unit in a space in each mounting unit defined on the opposite side with the transportation path in between. Accordingly, a plurality of mounting units can be provided compactly in the first direction.

Also, in the surface mounting apparatus, it may be configured in such a manner that the board transfer device has a plurality of transfer members having ball screw shafts provided to extend in the transportation direction, a plurality of ball nuts threaded with the corresponding ball screw shafts, and a plurality of hollow motors that respectively drive the corresponding ball nuts, and the plurality of transfer members move in parallel along the ball screw shafts through driving of the hollow motors, and that the abutting members are provided to the plurality of transfer members in a one-to-one correspondence.

In the case of being configured in this manner, it is possible to transport a printed wiring board by moving the abutting members together with the transfer members through the driving of the hollow motors provided to the respective transfer members. The positions of the abutting members can be changed correspondingly to the length of the printed wiring board in the transportation direction with ease through the driving of the hollow motors. Hence, according to the invention, when a printed wiring board having a different length in the transportation direction is to be transported, the need to perform a special size arrangement work can be eliminated.

In particular, even in the case that a plurality of mounting positions are set, it is possible to transport printed wiring boards to the respective mounting positions. When a plurality of printed wiring boards are to be transported, the movements of the abutting members can be controlled for each printed wiring board. Hence, it is possible to change the movement distance of the printed wiring board in response to the mounting position and it is also possible to change the timings to move the printed wiring boards with ease, for example, in such a manner that printed wiring boards are transported successively from the one that becomes ready for transportation.

Accordingly, a degree of freedom in the length of a printed wiring board in the transportation direction, a movement distance, the moving timing, and so forth can be increased when a printed wiring board is transported, which eliminates the need to stop a mounting operation of electronic components more than necessary to change the foregoing factors. It thus becomes possible to fabricate a surface mounting apparatus achieving higher productivity.

Also, in the surface mounting apparatus of the invention, it is preferable to further include: a plurality of supporting stands provided on a base stand while extending upward from a top surface of the base stand and extending in a second direction orthogonal to a first direction that is the transportation direction of the printed wiring board; a supporting member provided to bridge between the supporting stands so as to extend in the first direction and supported on the supporting stands movably in the second direction; a head unit having an attracting head for attracting electronic components and supported on the supporting member movably in the first direction; and a frame member connecting upper end portions of the supporting stands by extending in the first direction, wherein the board transfer device is supported on the frame member.

In the case of being configured in this manner, it is possible to reinforce a plurality of the supporting stands using the frame member. Hence, even when the head unit in the electronic component transfer device is operated at a high speed, the entire electronic component transfer device including the supporting stands will not vibrate. Hence, not only can a higher degree of accuracy in the mounting positions of the electronic components be maintained, but also the mounting efficiency can be improved by operating the head unit at a high speed.

The invention claimed is:

1. A surface mounting apparatus, comprising:
   a transportation path forming member that supports a printed wiring board movably in a transportation direction; and
   a board transfer device that lowers abutting members to spaced apart positions upstream and downstream of the printed wiring board placed on the transportation path forming member in the transportation direction and moves the abutting members in the transportation direction, wherein: the board transfer device includes:
an interval changing device that changes an interval between the abutting members;
a sensor that detects a position of the printed wiring board positioned on the transportation path forming member;
interference determination means for determining absence or presence of the printed wiring board at the positions to which both the abutting members are to be lowered according to the position of the printed wiring board detected by the sensor; and
interval setting means for moving the abutting members by driving the interval changing means according to a detection result of the interference determination means.

2. The surface mounting apparatus according to claim 1, wherein:
the sensor is provided to a member that moves in the transportation direction together with each abutting member.

3. The surface mounting apparatus according to claim 1, wherein:
the sensor is provided to the transportation path forming member.

4. The surface mounting apparatus according to claim 1, wherein:
each abutting member is movable between a transportation position at which the abutting member opposes an end face of the printed wiring board and an evacuation position at which the abutting member is spaced apart above from a transportation path of the printed wiring board; and
an abutting member drive device is connected to each abutting member so as to drive the abutting member to move between the transportation position and the evacuation position.

5. The surface mounting apparatus according to claim 1, wherein:
the board transfer device further includes a transportation unit having a front abutting member located downstream of the printed wiring board in the transportation direction and a rear abutting member located upstream in the transportation direction, and adopts a configuration by which the printed wiring board is stopped at a mounting position by gradually decreasing a movement rate of the transportation unit.

6. The surface mounting apparatus according to claim 1, wherein:
the board transfer device is disposed on a base stand;
the transportation path forming member is provided on the base stand and is capable of reciprocating between a transportation position below the board transfer device and a mounting position spaced apart from the transportation position in a second direction orthogonal to a first direction that is the transportation direction;
a plurality of mounting units each having a transportation path forming member, an electronic component supply device provided on the base stand on a side opposite to the transportation position with the mounting position of the transportation path forming member at a boundary, and an electronic component transfer device that transfers an electronic component onto the printed wiring board on the transportation path forming member at the mounting position from the electronic component supply device by moving an attracting head for attracting the electronic component in the first direction and in the second direction above the base stand, are provided on the base stand in the first direction; and
the board transfer device further includes a transportation unit having a front abutting member located downstream of the printed wiring board in the transportation direction and a rear abutting member located upstream in the transportation direction, and as many transportation units as the plurality of mounting units are aligned in the transportation direction.

7. The surface mounting apparatus according to claim 6, wherein:
the board transfer device is disposed above a center portion of the base stand in the second direction;
mounting units in each of which the electronic component supply device, the mounting position of the transportation path forming member, and the electronic component transfer device are disposed on one side in the second direction with the center portion of the base stand in the second direction at a boundary, and mounting units in each of which the electronic component supply device, the mounting position of the transportation path forming member, and the electronic component transfer device are disposed on the other side in the second direction with the center portion of the base stand in the second direction at the boundary, are disposed alternately in the first direction;
two mounting units that are adjacent to each other in the first direction among the plurality of mounting units are positioned in a staggered fashion when viewed in a plane by shifting one mounting unit in the first direction with respect to the other mounting unit; and
respective transportation path forming members in the mounting units are aligned in the first direction while being located at the transportation positions and thereby form a transportation path of the printed wiring board.

8. The surface mounting apparatus according to claim 1, wherein:
the board transfer device has a plurality of transfer members having ball screw shafts provided to extend in the transportation direction, a plurality of ball nuts threaded with the corresponding ball screw shafts, and a plurality of hollow motors that respectively drive the corresponding ball nuts, and the plurality of transfer members move in parallel along the ball screw shafts through driving of the hollow motors; and
the abutting members are provided to the plurality of transfer members in a one-to-one correspondence.

9. The surface mounting apparatus according to claim 1, further comprising:
a plurality of supporting stands provided on a base stand while extending upward from a top surface of the base stand and extending in a second direction orthogonal to a first direction that is the transportation direction of the printed wiring board;
a supporting member provided to bridge between the supporting stands so as to extend in the first direction and supported on the supporting stands movably in the second direction;
a head unit having an attracting head for attracting an electronic component and supported on the supporting member movably in the first direction; and
a frame member connecting upper end portions of the supporting stands by extending in the first direction,
wherein the board transfer device is supported on the frame member.

* * * * *